(12) United States Patent
Ho

(10) Patent No.: US 7,558,452 B2
(45) Date of Patent: Jul. 7, 2009

(54) APPARATUS AND METHOD FOR COLLECTING ENERGY

(76) Inventor: Edward Ho, 18 Nottingham Way, Warren, NJ (US) 07059

( * ) Notice: Subject to any disclaimer, the term of this patent is extended or adjusted under 35 U.S.C. 154(b) by 448 days.

(21) Appl. No.: 11/130,544

(22) Filed: May 16, 2005

(65) Prior Publication Data

US 2006/0016448 A1    Jan. 26, 2006

Related U.S. Application Data

(63) Continuation-in-part of application No. 09/921,087, filed on Aug. 2, 2001, now Pat. No. 6,895,145.

(51) Int. Cl.
G02B 6/32 (2006.01)
(52) U.S. Cl. ........................................................ 385/35
(58) Field of Classification Search ................. 385/900, 385/31–35, 147
See application file for complete search history.

(56) References Cited

U.S. PATENT DOCUMENTS

| 4,078,548 A | 3/1978 | Kapany |
| 4,237,867 A | 12/1980 | Bauer |
| 4,241,382 A | 12/1980 | Daniel |
| 4,275,950 A | 6/1981 | Meyer et al. ................. 126/698 |
| 4,483,311 A | 11/1984 | Whitaker et al. ............ 126/602 |
| 4,529,830 A | 7/1985 | Daniel |
| 4,798,444 A | 1/1989 | McLean |
| 4,815,098 A * | 3/1989 | Manabe ....................... 373/130 |
| 4,943,125 A | 7/1990 | Laundre' et al. |
| 5,019,768 A | 5/1991 | Criswell et al. |
| 5,159,495 A * | 10/1992 | Hamblen ..................... 359/731 |
| 5,223,781 A | 6/1993 | Criswell et al. |
| 5,500,054 A | 3/1996 | Goldstein |
| 5,716,442 A | 2/1998 | Fertig |
| 6,477,298 B1 * | 11/2002 | Fletcher et al. ............... 385/33 |

FOREIGN PATENT DOCUMENTS

| EP | 0875724 | 4/1998 |
| EP | 1357417 | 10/2003 |

* cited by examiner

Primary Examiner—Javaid Nasri
(74) Attorney, Agent, or Firm—Frommer Lawrence & Haug LLP

(57) ABSTRACT

A lens, fabricated from a plurality of materials, each having an associated index of refraction, is used to focus and direct light into one or more optical fibers, coupled to the lens and used to collect light and transmit the collected light to an energy converter, a lighting or heating system, or a lighting or heating apparatus. The collected light may be converted to electricity by powering a steam turbine generator, thermal photo-voltaic cells, or the like. The collected light may also be supplied as a centralized light source to reflective lighting fixtures connected by fiber optics.

11 Claims, 52 Drawing Sheets

SIDE VIEW

TOP

SIDE

MIDDLE SECTION

BOTTOM PANEL

Angles of Incidence and Refraction with Light Source at Infinity
(Included angle with respect to the horizon)

Corresponding Geometric/Trigometric Spherical Collector Variables
(Included angle with respect to the horizon)

| | Surface 01 | Surface 02 | | | | | | | | |
|---|---|---|---|---|---|---|---|---|---|---|
| Angle of incidence | Angle of refraction | Angle of incidence | Angle of refraction | x | M | w | L | Y | T | S | Delta Q |
| -68 | -41.12986146 | 48.87013854 | #NUM! | 0 | 6 | 180 | 1.11735E-15 | 8.41762E-16 | -6 | #NUM! | #NUM! |
| -67 | -40.77041354 | 48.22958446 | #NUM! | 0.104714439 | 5.999086171 | 179 | 0.157194083 | 0.117238501 | -5.881184767 | #NUM! | -5.88184767 |
| -66 | -40.39793637 | 47.60206363 | #NUM! | 0.20939608 | 5.996344962 | 178 | 0.31055094 | 0.229935542 | -5.76700942 | #NUM! | -5.76700942 |
| -65 | -40.01273673 | 46.98722627 | #NUM! | 0.314015737 | 5.991777209 | 177 | 0.463925016 | 0.336590608 | -5.655186601 | #NUM! | -5.655186601 |
| -64 | -39.61513065 | 46.38486935 | #NUM! | 0.418538342 | 5.985384302 | 176 | 0.60674444 | 0.439276738 | -5.546107763 | #NUM! | -5.546107763 |
| -63 | -39.20543259 | 45.79456741 | #NUM! | 0.522934456 | 5.977168189 | 175 | 0.750013841 | 0.537643208 | -5.43952489 | #NUM! | -5.43952489 |
| -62 | -38.78395671 | 45.21604329 | #NUM! | 0.627117078 | 5.967131372 | 174 | 0.890316832 | 0.631918468 | -5.333212964 | #NUM! | -5.333212964 |
| -61 | -38.35101617 | 44.64898383 | 82.14054576 | 0.73121606 | 5.95527691 | 173 | 1.027818185 | 0.722311078 | -5.232965832 | 74.83912566 | -5.232965832 |
| -60 | -37.90692247 | 44.09307753 | 78.76321707 | 0.835038506 | 5.941608412 | 172 | 1.162665756 | 0.809013094 | -5.132593318 | 51.90479777 | -5.132593318 |
| -59 | -37.45198491 | 43.54801509 | 76.20499842 | 0.93860679 | 5.926130044 | 171 | 1.294992188 | 0.892200684 | -5.03392936 | 41.91203506 | -5.03392936 |
| -58 | -36.98650999 | 43.01349001 | 74.06663151 | 1.041889066 | 5.908840518 | 170 | 1.42491642 | 0.972035996 | -4.9368l0522 | 35.96352932 | -4.9368l0522 |
| -57 | -36.51080101 | 42.48919899 | 72.19038804 | 1.144853972 | 5.889763101 | 169 | 1.552545029 | 1.048568417 | -4.841094634 | 31.88996488 | -4.841094634 |
| -56 | -36.02515758 | 41.97484242 | 70.51701571 | 1.247470145 | 5.868885604 | 168 | 1.677973428 | 1.122235743 | -4.746640961 | 28.86604936 | -4.746640961 |
| -55 | -35.5298759 | 41.4701297 | 68.98279904 | 1.349706326 | 5.846220389 | 167 | 1.801280937 | 1.192865232 | -4.653355157 | 26.49943249 | -4.653355157 |
| -54 | -35.0252454 | 40.9747546 | 67.5639697 | 1.451331374 | 5.821774358 | 166 | 1.922561735 | 1.260674541 | -4.561098817 | 24.57660661 | -4.561098817 |
| -53 | -34.51155446 | 40.48844554 | 66.23984632 | 1.552914271 | 5.795354958 | 165 | 2.041865726 | 1.325772572 | -4.469782286 | 22.97009168 | -4.469782286 |
| -52 | -33.98908421 | 40.01091579 | 64.9953486l | 1.653824135 | 5.767570176 | 164 | 2.159259304 | 1.388260233 | -4.379309943 | 21.59634794 | -4.379309943 |
| -51 | -33.45811127 | 39.54188873 | 63.81906493 | 1.754290228 | 5.737828536 | 163 | 2.274796052 | 1.448231122 | -4.289597414 | 20.40684094 | -4.289597414 |
| -50 | -32.91890703 | 39.08109297 | 62.70210129 | 1.854101966 | 5.706339098 | 162 | 2.388523365 | 1.505772149 | -4.200566949 | 19.35688594 | -4.200566949 |
| -49 | -32.37173752 | 38.62826248 | 61.63735721 | 1.953408927 | 5.673111454 | 161 | 2.50048302 | 1.560964092 | -4.11214761 | 18.42073926 | -4.11214761 |
| -48 | -31.81686329 | 38.18313671 | 60.61904947 | 2.05212086 | 5.638155725 | 160 | 2.610711684 | 1.61388211 | -4.024273612 | 17.57767346 | -4.024273612 |
| -47 | -31.25453938 | 37.74546062 | 59.64238737 | 2.150207697 | 5.601482559 | 159 | 2.719241382 | 1.664596213 | -3.936896346 | 16.81189317 | -3.936896346 |
| -46 | -20.68501525 | 37.31498475 | 58.70334442 | 2.247635956 | 5.563103127 | 158 | 2.826099913 | 1.713171656 | -3.849931471 | 16.11112275 | -3.849931471 |
| -45 | -30.10853477 | 36.89146523 | 57.79849363 | 2.344386771 | 5.523029121 | 157 | 2.931311236 | 1.759669353 | -3.763359768 | 15.46363889 | -3.763359768 |
| -44 | -29.52333624 | 36.47466376 | 56.92485899 | 2.440419858 | 5.481272746 | 156 | 3.034895818 | 1.804146209 | -3.677126537 | 14.86771761 | -3.677126537 |
| -43 | -28.93635242 | 36.06434758 | 56.07995901 | 2.53570957 | 5.437846722 | 155 | 3.136870949 | 1.846655444 | -3.591191278 | 14.31097317 | -3.591191278 |
| -42 | -28.33971056 | 35.66028944 | 55.26146682 | 2.630226881 | 5.392764278 | 154 | 3.237251033 | 1.887246835 | -3.505517393 | 13.79022355 | -3.505517393 |
| -41 | -27.73773244 | 35.26226756 | 54.46742573 | 2.723942998 | 5.346039145 | 153 | 3.336047849 | 1.925967235 | -3.4200719l | 13.30113625 | -3.4200719l |
| -40 | -27.12993451 | 34.87006549 | 53.69607149 | 2.816829377 | 5.297685557 | 152 | 3.433270797 | 1.962860318 | -3.334825239 | 12.84014592 | -3.334825239 |
| -39 | -26.51652792 | 34.48347208 | 52.94582506 | 2.908857721 | 5.247718243 | 151 | 3.528927116 | 1.997967303 | -3.24975094 | 12.40413698 | -3.24975094 |
| -38 | -25.89771861 | 34.10228139 | 52.21526514 | 3 | 5.19615242 | 150 | 3.623022086 | 2.031326914 | -3.164825508 | 11.99052287 | -3.164825508 |
| -37 | -25.27370747 | 33.72629253 | 51.5031057 | 3.090229449 | 5.143003804 | 149 | 3.715539215 | 2.062975621 | -3.080028183 | 11.59707149 | -3.080028183 |
| -36 | -24.64469043 | 33.35530957 | 50.80817757 | 3.179515585 | 5.088288577 | 148 | 3.806540412 | 2.092978814 | -2.995340763 | 11.22186615 | -2.995340763 |
| -35 | -24.01085854 | 32.98914146 | 50.12941317 | 3.2678342l | 5.032023408 | 147 | 3.895956137 | 2.121275964 | -2.910747443 | 10.86322853 | -2.910747443 |
| -34 | -23.37239818 | 32.62760182 | 49.46583337 | 3.355157421 | 4.974225435 | 146 | 3.983835553 | 2.14799078 | -2.826234656 | 10.51970632 | -2.826234656 |
| -33 | -22.72949111 | 32.27050889 | 48.81653684 | 3.414586l8 | 4.914912266 | 145 | 4.070146651 | 2.173121337 | -2.741790929 | 10.19002479 | -2.741790929 |
| -32 | -22.08231465 | 31.91768535 | 48.18069646 | 3.526711514 | 4.854101966 | 144 | 4.154896383 | 2.196695212 | -2.657406755 | 9.873062432 | -2.657406755 |
| -31 | -21.43104183 | 31.56895817 | 47.55753422 | 3.610890139 | 4.791811306 | 143 | 4.238980764 | 2.218738598 | -2.573074462 | 9.567823551 | -2.573074462 |
| -30 | -20.77584l5 | 31.2241585 | 46.94633852 | 3.699968852 | 4.728064522 | 142 | 4.319694984 | 2.239276418 | -2.488788104 | 9.273444704 | -2.488788104 |

FIG. 28D

APPARATUS AND METHOD FOR COLLECTING ENERGY

CROSS REFERENCE TO RELATED APPLICATIONS

This application is a Continuation in Part Application of U.S. patent application Ser. No. 09/921,087, now U.S. Pat. No. 6,895,145, filed Aug. 2, 2001, which is hereby incorporated by reference in its entirety herein.

FIELD OF THE INVENTION

The present invention relates to a light collection apparatus and method that utilizes a number of light collectors, which collect light energy, each having a lens, having a spherical surface and optical fibers for directing the collected light to an energy transfer or a number of lighting fixtures. A plurality of fibers is disposed relative to a surface of the lens to optimize collection of light.

Each of the applications and patents cited in this text, as well as each document or reference cited in each of the applications and patents (including during the prosecution of each issued patent; "application cited documents"), and each of the PCT and foreign applications or patents corresponding to and/or claiming priority from any of these applications and patents, and each of the documents cited or referenced in each of the application cited documents, are hereby expressly incorporated herein by reference in their entirety. More generally, documents or references are cited in this text, either in a Reference List before the claims, or in the text itself; and, each of these documents or references ("herein-cited references"), as well as each document or reference cited in each of the herein-cited references (including any manufacturer's specifications, instructions, etc.), is hereby expressly incorporated herein by reference in its entirety.

BACKGROUND OF THE INVENTION

Energy consumption continues to increase with technological advancements. "Traditional" energy sources, such as coal, oil and natural gas (fossil fuels) continue to be depleted, and the use of such energy sources has caused a significant amount of pollution to the environment. Consequently, alternative energy sources, which have reduced negative pollution effects, have been in development. Although many of these alternatives address some of the problems with "traditional" energy sources, most do not provide an adequate solution.

For example, nuclear energy is a relatively efficient and long-lasting energy source. However, it presents immense environment concerns. Another alternative energy source is hydro-electric power plants, which while providing energy with essentially no air pollution, alter entire local ecosystems due to construction of generation facilities.

Thus, there is an increasing need for an inexpensive, efficient, clean, and non-depleting energy source.

Technology for harnessing solar energy (thermal and light energy) has been in development in hopes of establishing a clean, safe, and non-depleting power source. However, there has not been a suitable method of collecting and utilizing this energy source. Parameters for harnessing solar energy change constantly with the time of day, weather, location of the collection device and other factors. As a result, a flexible system that can efficiently convert solar energy to usable form of energy and that can quickly and efficiently adjust to parameter changes is needed in order to be a viable energy source.

A number of apparatuses for providing a viable solar powered energy source have been in development. With respect to such apparatuses, reference is made to the following:

U.S. Pat. No. 4,529,830, issued to Daniel, involves an apparatus for collecting, distributing and utilizing solar radiation including a solar collection panel having an array of solar gathering cells which provide radiation to a light collecting unit, which provides radiation as a single beam to a lens system for providing a coherent beam to a lightpipe. This beam is then directed to use units such as a light to electricity converter, heat distributing elements and light distributing elements.

U.S. Pat. No. 4,943,125, issued to Laundre, et al. relates to a solar collector for the collection and distribution of incident electromagnetic radiation, having optic fibers as direct means for solar energy concentration and collection, and a hemispherical collector allowing for the even collection of sunlight regardless of the sun's position relative to the horizon.

U.S. Pat. No. 5,716,442, issued to Fertig is directed to a light pipe energy conservation system that includes: a plurality of photovoltaic cell arrays mounted on substances, and exterior transparent protective dome and reflector; a light concentrator means; a battery charge controller; and a rechargeable battery or plurality of batteries.

U.S. Pat. No. 4,078,548, issued to Kapany involves a solar panel that includes a window portion interposed between incident light and a heat absorbing portion, at least one of the heat absorbing and window portions having a plurality of spaced apart reflecting surfaces, separate ones of which face each other and transmit the incident light by multiple reflections to the heat absorbing portion.

U.S. Pat. No. 4,237,867, issued to Bauer is directed to solar energy absorbing means in solar collectors provided by matts of a fibrous material, which by its chemical composition absorbs solar radiation, for converting the solar energy to thermal energy within the fiber itself.

U.S. Pat. No. 4,798,444, issued to McLean relates to a solar collection device used to maximize solar collection by a plurality of fixed collectors that concentrate all available sunlight on its surface into a single transfer conduit. The device uses fiber optics in pre-arranged and fixed arrays that will track the inclination of the sun's rays without moving by using a single directional convergent lens.

U.S. Pat. Nos. 5,019,768 and 5,223,781, both issued to Criswell, et al. pertain to a system for transmitting microwaves to one or more receiver assemblies. This system includes an array of separate microwave transmitting assemblies for emitting a plurality of microwave beams, the array being arranged to apparently fill a radiating aperture of predetermined shape and size when viewed from the direction of a receiver assembly, and a phase controlling assembly associated with the microwave transmitting assemblies for controlling the relative phase of the emitted beams to form at least one composite shaped microwave beam directed to at least one receiver assembly.

U.S. Pat. No. 5,500,054 issued to Goldstein is directed to a superemissive light pipe includes a photon transmitting optically transparent host having a body and oppositely arranged end portions.

While these references provides examples of apparatus for collecting solar energy, none of these patents discloses or suggests a light collection method and apparatus that is a sufficiently consistent and reliable source for providing electrical power to be adaptable to a traditional power system for electrical power.

It has therefore been found desirable to design a light energy collection apparatus and method with the advantages as noted below.

SUMMARY OF THE INVENTION

The present invention was made in consideration of the above problems for providing a clean, efficient and reliable energy source.

To address the above-described problems and to achieve other advantages, a light collection method and apparatus that includes direct energy conversion of collected light to usable power is provided. In accordance with an embodiment of the invention, arrays of light converging lenses concentrate solar light, which is transmitted via optical fibers to power a steam turbine generator.

In accordance with another embodiment of the invention, arrays of light converging lenses concentrate solar light, which is transmitted via optical fibers to provide internal lighting and/or heating. Alternative power sources, such as utility powered lighting may be used as a backup system for such internal lighting.

In accordance with an embodiment of the invention, a central lighting system is provided where collected light is distributed to a number of light fixtures.

Furthermore, another embodiment of the present invention is directed to a lens that has a first portion, fabricated from a first material, with an associated index of refraction. The lens also has a second portion, fabricated from a second material, with an associated index of refraction. The index of refraction of the second material is higher than the index of refraction of the first material. The second material may surround the first material.

It is also an embodiment of the present invention that additional portions of the lens may be fabricated from materials with associated indices of refraction.

As will be described herein, another embodiment of the present invention is directed to an apparatus for collecting energy. The apparatus includes a lens adapted to focus light received from a source of light; and a plurality of fibers, each fiber disposed in a first predetermined relationship to other fibers and each fiber disposed in a second predetermined relationship to the lens. The first predetermined relationship and the second predetermined relationship enable each fiber to have a specific energy collecting coefficient as a function of a shape of the lens and a position of the source of light.

The present invention is also directed to an apparatus for collecting solar energy. The apparatus includes a lens for receiving solar energy, the lens having a curved surface portion. A plurality of fibers is arranged such that each fiber is disposed at a predetermined position relative to the curved surface portion of the lens. The predetermined position is a function of the focal point of the lens and each fiber has a maximum collection capability as a function of time.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention may be indicated in the claims.

These and other embodiments of the invention are provided in, or are obvious from, the following detailed description.

In this disclosure, "comprises," "comprising," and the like can have the meaning ascribed to them in U.S. Patent law and can mean "includes," "including," and the like.

BRIEF DESCRIPTION OF THE DRAWINGS

The invention is illustrated by way of example, and not limitation, in the figures. Like references indicate similar elements.

Figure 28A:
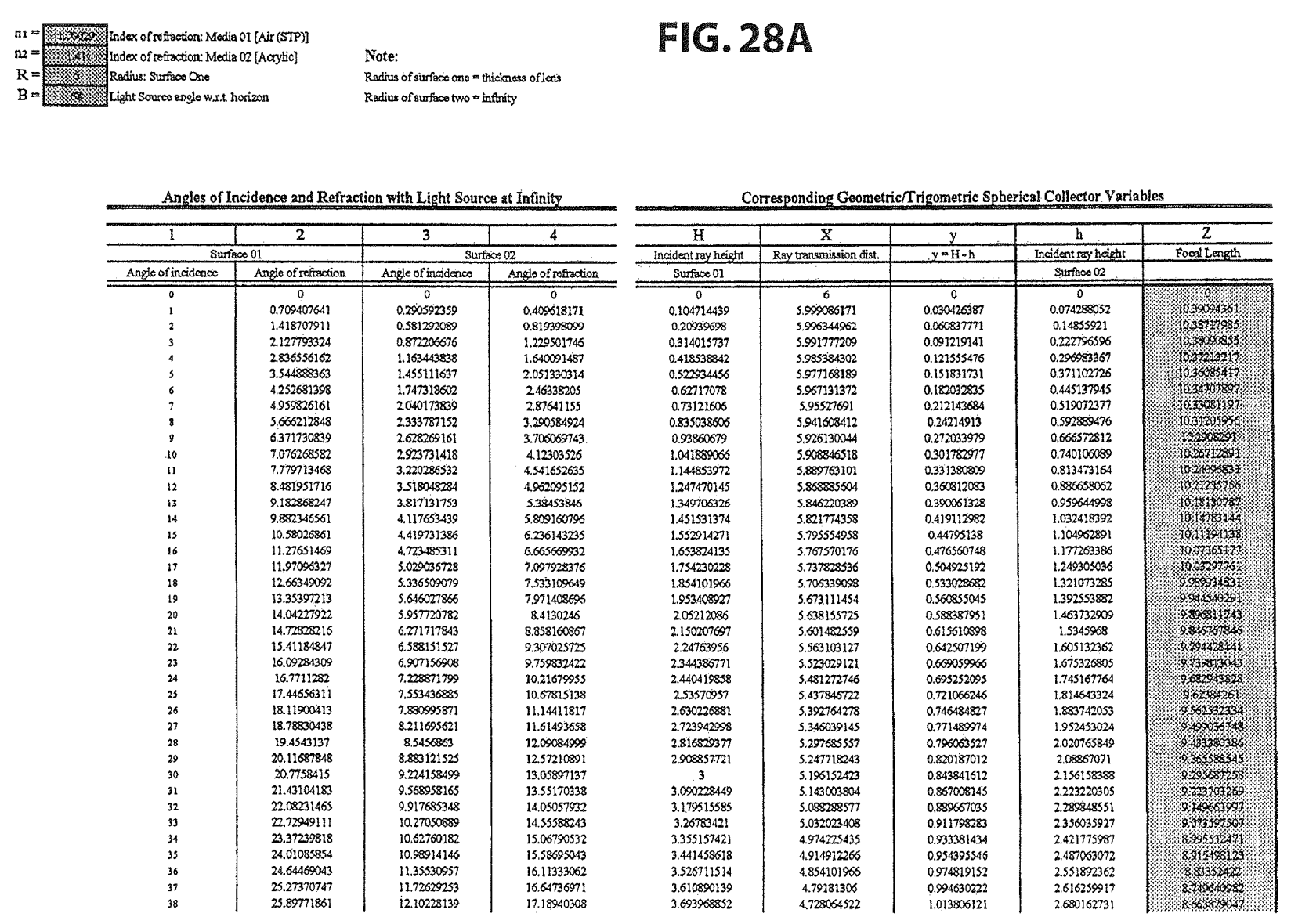
Figure 28B:
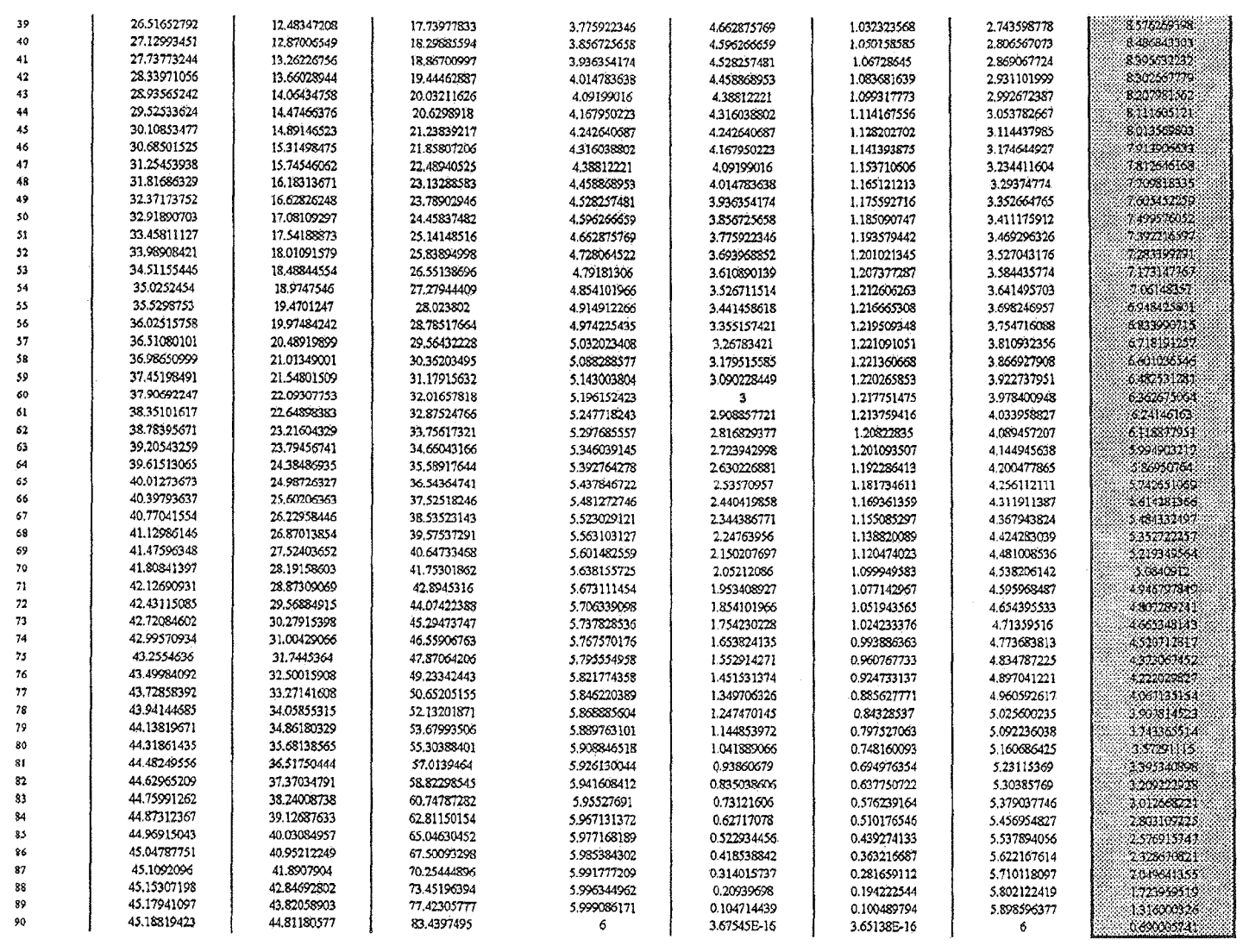
Figure 28D:
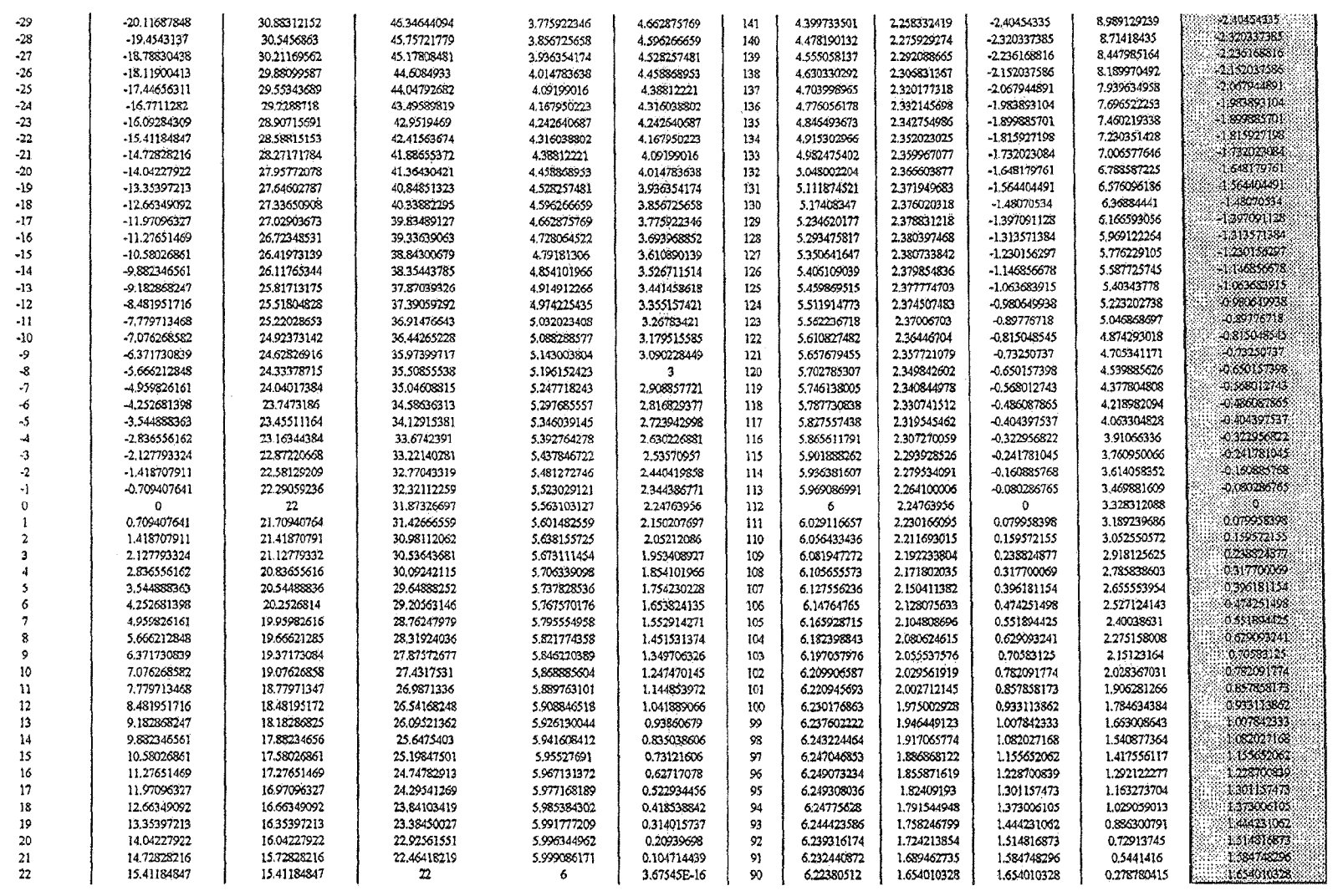

FIGS. 27, 28A-D, 29 and 30 are diagrams and tables illustrating the principles for collecting solar light energy using the inventive design of the collection unit according to an embodiment of the invention;

DETAILED DESCRIPTION

Figure 1A:
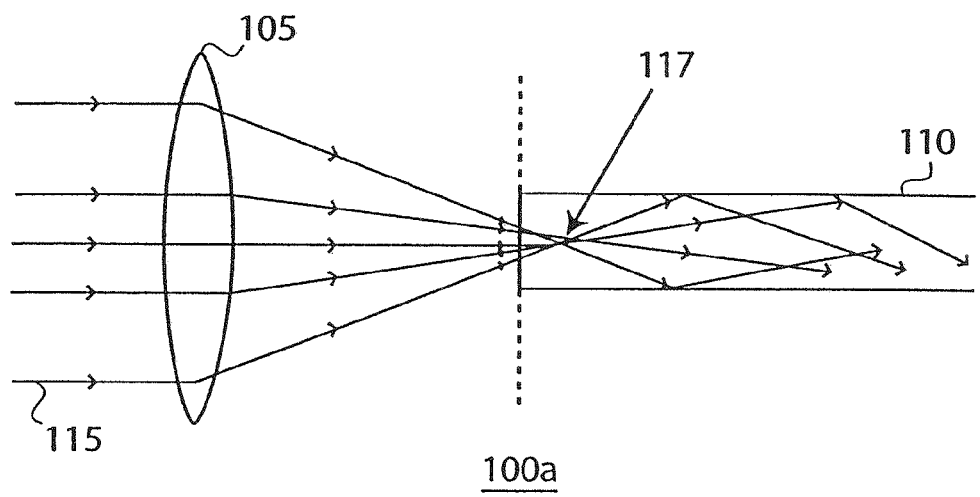
FIGS. 1A and 1B show the use of a convex lens and a spherical lens, respectively, for directing light rays into an optical fiber in accordance with an embodiment of the invention.
Figure 1B:
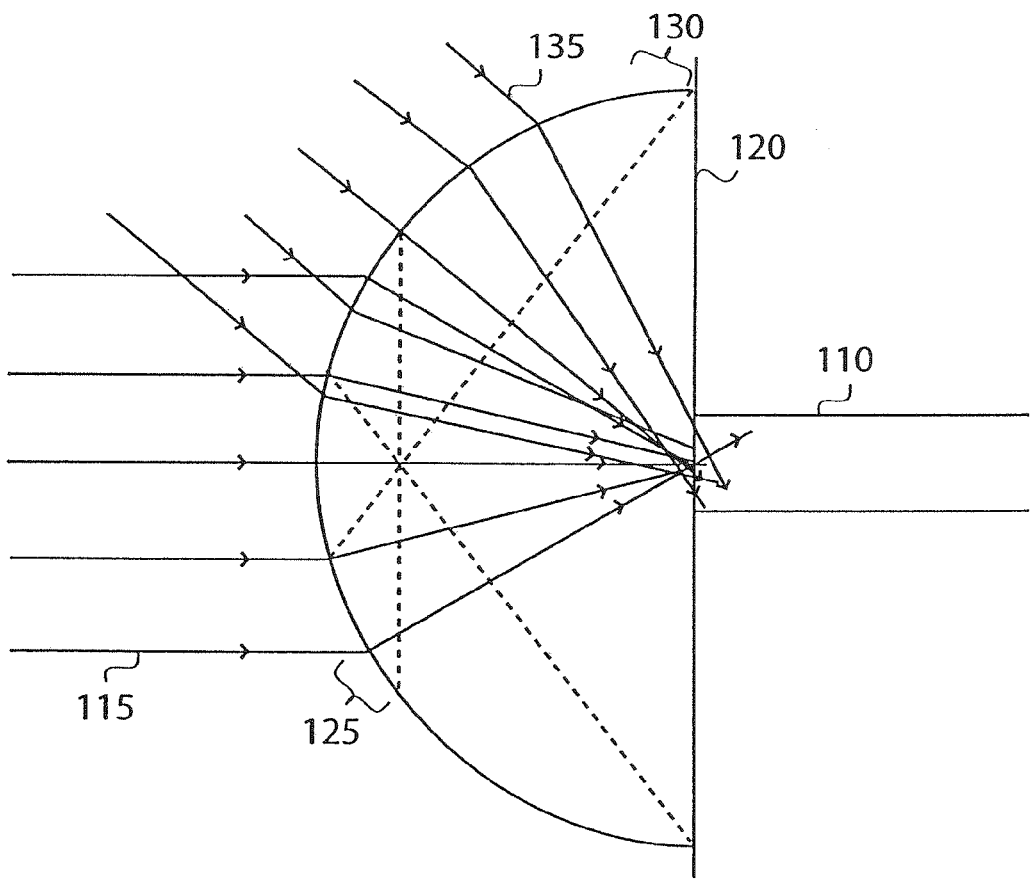

FIGS. 1A and 1B illustrate light collection by directing incoming light into an optical fiber, which may then transmit the collected light to transfer the collected energy, according to respective embodiments of the invention. As shown in FIG. 1A, a light collection system 100a may include a convex lens 105 and an optical fiber 110. For a distant light source (e.g. the sun), incoming light 115 passing through convex lens 105 is bent inward, or made to converge, to a focal point 117 of lens 105 (the place where light rays 115 converge). Lens 105 may be made from a number of transparent materials, each with a corresponding index of refraction (denoted by the variable n). For example, acrylic has an index of refraction of 1.49 (n=1.49) and Pyrex glass has an index of refraction of 1.39 (n=1.39). Optical fiber 110 may be placed at or near focal point 117 of lens 105 for collecting the converged light.

Optical fiber 110 may be any light transmission medium that preserves the energy level (wavelength, intensity, etc.) of light transmitted therein. Although any type of fiber optic cable can be used (within reasonable parameters), fused silica and other high performance fibers are preferred over conventional plastic fiber. All types of fiber optic cable are highly efficient (minimal attenuation), with maximized efficiency less than two percent (2%) loss/km. Additionally, optical fiber 110 may be bundled or solid core—although bundled fiber is preferred over thicker cable for increase flexibility. Fiber optics utilizes the physical principle of total internal reflection, which is 100% reflective. Thus, no energy is lost each time the light bounces on the wall of a fiber optic cable. The only energy lost is that which is absorbed into the material of the cable itself. Other types of light transmission media, such as hollow light pipes coated with reflective material, may also be used. However, such pipes are bulky and inefficient, thus limiting the distance of transmission and utility.

In many instances, a point source is not optimal for light collection. Therefore, in accordance with an embodiment of the invention, optical fiber 110 may be place slightly closer to lens 105 than the focal distance (distance from lens 105 to focal point 117) thereof.

FIG. 1B shows a modified light collection system 100b that utilizes a spherical lens 120 in place of convex lens 105 in FIG. 1A. As shown in FIG. 1B, spherical lens 120 acts as a converging lens on incoming light 115 in a similar manner to lens 105 by operation of lens section 125. Spherical lens 120 may further act as an aligned converging lens on incoming light rays 135 from a different direction by operation of lens section 130. Thus, spherical lens 120 may be effective in converging light rays 115 and 135 from different directions into fiber 110 without the need for realignment. As with lens 105, lens 120 may be made from a number of transparent materials, each with a corresponding index of refraction (denoted by the variable n). For example, acrylic has an index of refraction of 1.49 (n=1.49) and Pyrex glass has an index of refraction of 1.39 (n=1.39). Optical fiber 110 may be placed at or near focal point 117 of lens 105 for collecting the converged light.

Figure 2A:
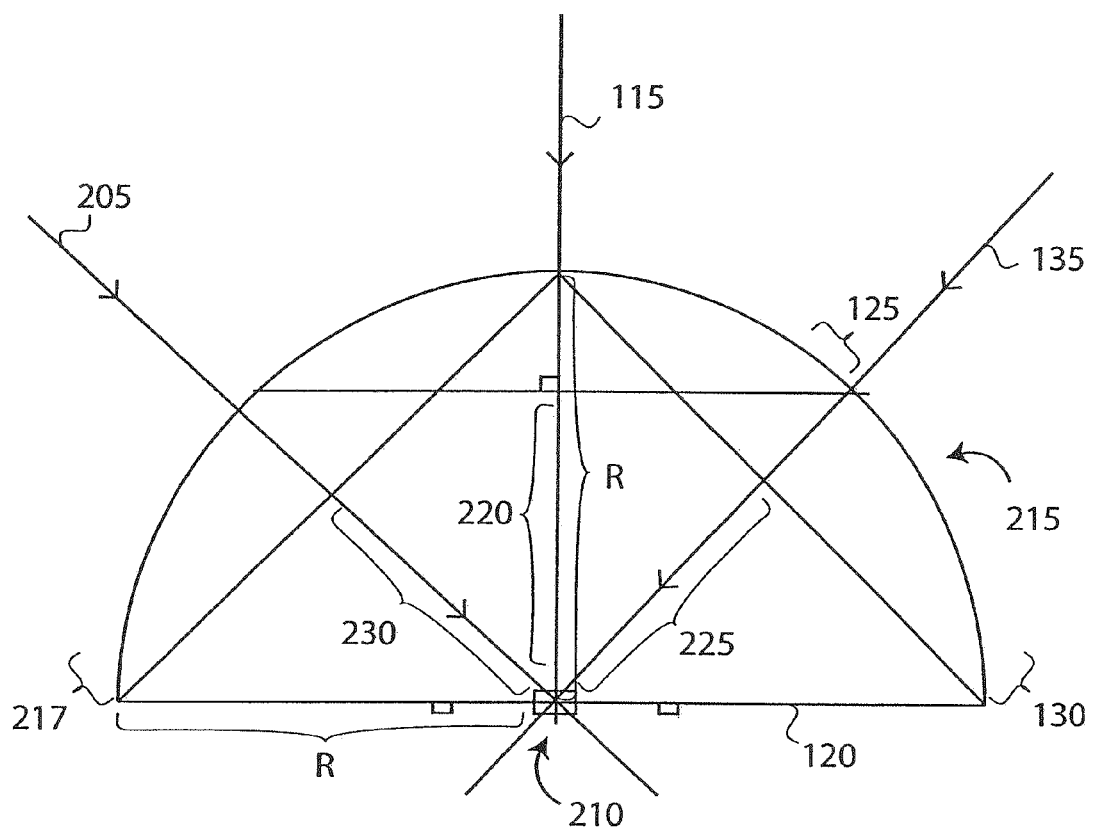
FIGS. 2A and 2B illustrate the geometry of the spherical lens of FIG. 1B.
Figure 2B:
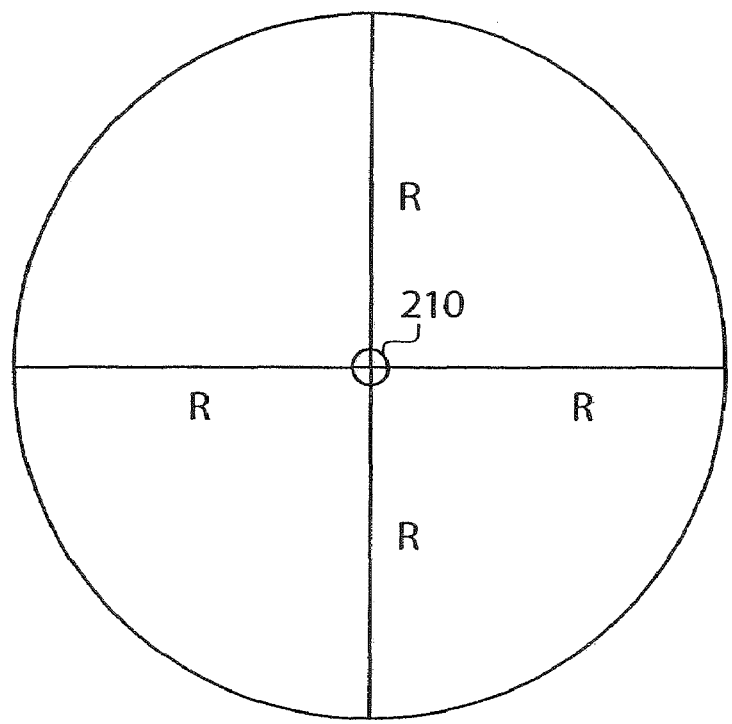

FIGS. 2A and 2B are a side view and a top view of lens 120, respectively, to illustrate the spherical geometry of lens 120 and the convergence of lights 115, 135 and 205 from different directions to a center point 210 of the spherical outer surface 215 having a radius R of lens 120. As shown in FIG. 2A, lens section 125 converges light 115, lens section 130 converges light 135, and lens section 217 converges light 205, respectively, with corresponding focal lengths 220, 225, and 230. Thus, spherical lens 120 allows for uniform geometry from any point of lens 120.

As described above, lens 120, which may hereinafter also be referred to as a "Collector Unit" or a "Refractive Unit" or collection means according to an embodiment of the invention is a refractive unit, rather than a system of reflective mirrors and lenses which are bulky, difficult to maintain, and expensive. Refraction offers far higher efficiency than reflective mirrors (reflective mirrors require polishing which increases the overall cost of operation). A Refractive unit, i.e., lens 120, can be manufactured using a molding process (such as injection molding or vacuum molding), which is relatively inexpensive and efficient. Thus, the present invention allows for changing the characteristics of lens 120 by changing the index of refraction thereof rather than changing its curvature. As a result, manufacturing efficiency is increased where different units may still have the same shape made from the same mold.

The principles for the multidirectional light collection by spherical lens 120 according to the present invention will be discussed in further detail below. As will also be described in further detail below, lens 120 may utilize multiple layers made up of materials with varying refractive indices.

Figure 3A:
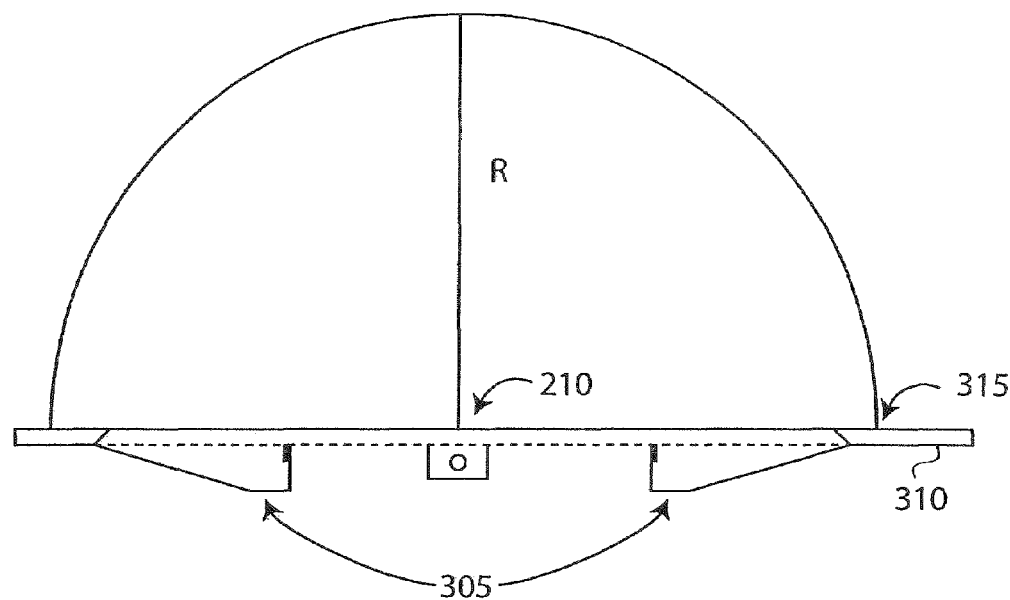
FIGS. 3A and 3B are views of the spherical lens of FIG. 1B including an interface for attaching to an array in accordance with an embodiment of the invention.
Figure 3B:
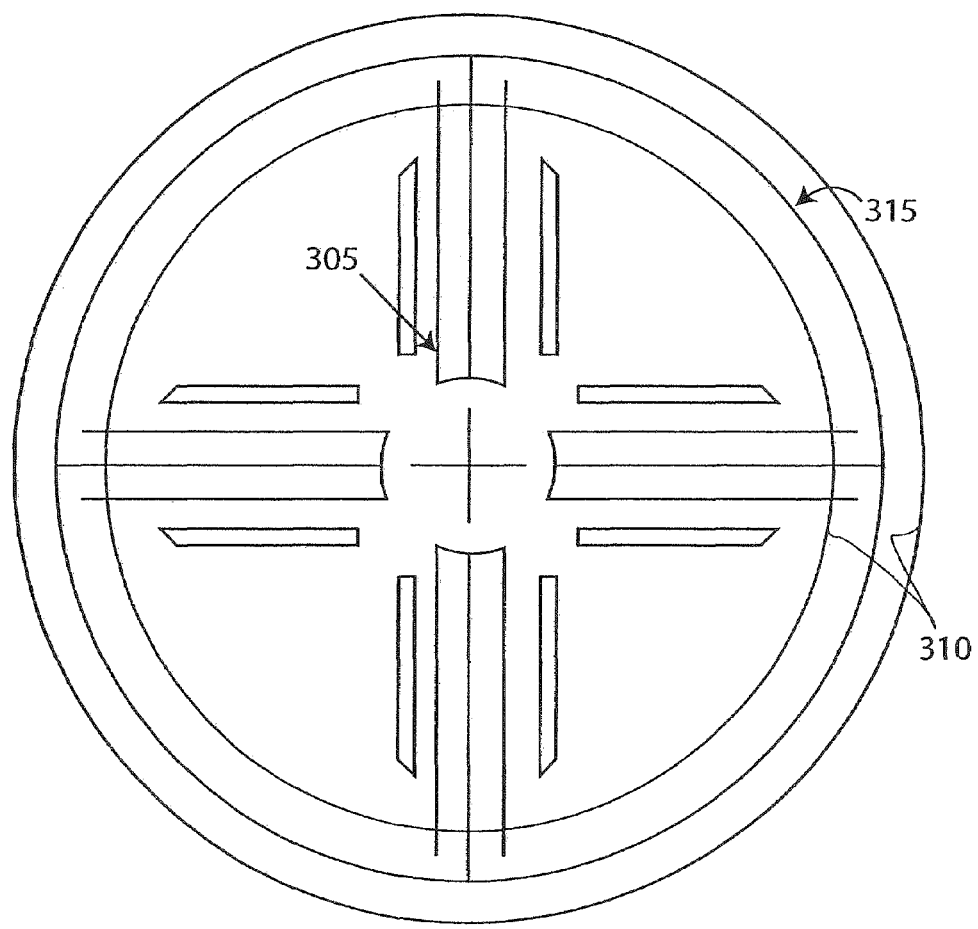

FIGS. 3A and 3B show the side view and the bottom view, respectively, of lens (shown as 120 herein, and described with relation to FIGS. 3A and 3B) in accordance with an embodiment of the invention. As shown in FIGS. 3A and 3B, lens 120 may include a mating assembly 305 disposed on an assembly ring interface 310, which may be integrated to lens 120 or may be attached sections thereof. In accordance with an embodiment of the invention, lens 120, mating assembly 305, and assembly ring interface 310 form a whole unit that is injection molded into one piece for ease of assembly and replacement. Assembly ring interface 310 may run along the circumferential base edge 315 of lens 120 for mounting lens 120 onto an array 405, as shown in FIGS. 4A, 4B, and 4C.

Figure 4A:
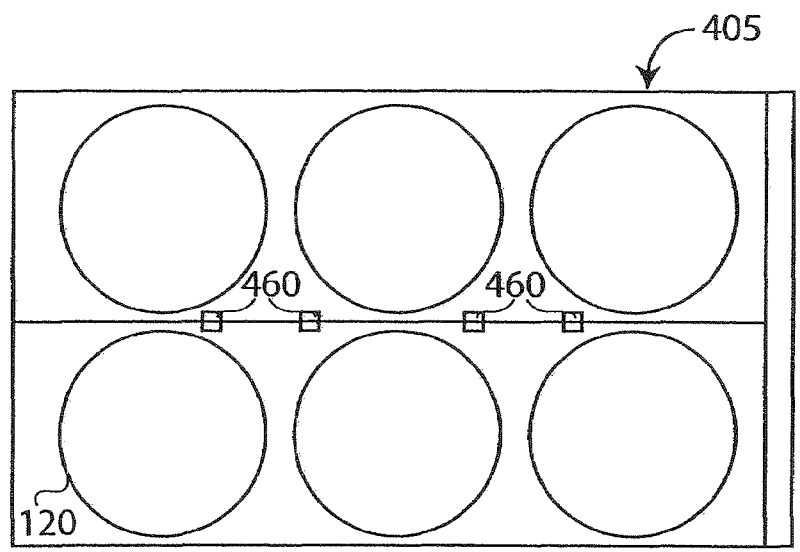
FIGS. 4A, 4B, 4C and 4D are diagrams illustrating the attachment of spherical light collection lenses to an array according to an embodiment of the invention.
Figure 4B:
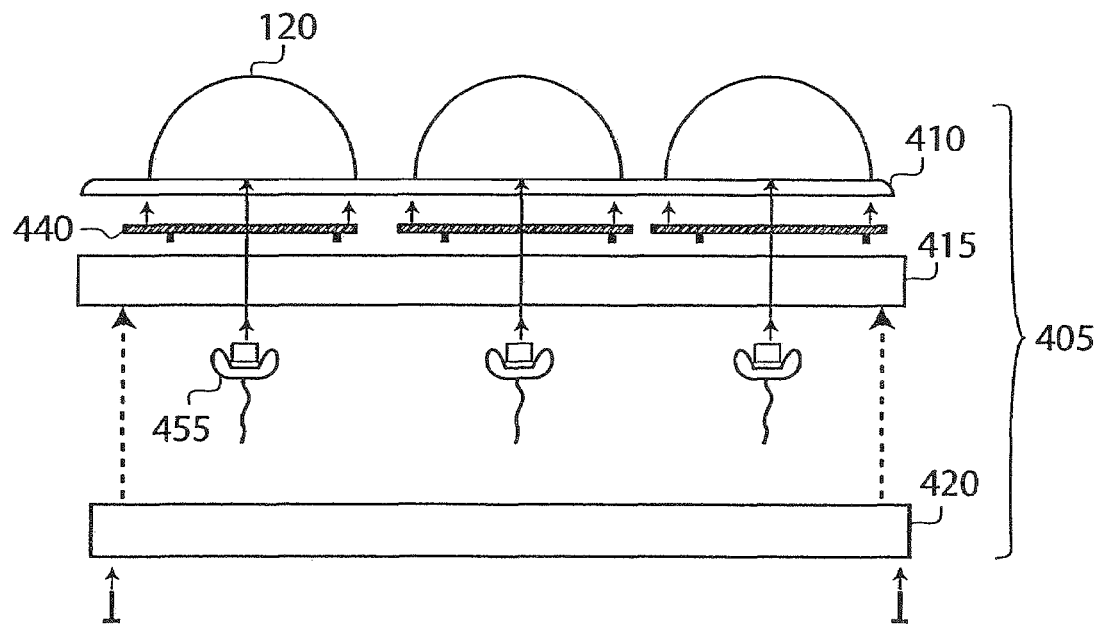

Referring now to FIGS. 4A, 4B, 4C, and 4D, lens 120 may be affixed to an array 405 that includes a number of lenses for collecting light. FIGS. 4A and 4B illustrate the top view and the side view, respectively, of array 405. As shown in FIG. 4B, array 405 may include a top panel 410, a middle section 415, and a bottom panel 420 for securing multiple lenses (e.g., lens 120).

Figure 4C:
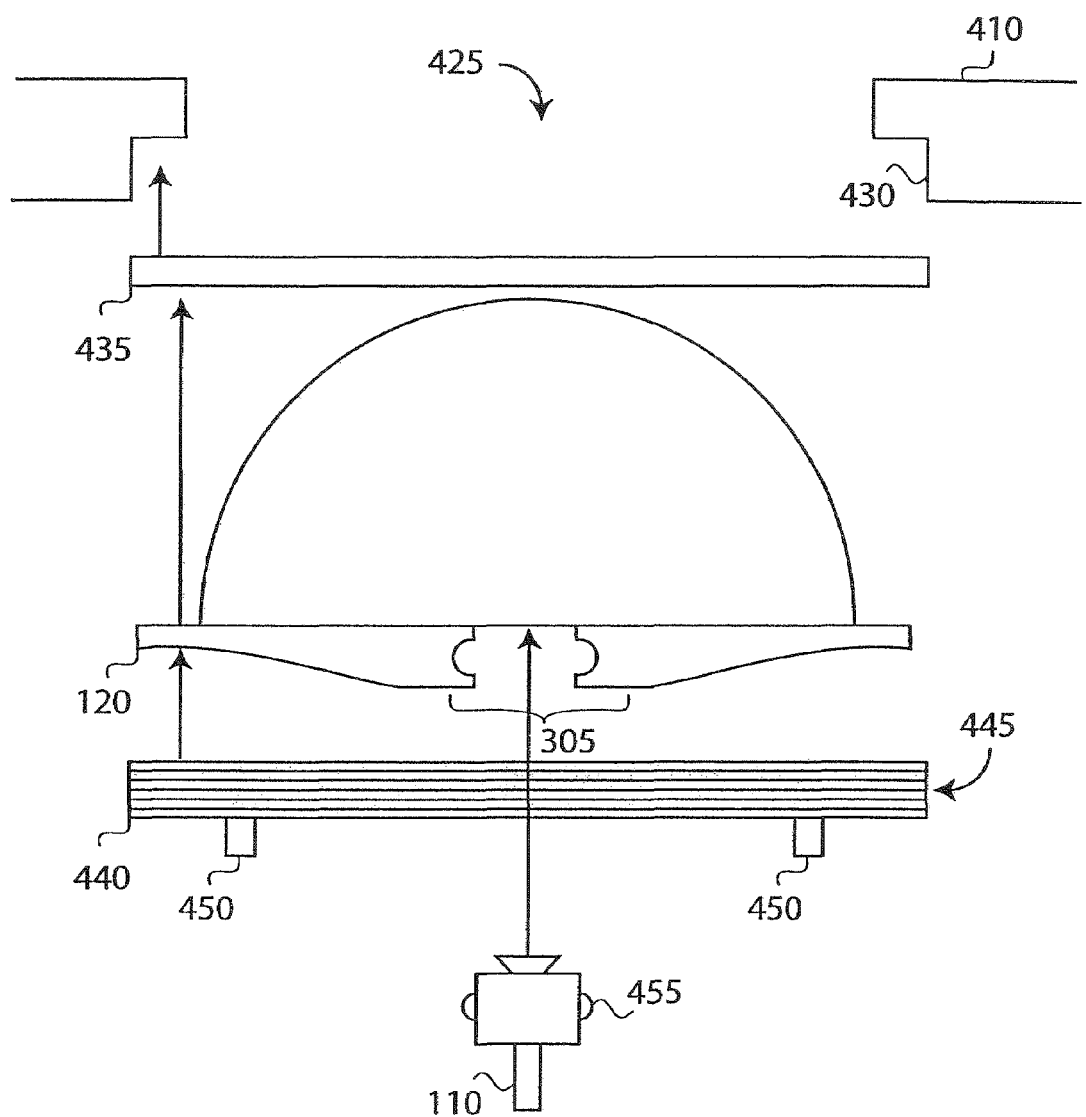
Figure 4D:
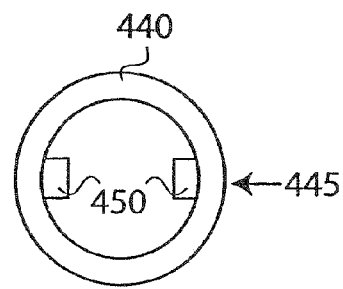
Figure 4D:
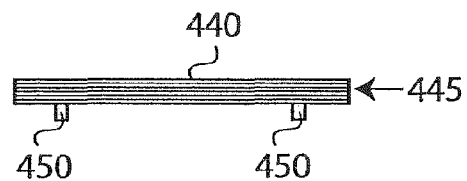

FIG. 4C shows the detailed assembly of affixing lens 120 to array 405. Top panel 410 includes a circular opening 425 for fitting the spherical shape of lens 120 therethrough. Top panel 410 may also include threads 430 for securing an O-ring 435 and lens 120 by engaging corresponding threads 445 on a locking ring 440. Locking ring 440 may include handles 450 for turning and engaging threads 445 on locking ring 440 to threads 430 on top panel 410. FIG. 4D includes a side view and a top view of locking ring 440 to illustrate threads 445 and handles 450. Referring back to FIGS. 4B and 4C, a mating adapter 455 may be used to attach fiber 110 to mating assembly 305 of lens 120.

Figure 5:
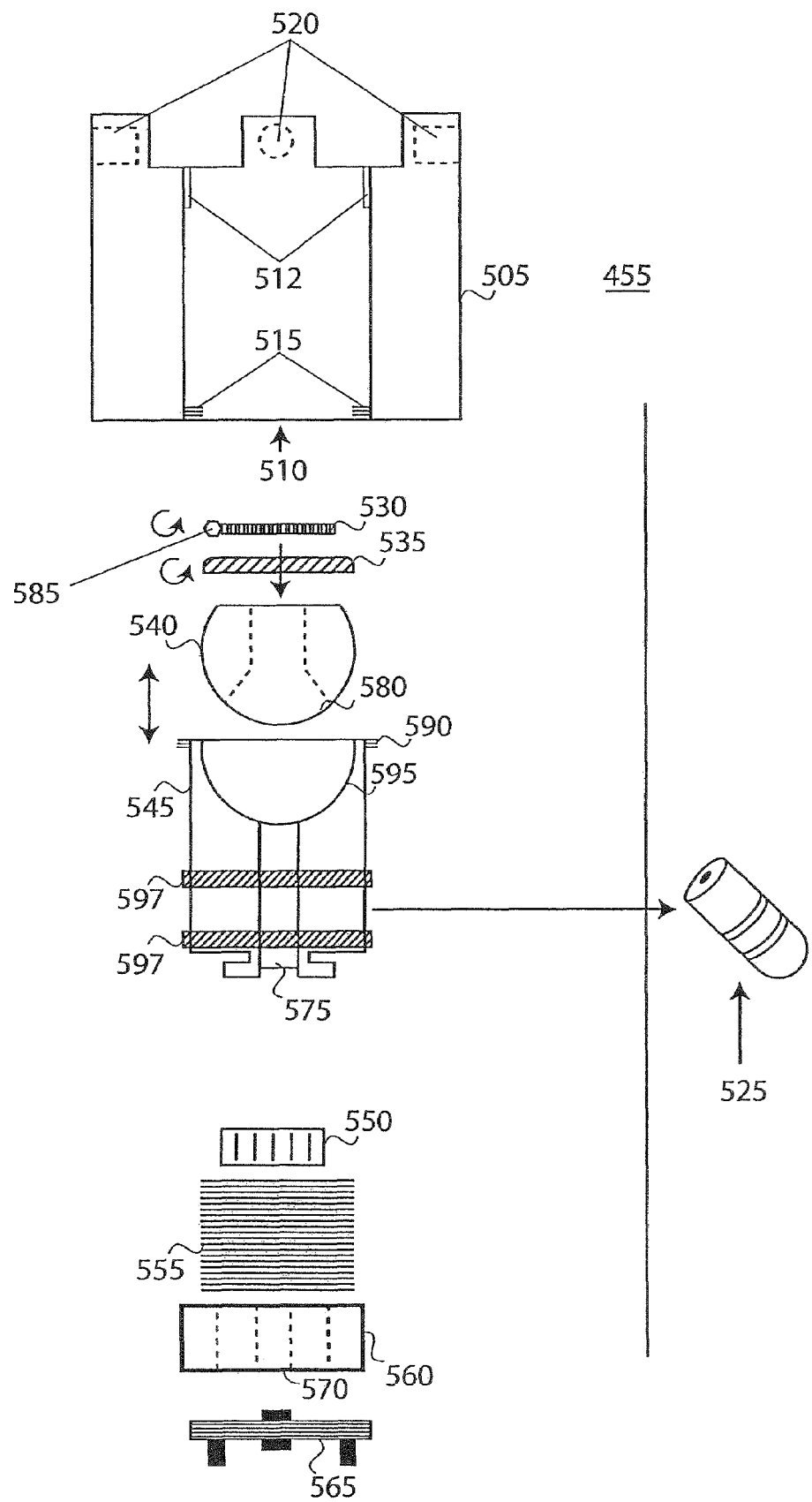
FIG. 5 is an expanded view of the assembly of a mating adapter for connecting an optical fiber to a light collection lens in accordance with an embodiment of the invention.
Figure 6A:
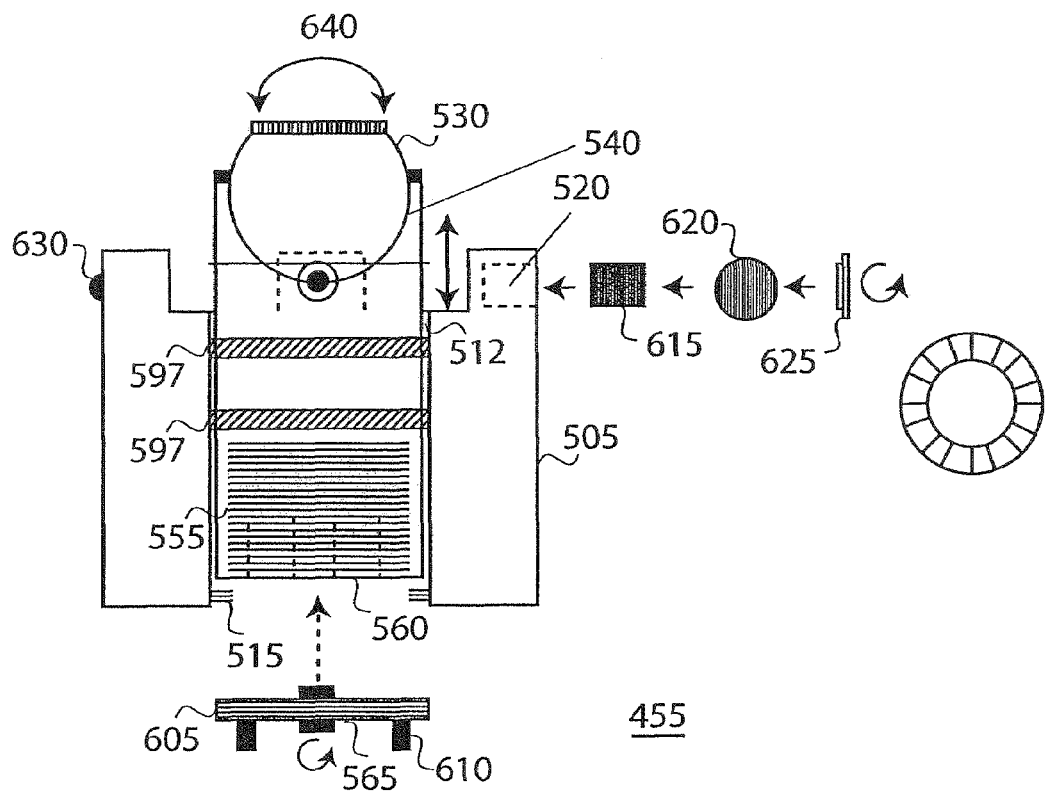
FIGS. 6A and 6B show the assembled mating adapter of FIG. 5.
Figure 6B:
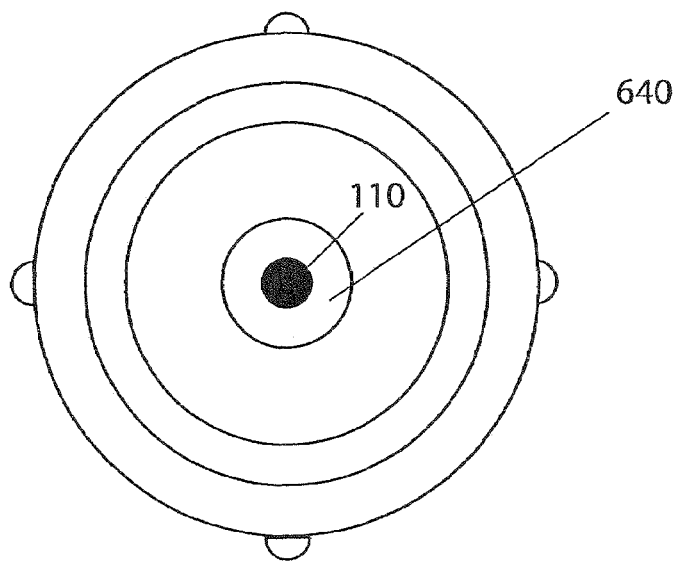

FIGS. 5, 6A, and 6B show an expanded assembly view, a side view, and a top view, respectively, of mating adapter 455 in accordance with an embodiment of the invention. As shown in FIG. 5, mating adapter 455 includes a main body 505 having a center channel 510 that decreases in circumference and forms a circular ledge 512, screw threads 515 around the bottom of the inner wall of center channel 510, and openings 520 around the circumference of main body 505. In accordance with an embodiment of the invention, center channel 510 houses a retractable pivot assembly 525 that secures fiber 110. Retractable pivot assembly 525 includes: a fiber clamp 530, a retaining ring 535, a ball joint 540, an assembly body 545, a clamp 550, a spring 555, a rubber stopper 560, and a bottom cap 565. Fiber 110 is fitted through a center channel 570 in rubber stopper 560, a center channel 575 in assembly body 545, and a center channel 580 in ball joint 540 up to fiber clamp 530, which may be tightened around fiber 110 to secure it in place by tightening a screw 585. Fiber clamp 530 may be screwed on (or otherwise attached) to ball joint 540 which is secured within assembly body 545 by securing retaining ring 535 to threads 590. Thus, retaining ring 535 may hold ball joint 540 within a cavity 595 in assembly body 545 in a manner that allows ball joint 540 to pivot, and, thus, account for manufacturing variations and thermal expansion. Assembly body 545 includes retaining rings 597 for engaging the inner wall of center channel 510 of main body 505. Clamp 550 secures fiber 110 to assembly body 545. Spring 555 and rubber stopper 560 provide engagement of retaining rings 597 to circular ledge 512 in center channel 510 by pushing against bottom cap 565.

As shown in FIG. 6A, retractable pivot assembly 525, as shown in FIG. 5, and described herein, is fitted through center channel 510, as shown in FIG. 5, and described herein, of main body 505. Bottom cap 565 includes threads 605 and handles 610 for engaging threads 515. Thus, spring 555 pushes assembly body 545, as shown in FIG. 5, and described herein up so that an upper retaining ring 597 is against ledge 512 in center channel 510. Thus, by screwing bottom cap 565 into center channel 510, retractable pivot assembly 525 is secured in main body 505 of mating adapter 455. As shown in FIGS. 6A and 6B, fiber 110, as shown in FIGS. 1A and 1B and described herein, clamped in fiber clamp 530 may form the target area for lens 120, described herein, when mating adapter 455 is attached to mating assembly 305, as shown in FIG. 3A, and described herein. As described before, ball joint 540 may pivot to account for manufacturing variations and thermal expansion. In other words, top surface 640 of mating adaptor 455, which includes an input for collected light into fiber 110, described herein, is pivoted to engage the bottom surface of lens 120, described herein, at center point 210, as shown in FIG. 3A and described herein.

In each of openings 520 on main body 505 of mating adapter 455, a spring 615 pushes a ball 620 against a retaining plate 625 that is attached to main body 505 (e.g., screwed into place by engaging threads on openings 520). Thus, as shown by reference number 630, a part of ball 620 protrudes on the outer surface of main body 505. The outward pressure provided by spring 615 allows for engaging 630 (or ball 620) to corresponding notches in mating assembly 305 (described herein). As a result, mating adapter 455 may be easily and securely attached to and detached from mating assembly 305 (described herein). Furthermore, the connection between fiber 110 and lens 120 (fiber 110 and 120 described herein) is thus sealed from external interference (such as dust, moisture, etc.).

It is noted that one or more photo sensors (not shown) may be mounted on mating adapter 455 for measuring light input in fiber 110. Temperature sensors (not shown) may also be included in main body 505, assembly body 545, or any part of mating adapter 455 to monitor the temperature and determine the effectiveness of light collection.

By monitoring the temperature of mating adapter 455, it may be determined whether light is being converged into fiber 110 (described herein) effectively or whether incoming light is at an angle such that light is not reaching fiber 110 (described herein). As will be described in further detail below, array 405 may include a system for changing the angle of the attached lens (including lens 120) to maximize collection of incoming light. Thus, temperature sensors may be used for determining the angle of the incoming light, and thereby adjusting the angle of array 405.

Figure 7A:
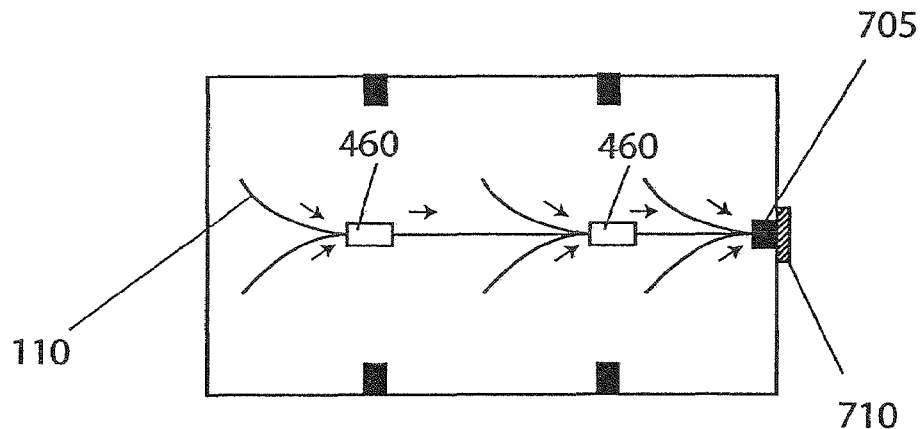
FIGS. 7A and 7B are diagrams showing, respectively, the middle section and the bottom panel of the lens array of FIGS. 4A and 4B.
Figure 7B:
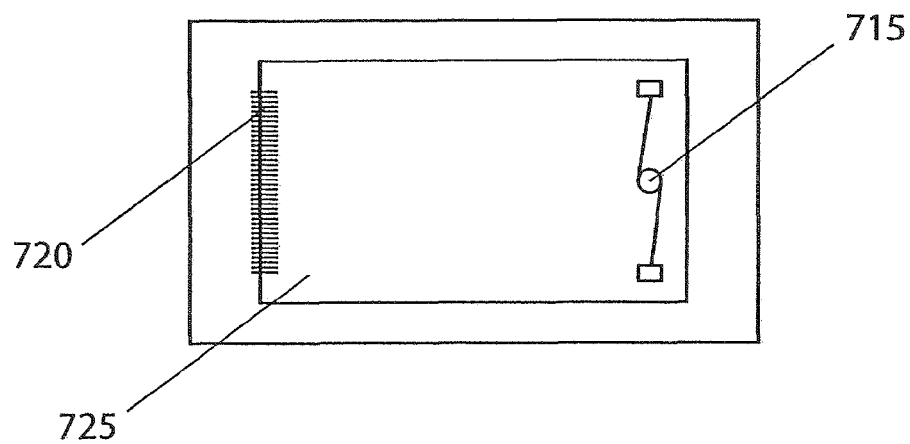

Referring back to FIGS. 4A and 4B, lens 120 is secured to array 405 where mating adapter 455 secures fiber 110 (described herein) to the target area at center point 210 of lens 120 (center point 210 and lens 120 are described herein) by engaging mating assembly 305 (described herein). Fiber guides 460 are disposed between top panel 410 and middle section 415 of array 405 for guiding fiber (110) along array 405. FIG. 7A illustrates the top view of middle section 415. As shown in FIG. 7A, fiber guides 460 guide fiber 110 to an array control 705 and a fiber control interface 710 for array 405. FIG. 7B shows bottom panel 420 where a locking mechanism 715 and a hinge 720 provide for opening and closing an access panel 725 and allowing access to the interior of array 405.

Figure 8:
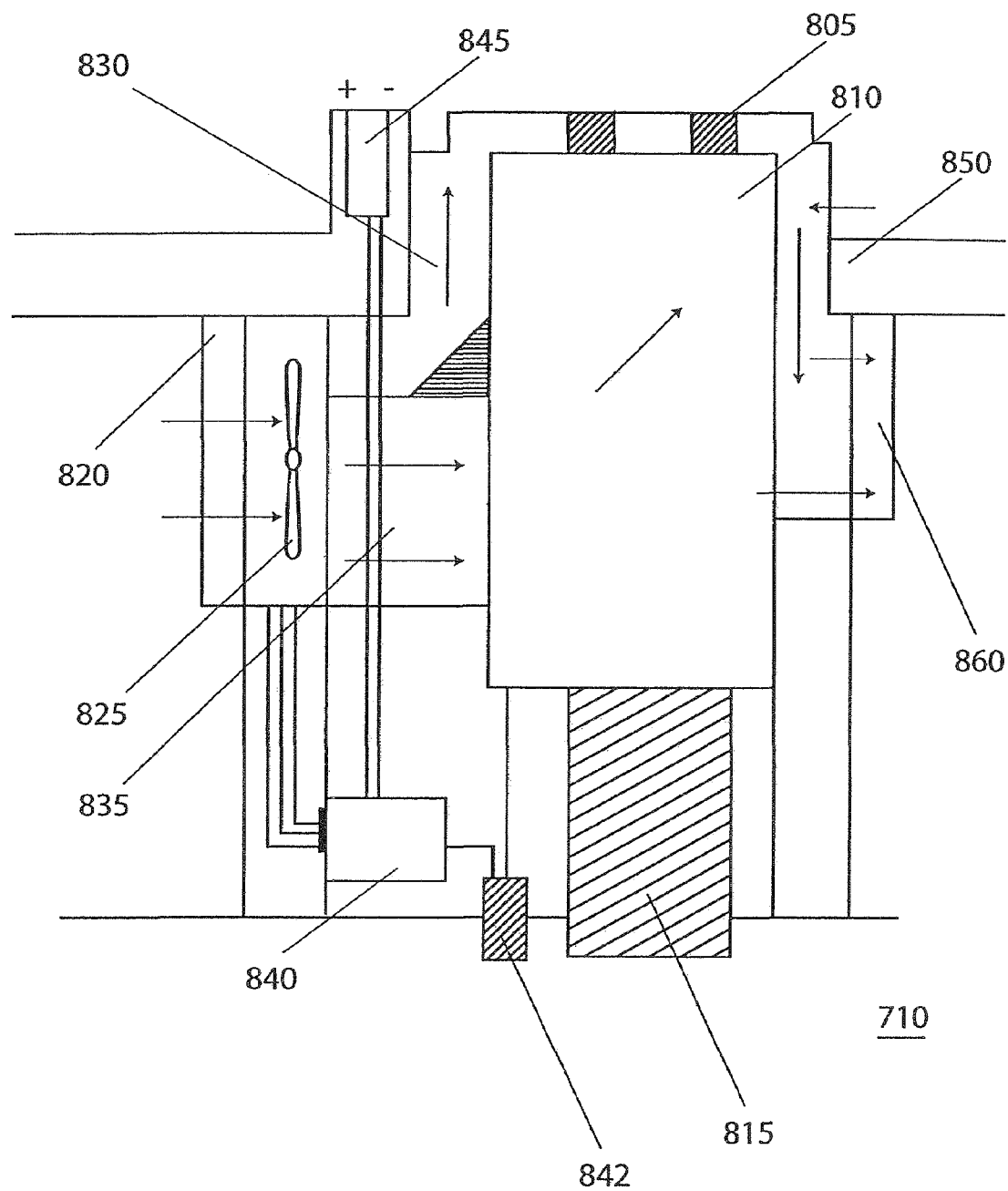
FIG. 8 is a diagram illustrating an interface for controlling the light energy output of a lens array in accordance with an embodiment of the invention.

FIG. 8 illustrates fiber control interface 710 for controlling the energy output of fiber (110) in accordance with an embodiment of the invention. As shown in FIG. 8, interface 710 may include a fiber input 805 where fibers from the lenses on array 405 (array 405 is described herein and includes fiber 110 from lens 120) are connected through a cut-off switch 810 to a fiber output 815, which may be connected to a power system, a lighting system, etc. As will be described in further detail below, cut-off switch 810 provides for turning on and off fiber output 815 according to an embodiment of the present invention. In other words, the light collected at array (405) may be turned on and off using cut-off switch 810.

Fiber control interface 710 may also includes a system for cooling array (405) and cut-off switch 810. As shown in FIG. 8, interface 710 may include an air intake 820 where cool exterior air is drawn in by a fan 825. The drawn-in air may be directed through an air bypass 830 to the interior of array (405) and through a master duct 835 to cut-off switch 810. Fan 825 may be controlled by a microprocessor 840, which may also control cut-off switch 810 through an electrical switch control 842. Microprocessor 840 may be powered by an electrical bus 845 connected to array (405). Electrical bus 845 may be connected to one or more solar cells (not shown)

in array (405) for converting solar energy to electrical power needed to power microprocessor 840, fan 825, cut-off switch 810, etc. Cut-off switch 810 may be connected to an array of thermal photo-voltaic ("TPV") cells 850 that can be an alternative source of power when array 405 is switched off. The heat exhaust from cooling array 405 and cut-off switch 810 may be passed out through a vent 860.

Figure 9:
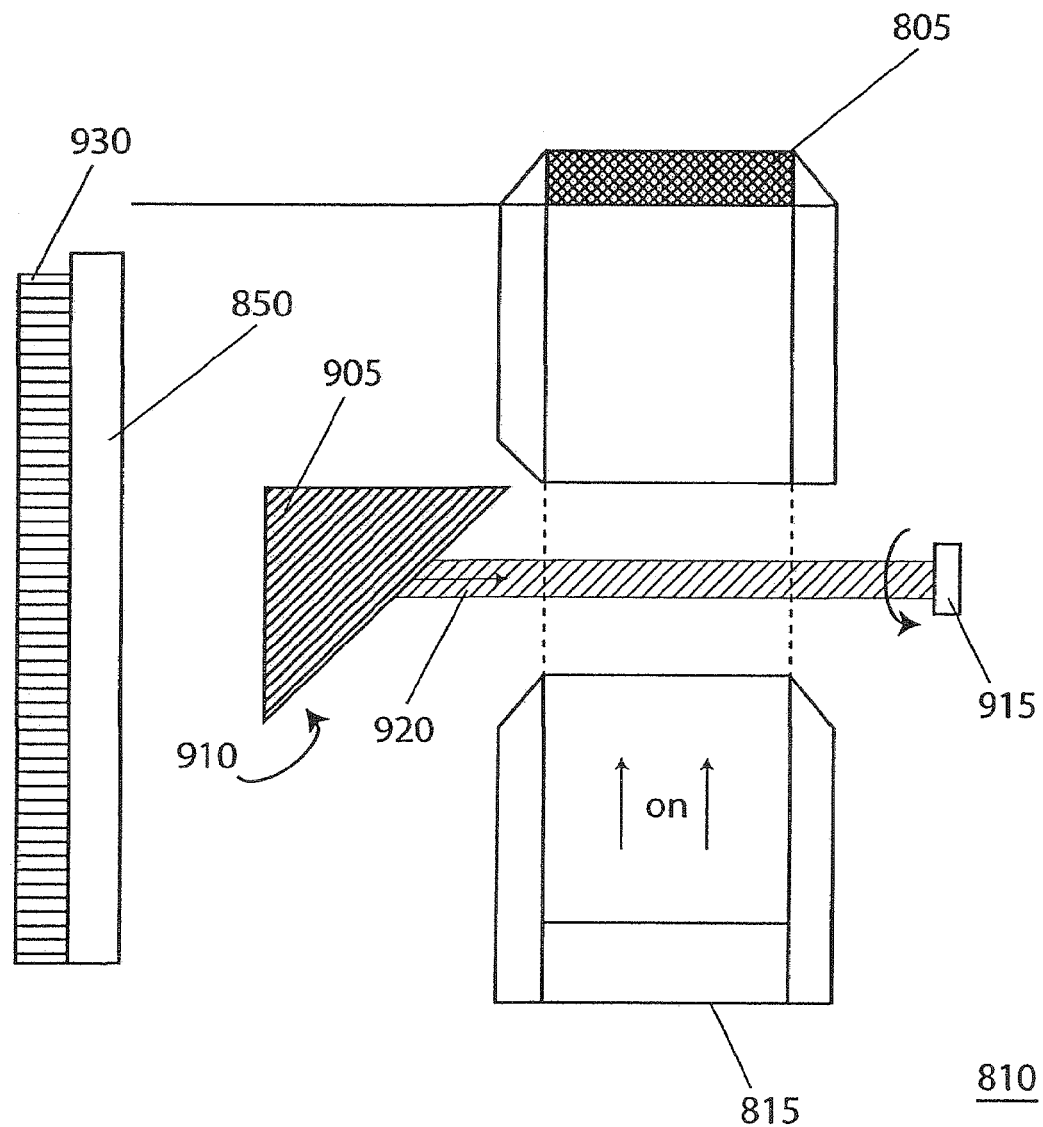
FIG. 9 shows a cutoff switch for use in the interface of FIG. 8 according to an embodiment of the invention.

FIG. 9 illustrates cut-off switch 810 in accordance with an embodiment of the invention. As shown in FIG. 9, cut-off switch 810 may include a prism 905. In accordance with an embodiment of the invention, prism 905 may include a reflective surface 910. FIG. 9 shows cut-off switch 810 in an "on" position where prism 905 is slid out of the path of the light passing through from fiber input 805 to fiber output 815. When cut-off switch is turned "off," microprocessor 840 (shown in FIG. 8) controls drive motor 915 to turn worm gear 920 to slide prism 905 into the path (or line of sight) between fiber input 805 and fiber output 815. As a result, prism 905 may deflect (by refraction and/or reflection) the collected light from array (405) onto TPV cells 850 where the energy may be converted and stored in a storage device (not shown), such as a battery and the like. TPV cells 850 may include a heat sink 930 to prevent overheating. It is noted that any type of energy absorbing cells (e.g., photo-voltaic cell) may be used to convert and store the light energy deflected by prism 905 when cut-off switch 810 is turned off. TPV cells 850 are preferred because they are effective in converting a full range of visible and infra-red lights and are also effective in converting heat energy, whereas other types of cells may have much lower tolerances for heat. Thermo Photovoltaic Systems are far more effective than existing systems because they utilize all frequencies of light, not just the visible spectrum.

TPV Systems offer unprecedented efficiency (200×) when compared to normal photovoltaic systems. Highly increased efficiency allows TPV module to be extremely portable and powerful. A TPV System converts all available wavelengths into electrical energy unlike PV systems, which only utilize select wavelengths. According to the Second Law of Thermodynamics, the entropy of a system and its environment always increases. All forms of light will be converted into heat and used by the TPV cells, thus allowing for generation of both light and electrical power. Furthermore, an alternative energy source (not shown), such as an integrated gas/oil burner, may complete the TPV system by providing infra-red, or heat, to TPV cells when solar energy is not available.

Figure 10:
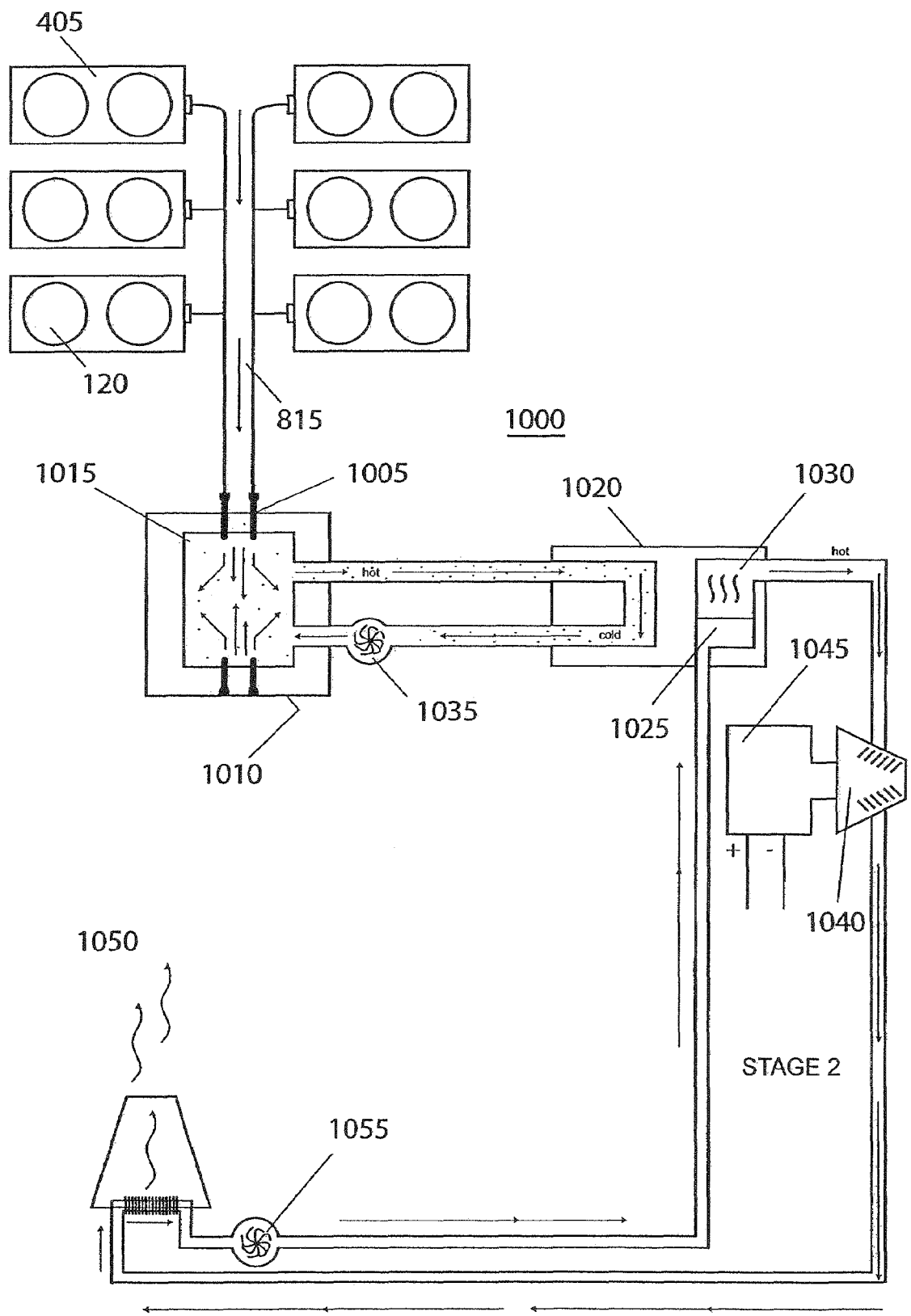
FIG. 10 illustrates a generator system powered by collector lens arrays in accordance with an embodiment of the invention.

When cut-off switch 810 is turned "on," the light collected at array 405 is passed through to fiber output 815. As illustrated in FIG. 10, fiber output 815 may be connected to a power generation system 1000. The light at fiber output 815 may be directed to beam dispersion inputs 1005 of a conversion chamber 1010. The light is, thus dispersed to a fluid-filled container 1015 in conversion chamber 1010. The fluid may be any type of heat conducting medium. Container 1015 may include reflective interior walls so that the light from beam dispersion inputs 1005 is reflected back into the fluid in container 1015. The fluid in container 1015 may include suspended particles of carbon that absorb the dispersed solar light. It is noted that the liquid may include any type of light absorbing media and is not limited to carbon particles. By absorbing the light, the carbon particles heat the fluid in conversion chamber 1010. The heated fluid is pumped to a heat exchanger 1020 where it is used to heat and boil water 1025 to create steam 1030. As a result, the fluid is cooled at heat exchange 1020, and pumped back into conversion chamber 1010 to be reheated. A pump 1035 may be used to pump the fluid between conversion chamber 1010 and heat exchanger 1020. Steam 1030 from heat exchanger 1020 is directed to and turns a steam turbine 1040 connected to a generator 1045. Power is thereby generated. The steam is then passed through a condenser 1050 where the exhaust heat from steam 1030 is recycled or expelled. The resulting water is pumped back to heat exchanger 1020 by a water pump 1055. The waste heat from cooling the steam in condenser 1050 may be directed to TPV cells 850 (shown in FIG. 8) for generating reserve power to be used when array 405 is unavailable or turned "off." (It is noted that water 1025 may be directly heated by a light absorbing medium, whereby collected light may be direct to said medium.)

With the arrangement described above, generator 1045 may be used as a reliable power source. In accordance with an embodiment of the invention, generator 1045 may be a stand alone power source for a home, an industrial level power source for servicing one or more industrial facilities, a commercial power plant, etc. A further advantage of power generation system 1000 is that it may be combined with any other types of power systems. For example, a traditional fossil fuel generator may be used to heat water 1025 or power generator 1045 in combination with power system 1000.

Figure 11:
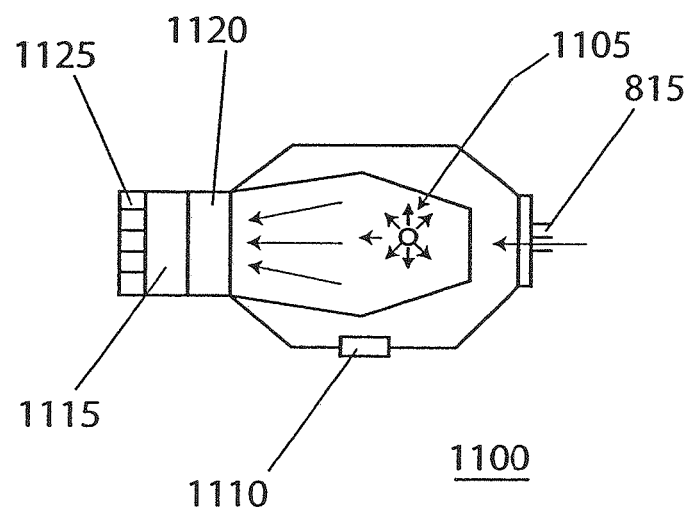
FIG. 11 shows the use of collected light and light from a secondary source for centralized lighting in accordance with an embodiment of the invention.

In accordance with an alternative embodiment of the invention, fiber output 815 from control interface 710 (as shown in FIG. 8 and described herein) may be connected to a central lighting beam control apparatus 1100, as shown in FIG. 11. Beam control apparatus 1100 may include a secondary light source 1105, which may be a high efficiency interior light source powered by an independent power source other than the power generation system of the present invention. For example, secondary light source 1105 may be a high intensity discharge xenon light, a fluorescent tube, a sodium vapor high-output light, a light emitting diode ("LED"), a halogen lamp (which may be boosted for color balance), a standard light bulb, etc. Thus, apparatus 1100 and light source 1105 are modular and replaceable. A microprocessor 1110 may be included to control an amount and/or characteristic (e.g., the color balance) of light at lighting output 1115 in accordance with lighting requirements by controlling a liquid crystal display ("LCD") 1120. A beamsplitter 1125 may be included to split the outputted light at lighting output 1115 to a number of lighting fixtures. Control may be based on user input and the amount and/or characteristic (e.g. color balance) of light available from fiber output 815. Accordingly, microprocessor 1110 may control the amount and/or characteristic (e.g., color balance) of light from fiber output 815 and secondary source 1115 outputted at lighting output 1115.

Figure 12:
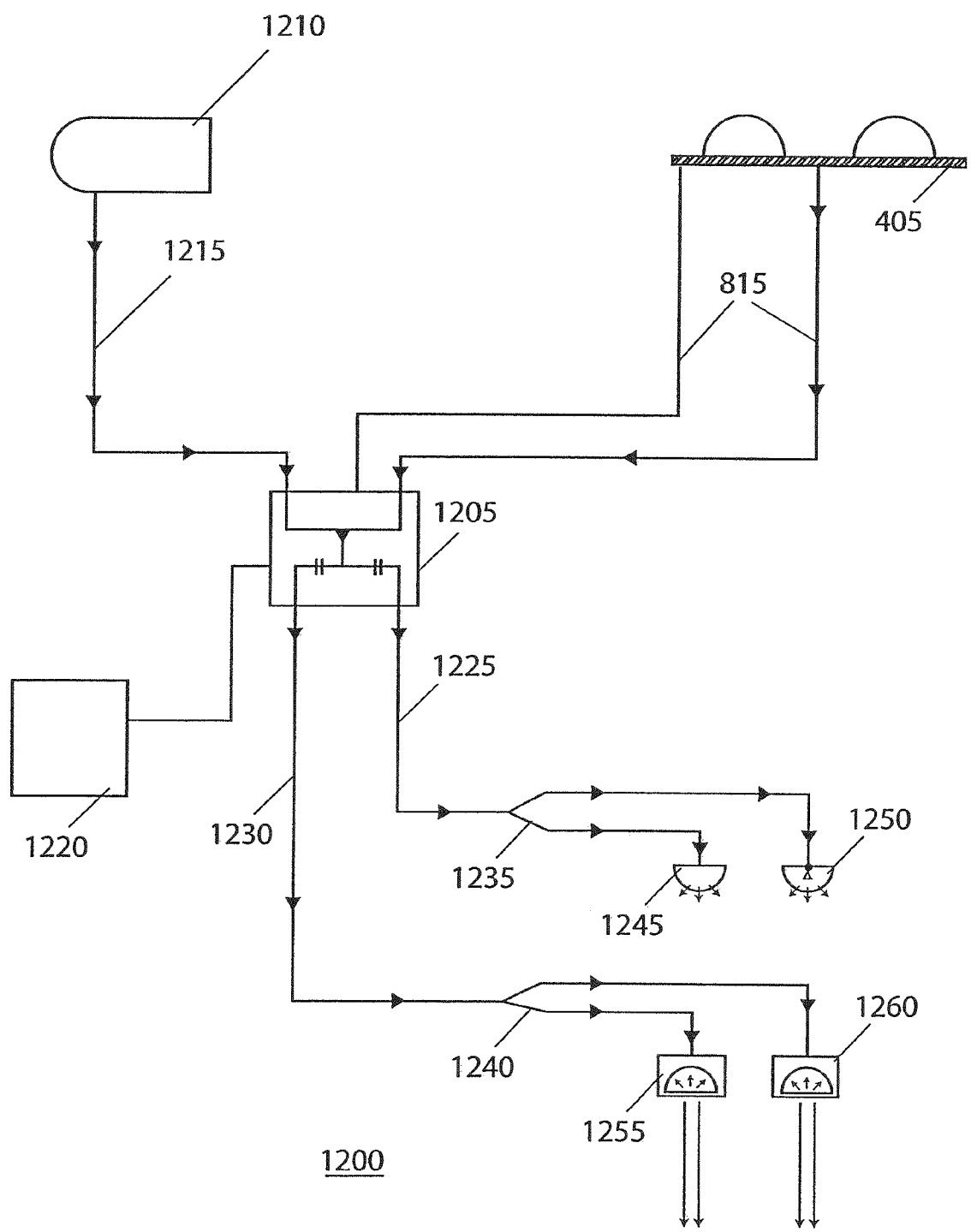
FIG. 12 illustrates a centralized lighting system in accordance with an embodiment of the invention.

Lighting output 1115 may be connected to a number of light fixtures for providing a centralized lighting source for these fixtures. FIG. 12 illustrates a centralized lighting system 1200 in accordance with an embodiment of the invention. As shown in FIG. 12, fiber output 815 from array 405 may be connected to a beam control switch 1205. With reference to FIG. 8, electrical control 842 may also be connected to beam control switch 1205. Accordingly, the light output from array 405 may be controlled via electrical control 842 by turning cut-off switch 810 on and off. An alternative source apparatus 1210, which will be described in further detail below, may also be connected to beam control switch 1205 via one or more optical fibers 1215. Beam control switch 1205 may be controlled using a master switch 1220. Thus, according to user input at master switch 1220, beam control switch 1205 may control the respective amounts of light from array 405 and alternative source apparatus 1210 to be switched to outputs 1225 and 1230 of beam control switch 1205. Outputs 1225 and 1230 are connected to beamsplitters 1235 and 1240, respectively, for providing light to fixtures 1245, 1250, 1255, and 1260. Fixtures 1245, 1250, 1255, and 1260 may be any type of lighting fixtures for flood and/or spot lighting. As will be described in further detail below, one or more of lighting fixtures 1245, 1250, 1255, and 1260 may include feedback to beam control switch 1205 for providing information on the amount of light being outputted at respective fixtures. Based on the feedback information, beam control switch 1205 may appropriately adjust the amount of light outputted at outputs 1225 and 1230.

Figure 13:
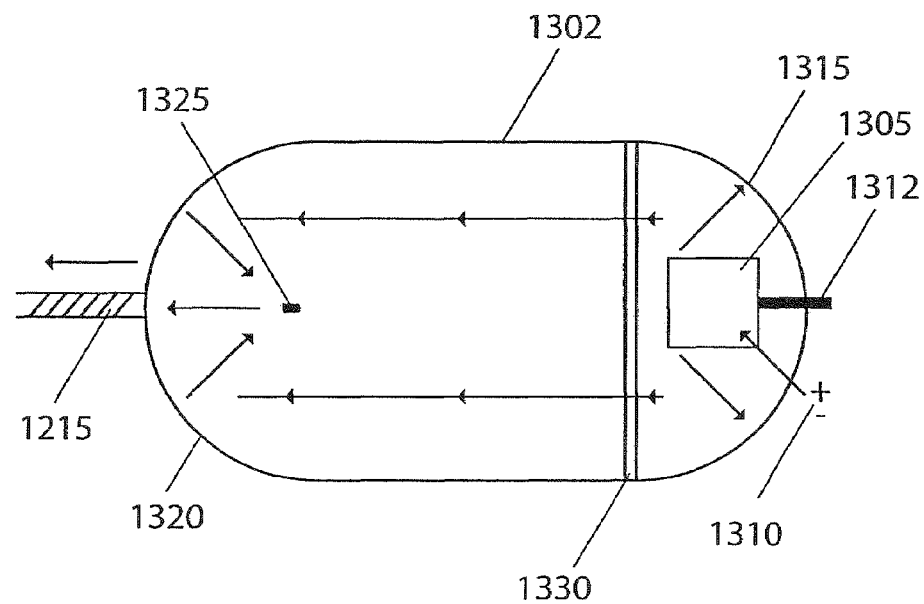
FIG. 13 shows a multi-source lighting device according to the embodiment of the invention.

FIG. 13 illustrates alternative source apparatus 1210 in accordance with an embodiment of the invention. As shown in FIG. 13, alternative source apparatus 1210 may be formed by a tube 1302 that includes a light source 1305, which may be powered by an external source 1310, such as conventional utility power. Tube 1302 may include a reflective inner surface. Light source 1305 may be a high intensity discharge xenon light, a fluorescent tube, a sodium vapor high-output light, a light emitting diode ("LED"), a halogen lamp (which may be boosted for color balance), a standard light bulb, etc. A heat conductor 1312 may be connected to light source 1305 to prevent overheating. In accordance with an embodiment of the invention, heat conductor 1312 may direct the heat from light source 1305 to TPV cells 850 (shown in FIG. 8) for storing the energy. Alternative source apparatus 1210 may further include a headlight-like reflector 1315 for reflecting the light from light source 1305 to form a parallel beam across tube 1302. On the opposite end of tube 1302, a dish-type collector 1320 reflects the beam from reflector 1315 to a focal point reflector 1325, where the focused reflection is directed to an output to fiber 1215. An attachment mechanism, e.g., screw threads, 1330 may be included for easy detachment of reflector 1315 from tube 1302 so that light source 1305 may be replaced with ease. As shown in FIG. 12, fiber 1215 is connected to beam control switch 1205.

Figure 14:
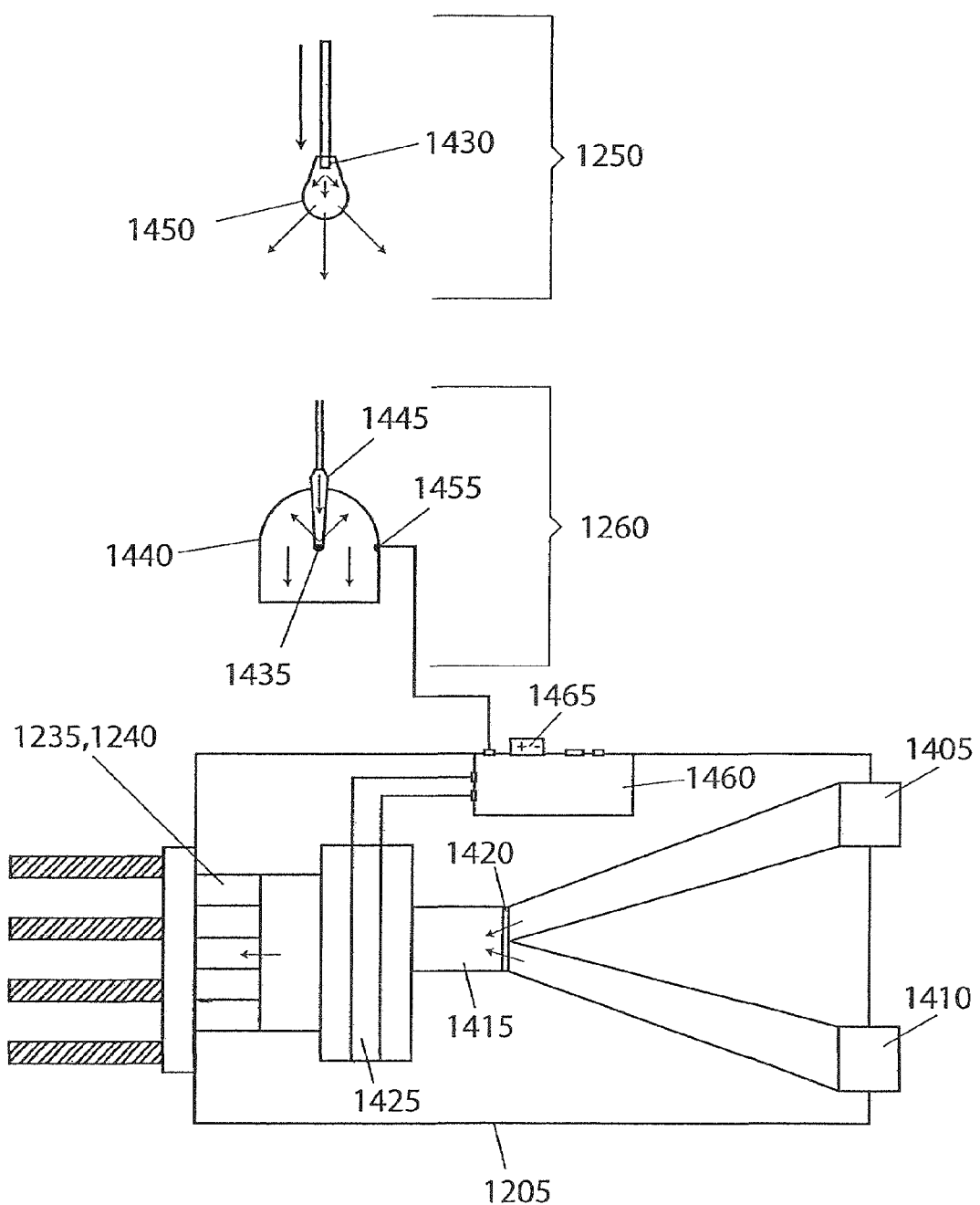
FIG. 14 illustrates the beam control and light fixtures for use in the system of FIG. 12 or the fixture of FIG. 22 in accordance with respective embodiments of the invention.

Beam control switch 1205 according to an embodiment of the invention will now be described in detail. As shown in FIG. 14, beam control switch 1205 includes an input 1405 from fiber output (815) (i.e., array 405) and an input 1410 from fiber output 1215 (i.e., alternative source apparatus). The light received at inputs 1405 and 1410 are combined to a thick fiber 1415. A one-way reflecting or semi-reflecting coating 1420 may be disposed at the input of thick fiber 1415 to prevent light from leaking back to inputs 1405 and 1410. An "LCD" 1425 may be disposed at thick fiber 1415 to provide red, green, and blue light filtering for color correction of light, dimming of fixtures, and brightness control. The light passing through LCD 1425 enters beamsplitter 1235 and/or 1240 where it is split to a number of output fibers leading to respective lighting fixtures, as shown in FIG. 12. Fixtures 1250 and 1260 are also illustrated in FIG. 14. As shown in FIG. 14, fixture 1250 may be a flood light having spherical geometry for eliminating chromatic aberration, and made with highly refractive material to ensure maximum dispersion. Fixture 1250 may further include a reflective (e.g., silver) inner coating for maximum light projection. An LED or Organic Light Emitting Diode ("OLED") 1430 may be mounted at the periphery of fixture 1250 to provide night time and/or low level illumination. LED or OLED 1430 may be independently powered or powered by the system of the present invention. As shown in FIG. 14, fixture 1260 may be a spot light having reflectors 1435 and 1440. Fixture 1260 may also include an LED or OLED 1445 for night time and/or low level illumination. Fixtures 1250 and 1260 may each also include a photosensor 1450 and 1455, respectively, for measuring the light outputted. Since beamsplitter 1235/1240 disperses light evenly to its connected fixtures, only one photosensor 1450/1455 may be needed for each group of fixtures (e.g., 1245 and 1250, or 1255 and 1260). Light measurement data is forwarded back to a microprocessor 1460 of beam control switch 1205. Based on the light measurement data received from various photosensors (1450/1455), microprocessor 1460 controls LCD 1425 and secondary (internal) source 1210 (as shown in FIG. 12) to control the amount and property of light provided to the corresponding fixtures (1245 and 1250/1255 and 1260). Microprocessor 1460 may be powered by collectors (405) and/or a secondary power source 1465.

The central lighting systems illustrated by FIGS. 11 to 14 may be used in any residential, commercial, or industrial systems. Increased benefits of such central lighting systems include: less bulky, easier to change lights, reflects bad light waves, safer (reduces the amount of electrical wiring in a building, reducing risk from a short circuit), power saver. Infrared radiation is absorbed to produce energy, instead of being reflected or absorbed as waste and heat. Visible light is directed and used as lighting.

Furthermore, systems 1100 and 1200 may be used to generate power as well as light. Systems 1100 and 1200 are modular allowing easy installation, removal and maintenance. The modular light capture chambers (e.g., 1210) allows light sources (e.g., 1305) to be located in a convenient location instead of difficult to reach fixtures. Light Capture chambers (e.g. 1240) redirect all the light, through the bundled fiber optic cable (e.g., 1215), to any desired location. Existing systems use shades, lamp covers or fixtures to obtain the desired brightness and direction. These older systems allow for much waste compared to systems 1100 and 1200 according to the respective embodiments of the invention.

As mentioned before, the light collection methods and apparatuses of the present invention make use of sunlight as a renewable natural resource that can generate energy for large-scale operations, such as power plants, on a more efficient and less waste producing method than currently used solar thermal systems. Collector arrays (405) are highly scalable and modular. Minimizing maintenance and expansion costs. Large numbers of collector arrays (405) channel solar energy, via fiber optics (110), to a conversion chamber (1010, FIG. 10). Conversion chamber (1010) may be filled with conductive heat absorbing liquid with light absorbing media (i.e., oil with suspended carbon powder). This concentrates the greatest amount of energy in the smallest amount of space and minimizes loss through insulation. This heated fluid is then pumped though a heat exchanger (1020) that boils water. The resulting steam is used to drive a turbine (1040) and produce electricity. The amount of piping used is kept to a minimum and not strewn about the entire facility. There is substantial savings in maintenance and far less piping, thus minimizing energy losses. As mentioned before, the water may be heated directly by light absorbing media.

Solar Furnaces may also utilize large-scale mirrors that are focused onto a single point. They are not scalable and quickly reach a maximum number of mirrors, after which any increase in the number of mirrors will have limited benefit. These "mirror furnaces" require a high level of maintenance with mechanical tracking systems and highly polished mirrors. Parabolic Solar concentrators suffer from the same problems as mirror furnaces, although not as pronounced. However, parabolic systems are not nearly as efficient as mirror furnaces because of energy loss through piping. Piping is very failure prone due to thermal expansion and contraction. Flat Solar Concentrators as exhibited in U.S. Pat. No. 4,078,548 Kapany require large amounts of insulation and are not efficient enough for large-scale operations. They are typically used as pool water heaters and solar water heaters. They also suffer from piping problems. Freezing temperatures can also rupture these pipes. Furthermore, phase changes in systems of the present invention result in increased efficiency (e.g., when water in the piping reaches boiling point, the steam is substantially more efficient in turning turbine 1040).

Figure 15A:
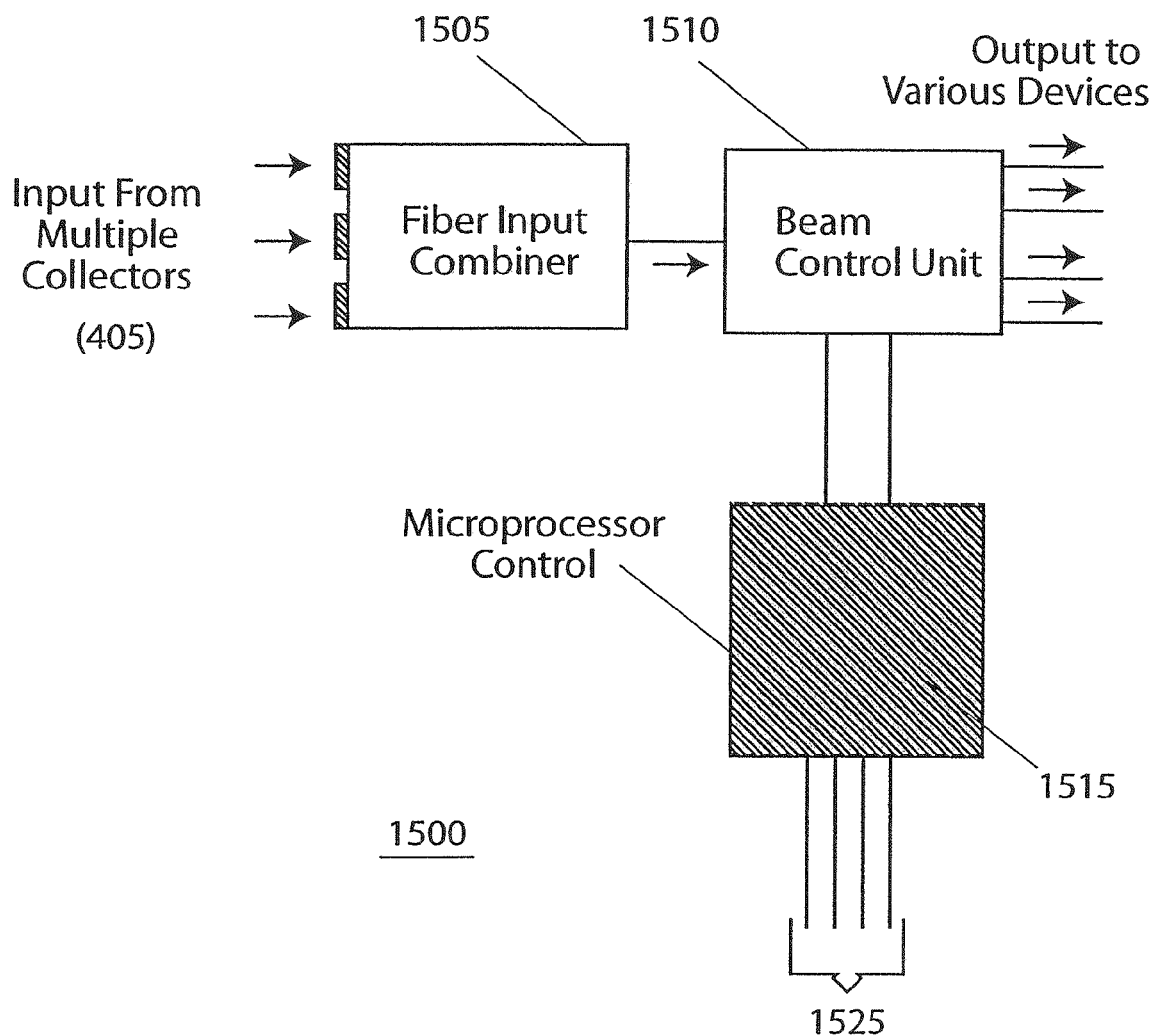
FIGS. 15A and 15B are diagrams showing a light distribution apparatus and a light combiner, respectively, according to an embodiment of the invention.
Figure 15B:
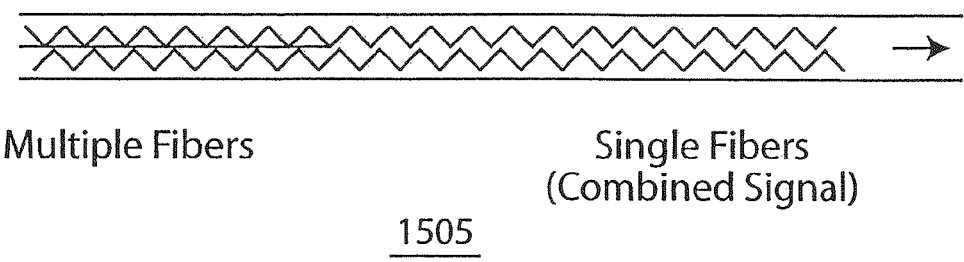

Given the scalability of the light collection methods and apparatuses of the present invention, there may be a need for a light control distribution system to allow for more efficient routing and distribution of light in a large scale system. FIG. 15A illustrates a control distribution system 1500 including a fiber input combiner 1505 for combining a number of fibers from respective light collectors/arrays (405) into an output for beam control unit 1510. Beam control unit 1510 may be controlled by a microprocessor 1515 that includes a number of data inputs 1525 for setting control parameters for controlling the amount, characteristics, etc., of light outputted to respective devices by beam control unit 1510. As shown in FIG. 15B, fiber input combiner 1505 may simply be multiple fibers combining into a single fiber where the light, or "signals," of the respective multiple fibers are combined into the single fiber. As a result of such combinations, energy density per fiber may be increased while reducing the number of fibers per bundle needed. Other methods of combining fibers may also be used (e.g., thick fiber 1415 in beam control as shown in FIG. 14).

An electrical power generator (1000, shown in FIG. 10) and a centralized lighting system (1100 and 1200, shown in FIGS. 11 and 12) in accordance with respective embodiments of the invention have been described thus far. However, the light collection methods of the present invention are not limited to these embodiments and may be implemented in a wide variety of applications. In other words, arrays (405) of light collection units, or lenses, (120) may be connected to many different types of systems other than electrical system 1000 and lighting systems 1100 and 1200 for different uses of the collected light. A number of exemplary embodiments of the present invention will now be described.

In accordance with an embodiment of the invention, light may be channeled into a light absorbing medium, e.g. a carbon substrate, which becomes heated. Such a system can be used in conjunction with existing household/industrial furnaces and space heaters, reducing load on existing systems. Modified version of the solar thermal generator can be used to boil water, reducing load on existing water heaters.

Figure 16:
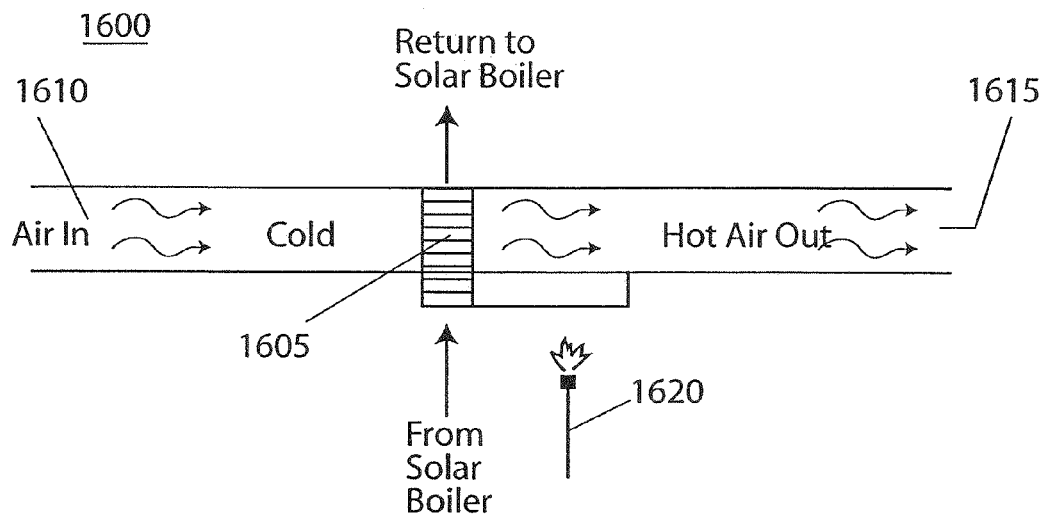
FIGS. 16, 17, 18, and 19 illustrate heating devices in accordance with respective embodiments of the invention.

FIG. 16 illustrates a heater 1600 utilizing light collected using one or more arrays (405) of light collection units (120). As shown in FIG. 16, heater 1600 may include a water/air heat exchanger 1605 for transferring heat from water to air. Water from a solar boiler (not shown) that is heated using collected light may be exposed to cool air drawn in from an intake 1610 at water/air heat exchanger 1605. Water/air heat exchanger 1605 may simply be a length of heat conducting water pipe(s) for exposing and transferring the heat from the water within to the surrounding air, thus producing heated air at an air output 1615. Water outputted from water/air heat exchanger 1605 may be returned to the solar boiler (not shown) for reheating. A gas burner 1620 may be used as a secondary system for heating the water in water/air heat exchanger 1605 and/or the air at output 1615 directly. As an example, water/air heat exchanger 1605 may be realized using condenser 1050 of electrical power system 1000 shown in FIG. 10 (where steam chamber 1020 is the input source of heated water). Heater 1600 shown in FIG. 16 may be used as a centralized heating system for a home, a commercial or industrial building, etc. It may also be implemented in a standalone heating apparatus, such as a dryer, a heater, a cooker, etc. where heated air is used.

Figure 17:
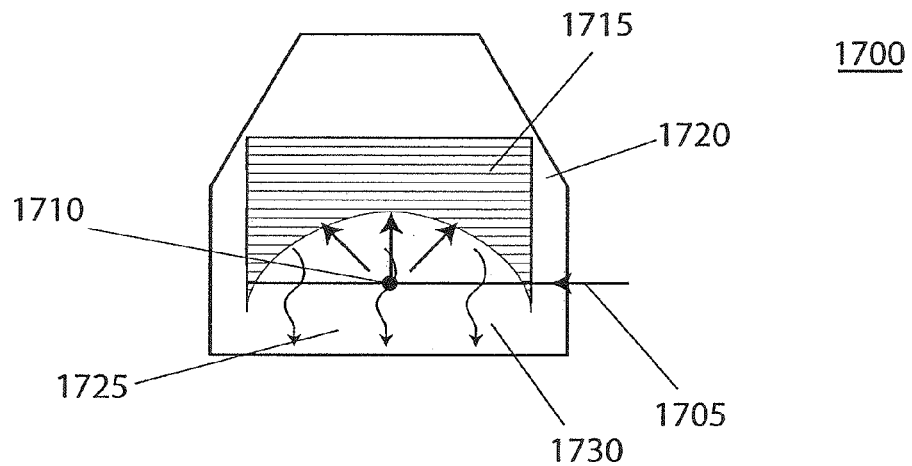

FIG. 17 illustrates a solar oven 1700 in accordance with an embodiment of the invention. As shown in FIG. 17, solar oven 1700 may include a fiber input 1705 and a dispersion lens 1710, where the collected light, for example, from array 405 is dispersed to a light absorbing medium, e.g., carbon/ceramic substrate (which is non-reflective, in contrast to a lighting fixture) 1715 for absorbing the light dispersed from dispersion lens 1710. Substrate 1715 may be enclosed in an outer insulation 1720 for preventing heat from escaping. A safety cover 1725 may be provided for preventing injury by direct contact. Thus, radiant heat 1730 from substrate 1715 may be effective in heating an oven chamber (not shown). Solar oven 1700 may be a standalone apparatus relying upon solar energy, or it may be integrated to a gas or electrical oven to form a hybrid having multiple energy sources. In addition, oven temperature may be controlled by adjusting the amount and characteristic of light at input 1705 and/or adjusting one or more such alternative energy sources.

Figure 18:
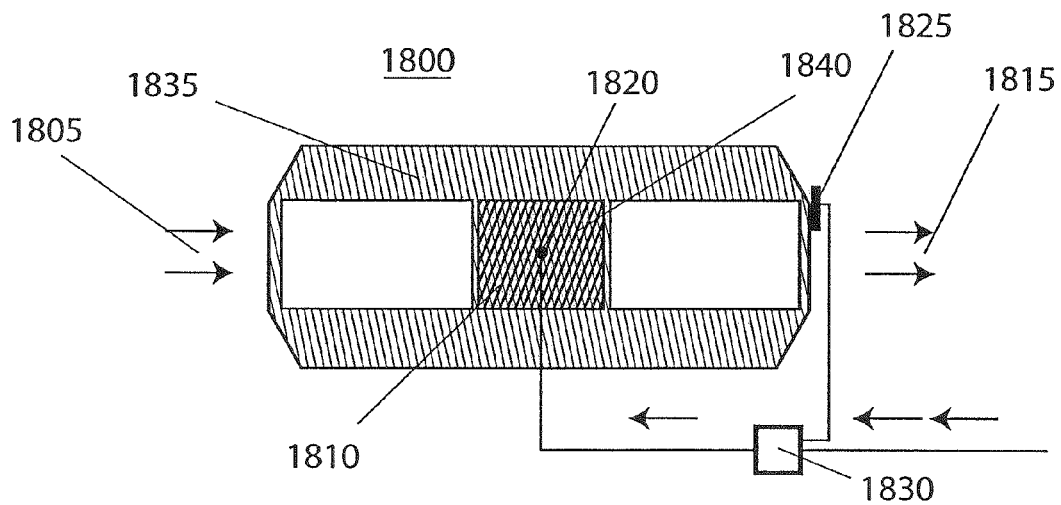

FIG. 18 shows a water heater (furnace or boiler) 1800 in accordance with an embodiment of the invention. As illustrated in FIG. 18, water heater 1800 includes a cold water intake 1805 where cold water is directed through a heating chamber 1810 to a hot water output 1815. Heating chamber 1810 may include carbon pellets and/or any other suitable type(s) of substrate for absorbing light dispersed by dispersion lens 1820. The pellets (or substrate) in heating chamber 1810 thus, heats the water from intake and the heated water is outputted at output 1815. A temperature sensor 1825 may be included at output 1815 for providing a feedback signal to a temperature controller 1830 for controlling the amount and characteristic of light used for heating chamber 1810. Insulation 1835 may be used to prevent heat from escaping heating chamber 1810. Filter screens 1840 may be used to contain the carbon pellets (or substrate), thus, forming heating chamber 1810.

Figure 19:
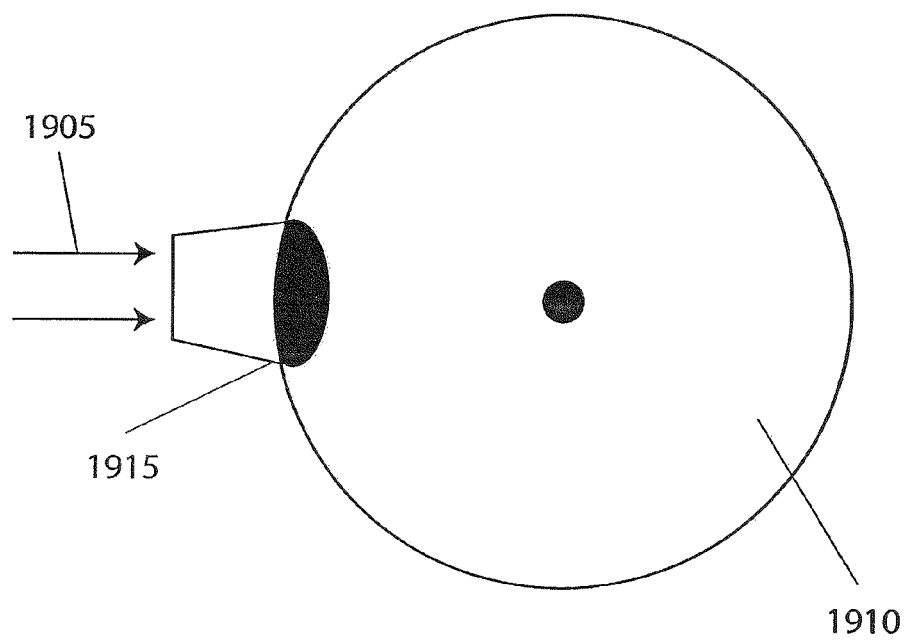

Next, a high-temperature solar furnace is described with reference to FIG. 19. As shown in FIG. 19, one or more fibers carrying high-intensity collected light may be connected to an input 1905 of a spherical reflective furnace chamber 1910 with a semi-silver dispersion lens 1915 disposed at input 1905 for dispersing the collected light into fturnace chamber 1910. Extremely high temperatures may be achieved by inputting high-intensity collected light into such a reflective furnace chamber 1910. Consequently, such furnace chamber 1910 may be used for any high-temperature application, such as disposing of waste, smelting ore, etc.

Figure 20A:
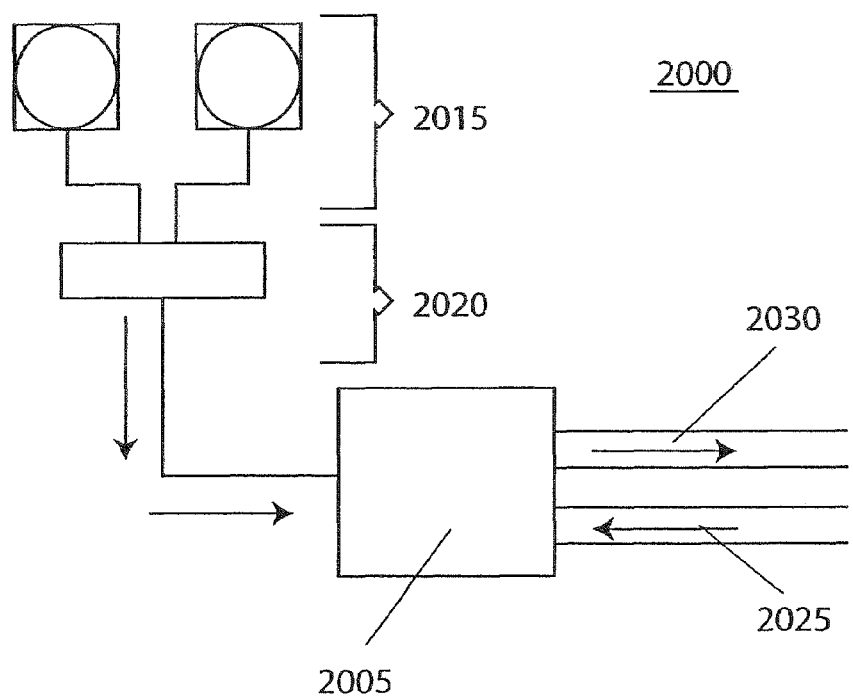
FIGS. 20A and 20B show a large-scale distiller and a small-scale distiller, respectively, according to an embodiment of the invention.
Figure 20B:
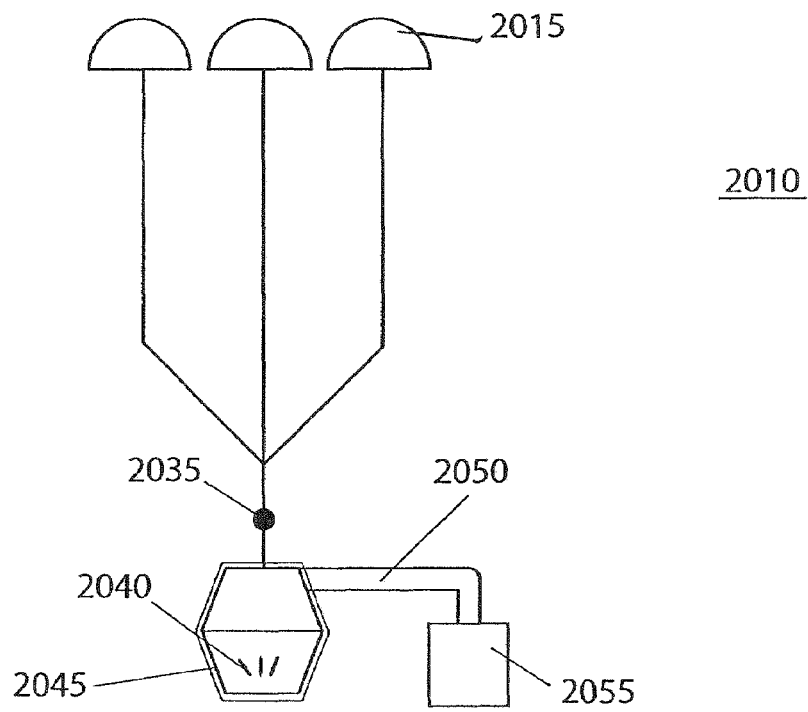

As a variation of solar furnace 1910 shown in FIG. 19, collector arrays (405) may be connected to a boiler 2005 to form a solar distiller/desalination apparatus 2000, as illustrated in FIGS. 20A and 20B. FIG. 20A shows a large-scale distiller 2000, and FIG. 20B illustrates a smaller-scale (e.g., household) distiller 2010 for providing drinking water.

As shown in FIG. 20A, collector arrays 2015 are connected to a power distribution system 2020. Collector arrays 2015 and power distribution system 2000 may be similar to those of the previously described embodiments (e.g., 405, and 710, respectively) of the present invention. The power outputted from power distribution system 2020 may heat boiler 2005 having a water input (which may include any type of water source, e.g., salt water for desalination) 2025 where steam so generated is directed to a distiller. In accordance with the present invention, condenser 1050 shown in FIG. 10 may also form a distiller via an output 2030. For using condenser 1050 in FIG. 10 as a distiller, instead of using the closed steam-water loop shown in FIG. 10, distilled water may be condensed from the excess steam from turning turbine 1040 and outputted for use, and an external water source (not shown) may be used to supply steam chamber 1020.

Referring now to FIG. 20B, collector arrays 2015 may be connected to an on/off switch 2035, which may be similar to cut-off switch 810 shown in FIG. 9. The output of on/off switch 2035 may be connected to an insulated canister 2040 with reflective interior walls that can be opened and closed for supplying water thereto. Canister 2040 may contain carbon pellets or the like (any light absorbing substrate) 2045 for absorbing the collected light from arrays 2015 and heating water to generate steam. The steam from canister 2040 may, then, be directed to a condenser 2050 and then, a clean water reservoir 2055.

Figure 21:
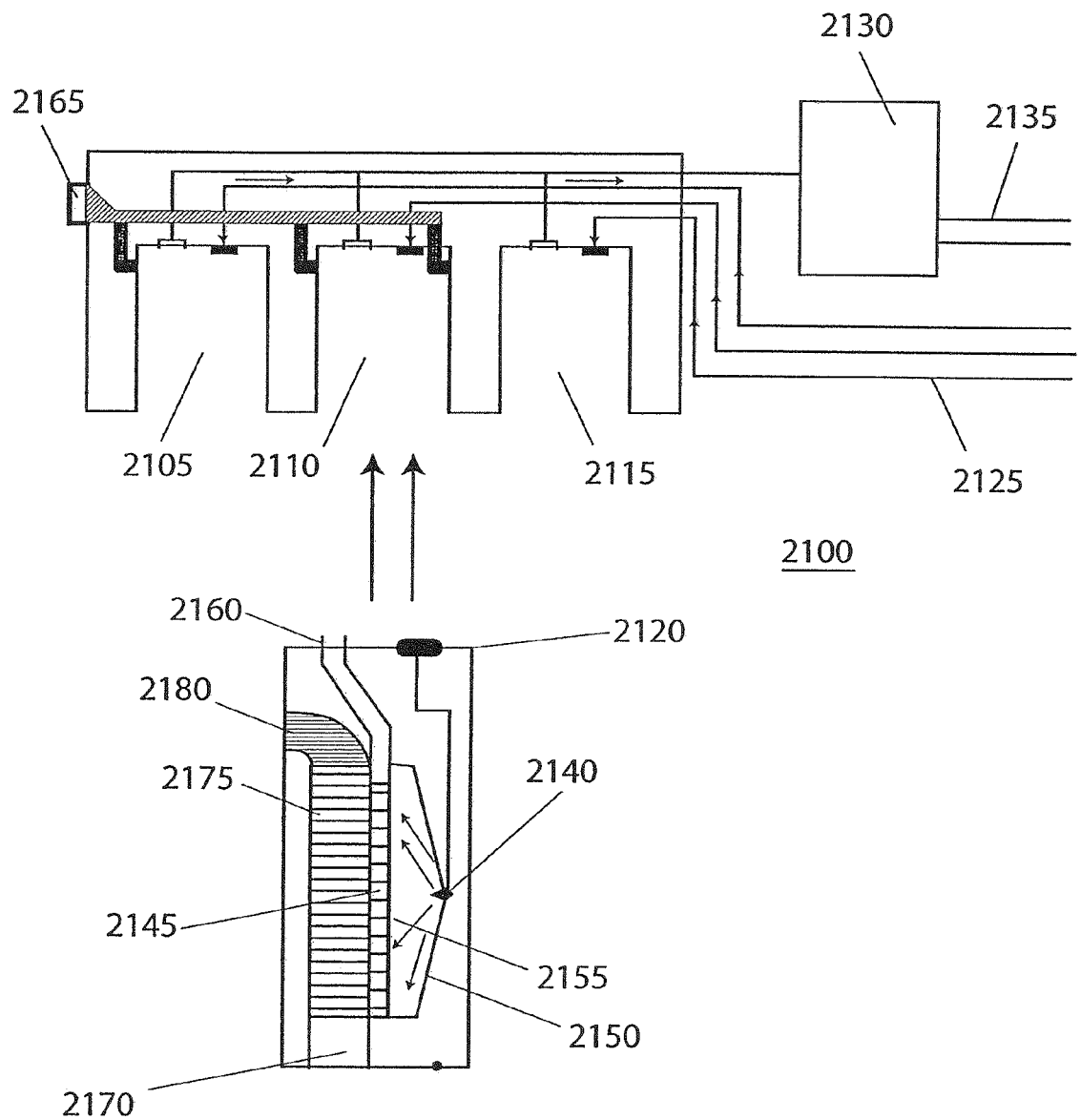
FIG. 21 illustrates an electricity generator in accordance with an embodiment of the invention.

In accordance with yet another embodiment of the invention, TPV power modules may be used for electrical power generation. As shown in FIG. 21, a TPV power generation system 2100 may include a number of slots 2105, 2110, and 2115 for housing a TPV power module 2120. Each TPV power module 2120 connected to respective slots 2105, 2110, and 2115 may convert collected light from fiber inputs 2125 into electrical energy, which is then outputted to a power inverter 2130. Power inverter 2130 may, then, convert the Direct Current (DC) power from the TPV power modules (2120) into Alternating Current (AC) output power 2135. TPV power module 2120 may operate in a manner similar to cut-off switch 810 shown in FIG. 9 in the "off" position. As shown in FIG. 21, TPV power module 2120 may include a dispersion prism 2140 for dispersing input light onto TPV cells 2145. A reflective layer may be disposed on the back surface of prism 2140 for preventing light from escaping and reflecting substantially all light onto TPV cells 2145. A carbon (or another type) substrate 2155 may be disposed adjacent TPV cells 2145 for absorbing any remaining spectra of light and radiating the resulting heat onto TPV cells 2145. The energy received by TPV cells 2145 may, thus, be converted into DC electrical power, which is outputted to power inverter 2130 via output 2160. An exhaust fan 2165 may be used to draw cool air in from air input 2170 through heat sink 2175 to air output 2180 for cooling TPV cells 2145 and for preventing overheating. TPV power modules (2120) may be large-sized modules for industrial and large-scale commercial applications. TPV power (2120) modules may also be portable, powerful and cost effective, for residential and/or small-scale commercial use. As noted herein, TPV cells are approximately 200 times more efficient than standard PVs and convert substantially all wavelengths into electrical energy. Thus, the use of TPV power modules (2120) in TPV power generation system 2120 may be one alternative to power system 1000 shown in FIG. 10. Although, as mentioned, herein, while TPV cells are extremely expensive, their increased efficiency can usually justify the increase in cost. TPV modules are scaleable to virtually any application (i.e., Kilowatt, Megawatt). As mentioned herein, an alternative energy source (not shown), such as an integrated gas/oil burner, may complete TPV system 2100 by providing infra-red, or heat, to TPV cells 2145 when sufficient solar energy is not available.

Solar energy, or light energy, or light collection in accordance with the present invention may also be accomplished using a large number of collection lenses dispersed across a wide area on fixtures, such as street lamps, for power generation. Such a system may be implemented with relative convenience because fixtures such as street lamps are already connected to a collection facility via existing infrastructure.

Figure 22:
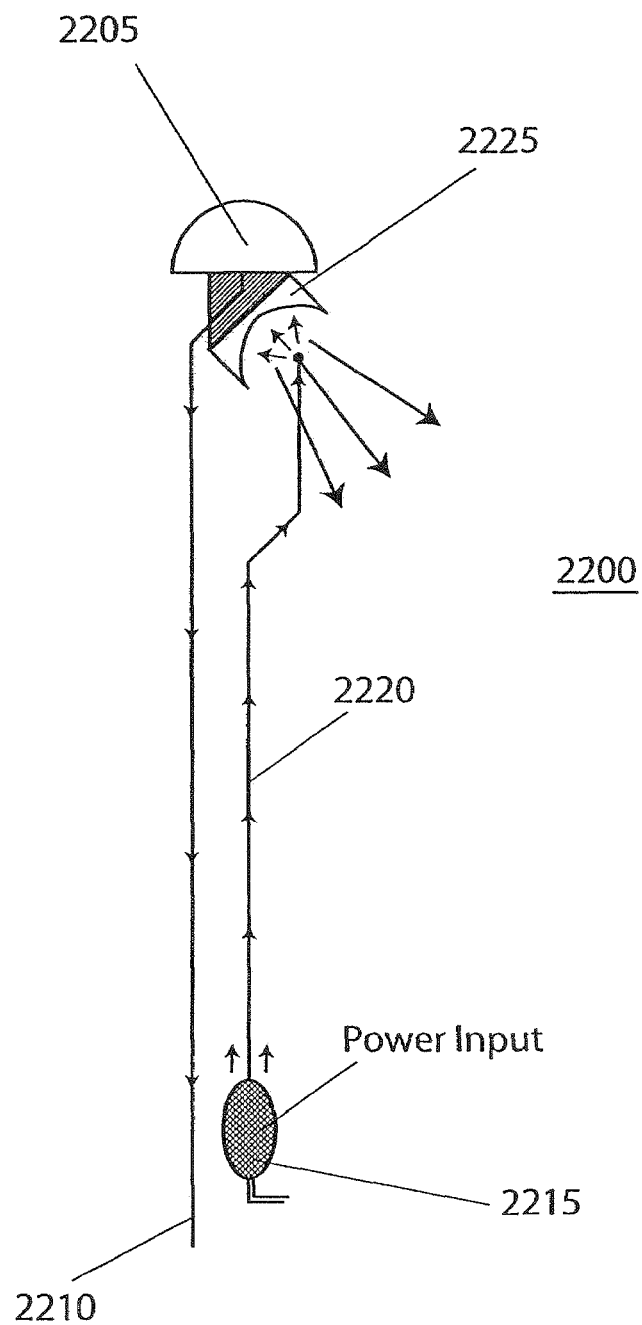
FIG. 22 is a diagram showing a street lamp fixture according to an embodiment of the invention.

As illustrated in FIG. 22, a street lamp 2200 may include one or more collection lens(es) 2205 with a fiber output 2210 to a power converter and controller (not shown), which may be a centralized or regional controller. Collection lens(es) 2205 may be similar to lens 120 as shown in FIG. 2. Thus, lens(es) 2205 may also be similar to array 405 and the like.

Light energy may be converted to electrical power in accordance with the present invention whereupon it is directed to a collection chamber 2215. Collection chamber 2215 may be realized using source 1210 of FIG. 13 or source 1100 of FIG. 11 where light from a light source (e.g., a lamp or light bulb) may be focused into a fiber 2220 and directed to a light fixture 2225 of street lamp 2200. Advantageously, the light source (e.g., lamp or light bulb) in collection chamber 2215 is located at the base of street lamp 2200, and maintenance is eased substantially (i.e., a light bulb can be changed at the base of street lamp 2200). Street lamp 2200 according to the present invention may also improve safety because collection lens 2205 and light fixture 2225 may be made from relatively lightweight material. Thus, a heavy solid structure is no longer needed to support a large lighting fixture at the top of street lamp 2200.

Figure 23:
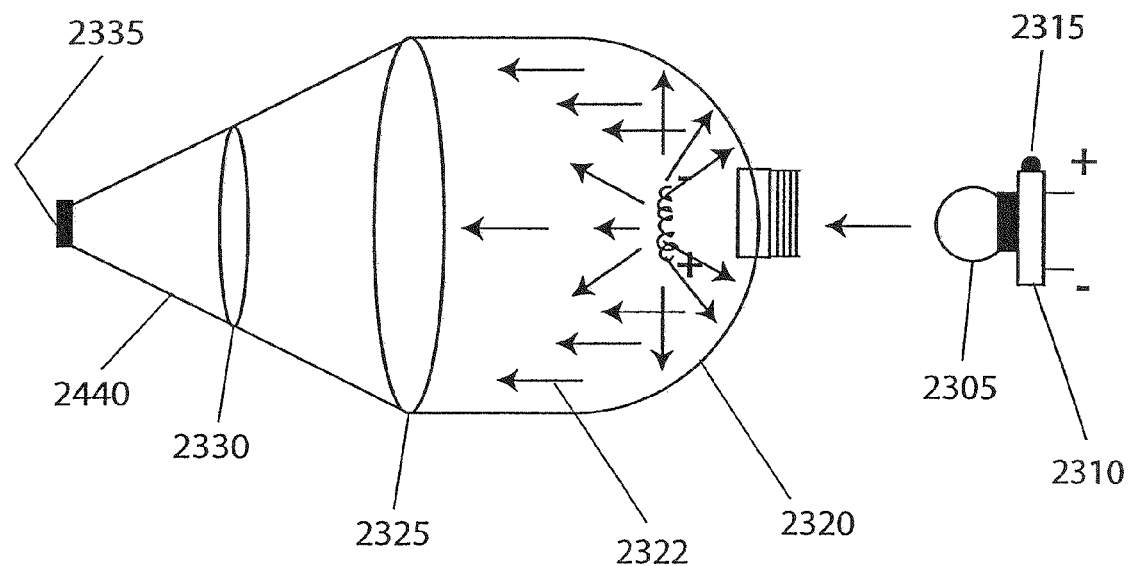
FIG. 23 shows a light source device for use in the system of FIG. 12 or the fixture of FIG. 22 in accordance with respective embodiments of the invention.

As described herein, collection chamber 2215 may be realized using source 1210 of FIG. 13 or source 1100 of FIG. 11. Alternatively, FIG. 23 illustrates collection chamber 2215 in accordance with an embodiment of the invention. A light source (e.g., light bulb) 2305 may be mounted onto a detachable fixture 2310 that may be affixed to collection chamber 2215. Fixture 2310 may include an external LED 2315 for indicating a failure of light source (light bulb) 2305 and, thus, signaling for maintenance. With fixture 2310 being affixed to collection chamber 2215, light source 2305 may be mounted at a center point of a focusing reflector 2320 for reflecting parallel beams of light 2322 from light source 2305. Collection chamber 2215 may include a primary lens 2325, and may further include a secondary lens 2330 for focusing the parallel beams of light 2322 from focusing reflector 2320 into a fiber interface 2335. A teardrop-shaped reflector 2340 may be disposed around primary lens 2325 and/or secondary lens 2330 to collect ambient (or scattered) light into fiber interface 2335.

As described herein, collection chamber 2215 may utilize, for example, source 1210 of FIG. 13 or source 1100 of FIG. 11. Alternatively, collection chamber 2215, as shown in FIG. 23, may be used as secondary source 1210 in centralized lighting system 1200 shown in FIG. 12 or source 1100 of FIG. 11. Thus, fiber interface 2335 may be connected to a centralized lighting controller, such as controller 1205 as shown FIG. 12, or any reflector fixture, for example, light fixture 2225 shown in FIG. 22, through one or more optical fibers. In accordance with an embodiment of the invention, collection chamber 2215 may include reflective material throughout its interior surfaces. Light source 2305 may be a standardized light bulb for easy replacement and minimized cost, thus allowing for wide-spread use. The size and power (or voltage) of fixture 2310 may be altered to support different types of light source 2305 e.g., industrial sodium vapor, standard, halogen, or fluorescent lighting. Collection chamber 2215 is typically modular such that multiple chambers may be used in a system for lighting an area, such as a building, warehouse or stadium. Thus, lighting capacity of such a system can easily be adjusted by changing the number of chambers, thereby allowing flexible customization of lighting systems for various applications and lighting needs.

Another advantage of collection chamber 2215 is that it allows for light source 2305 to be placed in a separate and accessible area for easy maintenance and for preventing heat buildup where lighting is needed. For example, fixtures may be located in hard-to-reach places for lighting an area, and maintenance need not be performed at these places but instead can be performed at chamber 2215 (which may be placed in a basement room or the like). Additionally, heat from light source 2305 is substantially insulated from the lighted area. It is noted that the power/lighting/heating systems and apparatuses of the present invention may be used in all types of applications in all types of settings. For example, the light collection method may be used for a desert-based power/heating plant (in., e.g., Arizona, Spain, Australia, beach or ocean-side location, etc.), a power/heating system for mountainous areas (e.g., ski-lodges or hiking lodges in the Rockies, Alps, etc.), a desalination facility for water supply, etc.

Figure 24:
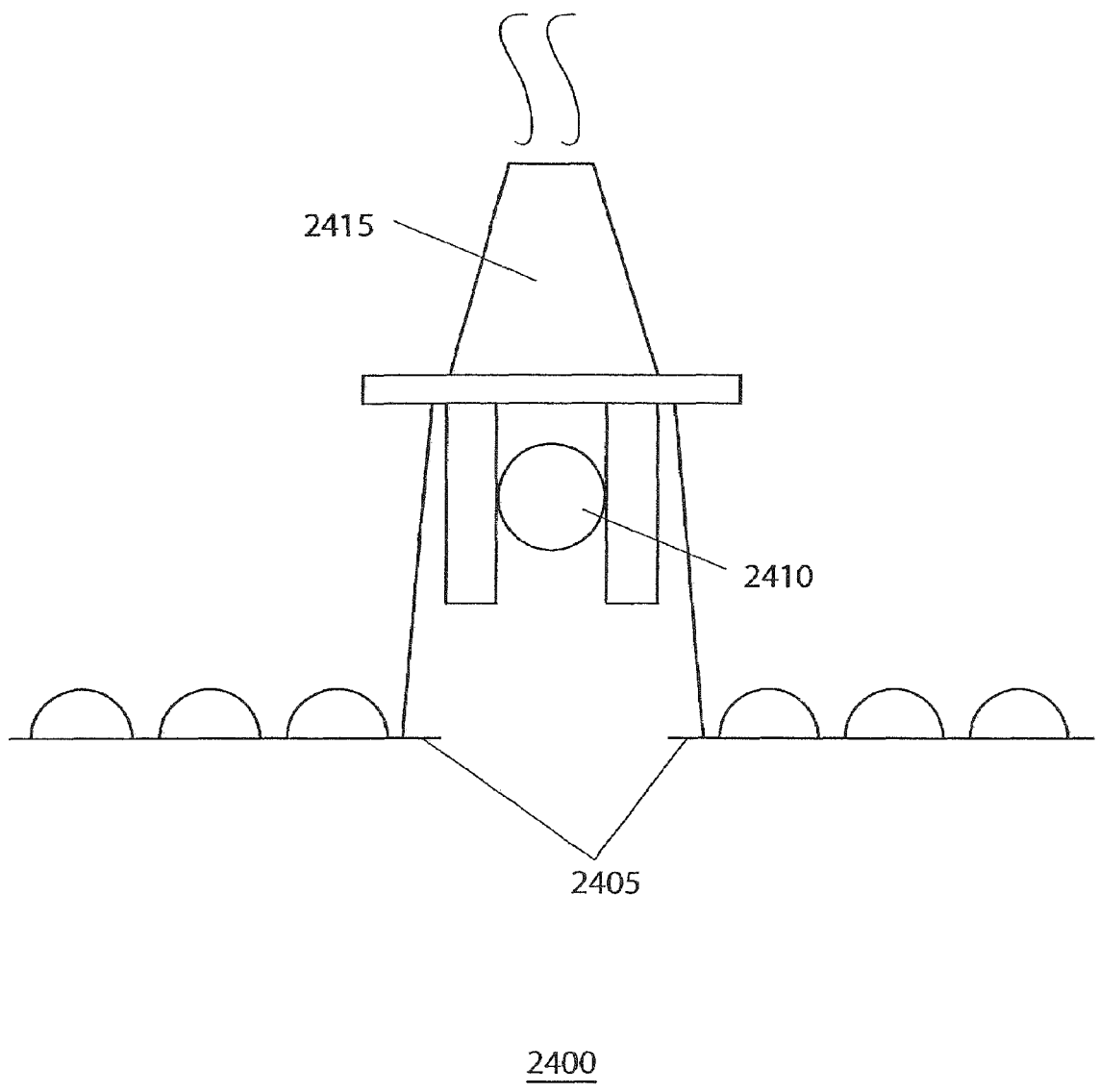
FIG. 24 illustrates a light collection facility according to an embodiment of the invention.

FIG. 24 illustrates a further exemplary embodiment of the present invention where the light collection method is implemented in a modified, power generator or self-powered oil rig 2400. As shown in FIG. 24, power generator/oil rig 2400 may include arrays 2405 of light collection (120) that are connected to and a heat a solar turbine to generate electrical power (to shore or to self-power) or a drill rig directly. A cooling tower 2415 may be included to prevent overheating. Solar furnace 2410 may also be used for desalination (fish water supply). Power cables (not shown) and/or optic fibers for transmitting collected light (not shown) may be connected to shore for supplying power, light, heat, etc., to shore. Such cables/fibers may be disposed under water or sea (ocean) floor to avoid exposure.

Figure 25:
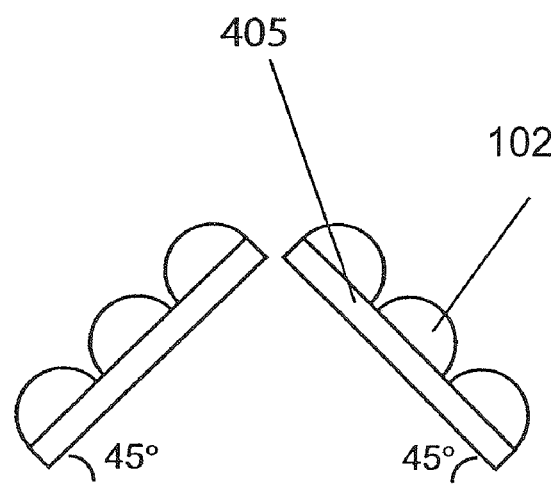
FIG. 25 shows a light collection configuration in accordance with an embodiment of the invention.

FIG. 25 illustrates a configuration of array 405 in accordance with an embodiment of the invention. As shown in FIG. 25, array 405 may be tilted to an angle for optimal light collection and/or for fitting the surroundings. For example, array 405 may be place on a slanted roof of a residence. In accordance with an embodiment of the invention, a cover (not shown) may be placed over array 405 or individual collectors (102) to prevent damage or buildup of interfering particles (e.g. dirt, snow, debris, etc.)

Figure 26:
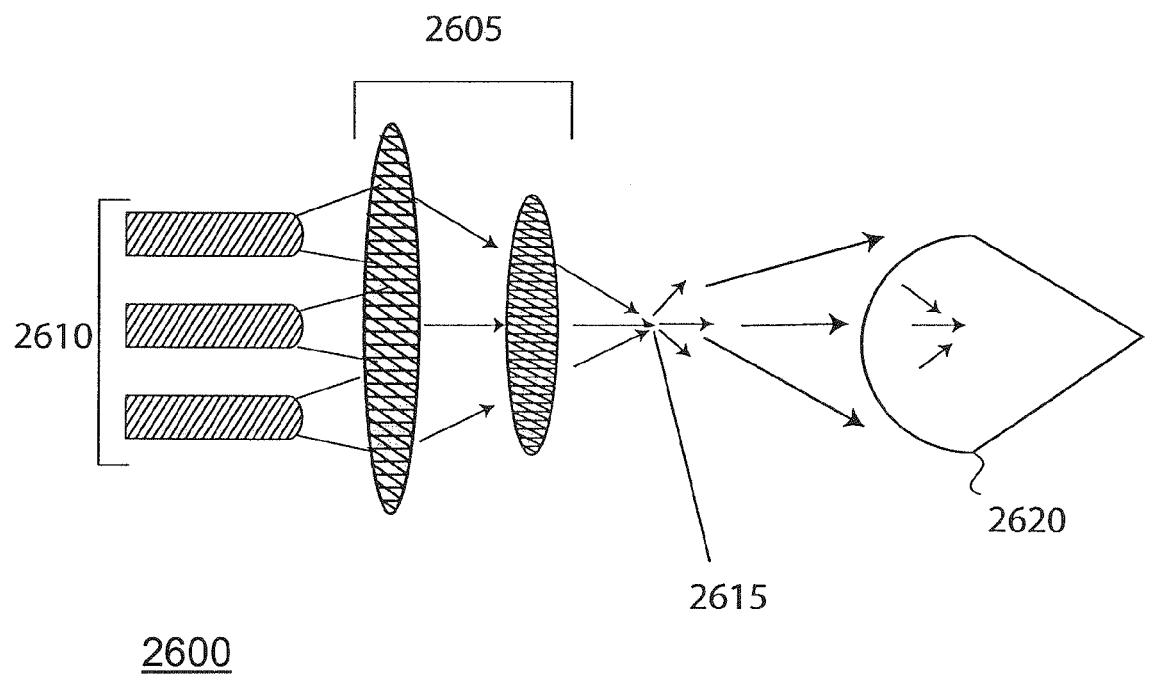
FIG. 26 is a diagram showing a solar-boosted fusion assembly 2600 in accordance with an embodiment of the invention.

FIG. 26 is a diagram showing a solar-boosted fusion assembly 2600 in accordance with an embodiment of the invention. As shown in FIG. 26, a multiple lens system 2605 may be used to focus light from one or more fibers 2610, which may be a collection of fibers such as fiber (110) and/or fiber output (815), into a focal point 2615 where a deuterium bead may be placed. Thus, a large array (405) having a large number of lenses (120) may be used to utilize solar thermal energy to assist a fusion reaction. Accordingly, a high intensity burst of concentrated solar energy, which may be focused using lens system 2605, may be used to initiate a reaction in deuterium bead (2615). Unused light may be recaptured by a collector 2620, which may be similar to lens (120), apparatus 1100, apparatus 1210, or a combination thereof. Collector 2620 may also be realized by collector 3100 as will be described herein with reference to FIGS. 32A, 32B, 32C, and 32D.

Examples of principles for collecting solar light energy using the inventive design of lens (120) in accordance with an embodiment of the invention will now be described in detail.

The determination of the overall dimensions of the optics lens collector 120 may be accomplished through ray tracing. It has been determined that conventional methods of solving this thick lens optics problem using the thick lens equations based on thin lens equations proves to be inadequate due to drastic assumptions made. The methods determined not valid are the Gaussian and Newtonian forms of the lens equations. Both are derived for thin lenses, but can be used for thick lens approximations only. For comparison, a thick lens calculation is included. The position of given objects, in this case the sun, is formed by successive applications of the reflection and refraction at spherical surfaces. The premise of the following thick lens calculation is based off of the following simple optics theory. More appropriately called trigonometric, or geometrical optics. This includes incident rays parallel to the axis and incident rays taken with respect to the horizon. One must note the intrinsic loses of reflection at spherical surfaces, therefore it is recommended that a decisive thin film is chosen to promote higher efficiency due to a higher transmission of light energy. The less that is reflected the more that is transferred, etc. Thus, anti-reflective coating similar to those used in eyeglasses and other optics can be applied to minimize losses through reflection that occurs at the incident points throughout the collector system (i.e., collector unit surface, between layers, at the fiber interface point, the collection chamber, etc.).

The travel of light through a surface (or interface) that separates two media is called refraction, and the light is said to be refracted. Unless an incident beam of light is perpendicular to a surface, refraction by the surface changes the light's direction of travel. The beam is said to be "bent" by refraction. Bending results only at the surface resulting in an incident ray and reflected ray. Each ray is oriented to a line perpendicular to the surface called the "normal". The angle of incidence is $\theta_1$, the angle of reflection is $\theta_1'$, and the angle of refraction is $\theta_2$.

Law of reflection: a reflected ray lies in the plane of incidence and has an angle of reflection equal to the angle of incidence. Therefore:

$$\theta_1 = \theta_1' \text{ (reflection)}, \tag{1}$$

Law of refraction: a refracted ray lies in the plane of incidence and has an angle of refraction that is related the angle of incidence by:

$$n_2 \sin\theta_2 = n_1 \sin\theta_1 \text{(refraction)}, \tag{2}$$

where $n_1$ and $n_2$ are each a dimensionless constant known as the index of refraction.

This equation is also more familiar known as Snell's Law.

The index of refraction of a medium:

$$n = c/v, \tag{3}$$

where v is the speed of light in that medium and c is tits speed in vacuum.

To compare angle of incidence to angle of refraction rearrange equation (2) as:

$$\sin\theta_2 = \frac{n_1}{n_2}\sin\theta, \tag{4}$$

The following three results could possibly take place.

1. if $n_2 = n_1$, then $\theta_2 = \theta_1$. Here the light beam is not bent in any manner.

2. if $n_2 > n_1$, then $\theta_2 < \theta_1$. Here Refraction bend the light beam toward the normal.

3. if $n_2 < n_1$, then $\theta_2 > \theta_1$. Here the light beam is reflected away from the normal.

The spreading of light, chromatic referring to the colors associated with the individual wavelengths and dispersion referring to the spreading of light according to its wavelengths or colors. Note that the index of refraction n is depends on the wavelength, except in a vacuum. This implies that light of different wavelengths will be refracted at different angles. This is important to capture any other wavelengths. This would be advantageous because if the sensor could capture energy of different wavelengths, then obviously more total energy could be captured as opposed to just visible light. Regardless, the index of refraction in a given medium is greater for a shorter wavelength than for a longer wavelength. (Hence, blue light bends more than red light). White light consists primarily of components of all the colors in the spectrum with all predominantly uniform intensities, which include the average wavelength of a candle flame.

As the angle of incidence increases, the angle of refraction increases; which means that the refracted ray points directly along the interface. The angle of incidence giving this situation is called the critical angle, $\theta_c$.

$$\theta_c = \sin^{-1}\frac{n_2}{n_1}, \quad (5)$$

The Fresnel bright spot, similar to the corona around the moon, is a composite of the diffraction patterns of airborne water drops. The refracted wave fronts are not spherical; therefore, they do not all intersect at a common focal point. This is better known as spherical aberration. Error results in large angles of incidence. Small incident angle, known as paraxial rays, are assumed once the trigonometric equations become generalized into the algebraic equations. The algebraic equations assume the small angle assumption of the series expansion of sin φ (higher order terms are neglected).

$$\sin\phi = \phi - \frac{\phi^3}{3!} + \frac{\phi^5}{5!} - \cdots, \quad (6)$$

Assumption:

sin φ=φ for small paraxial angles

The fraction of the incident light reflected from an air-glass boundary surface is only of the order of a few percent; never the less, internal reflections at the surface reduce efficiency and can drastically be reduced to negligible amounts my nonreflecting coatings on the lens surfaces. The indexes must be properly chosen to be some value intermediate between that of air and the glass, so that equal quantities of light are reflected form its outer surface, and from the boundary surface between it and the glass. The same phase change (180 degrees out of phase with the reflected wave from the second) must occur in each reflection so complete destructive interference results. For the desired purpose of the present invention, a film thickness of ¼ the wavelength of green/yellow (the wavelength of a candle flame) light would be appropriate reducing the loss of light energy through reflection by about 4 to 5 percent. Gas refraction cavities may also provide an alternative in this category.

For thick lens optics, ray tracing is the most effective method to estimation focal length with variant angles of incidence. It also reveals the focal "bright spot" location from the axis of symmetry. This in turn reveals the potential angle of usable exposure. Programs exist aiding in this area. Several should be explored, and will be necessary upon implementation of a multi-lens optical system, Fresnel lens, and fiber optics (total internal refraction/reflection losses).

Figure 27:
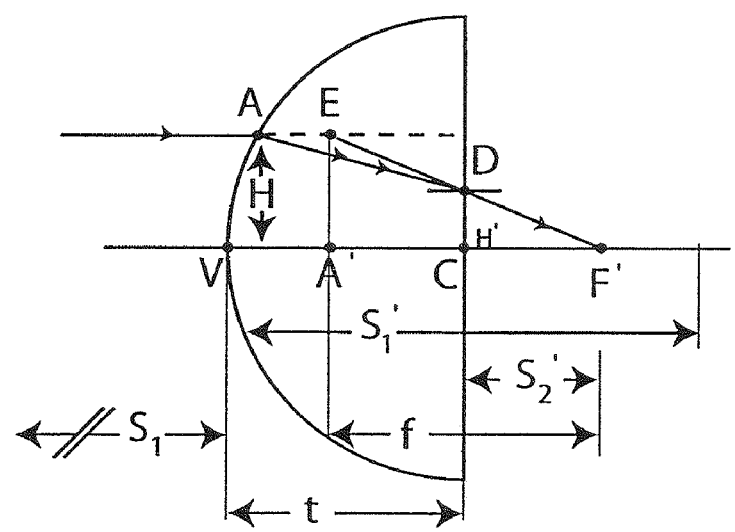

FIG. 27 shows an example of a spherical lens, as used for lens 120, for illustrating thick lens optics as employed in accordance with embodiments of the present invention.

As shown in FIG. 27,

| at (spherical) surface 01: | and at (flat) surface 02: |
|---|---|
| $R_1 = 6$ cm | $\frac{n_1}{s_2} + \frac{1}{s_2'} = \frac{1-n}{R_2}$ |
| $R_2 = \infty$ | |
| $n = 1.41$ | |
| $\frac{1}{s_1} + \frac{n}{s_1'} = \frac{n-1}{R_1}$ | $\frac{1.41}{-14.63415 \text{ cm}} + \frac{1}{s_2'} = \frac{1-1.41}{\infty}$ |
| $\frac{1}{\infty} + \frac{1.41}{s_1'} = \frac{1.41-1}{6 \text{ cm}}$ | $s_2' = 10.37883$ cm |
| $s_1' = 20.63415$ cm | |
| $s_2 = t - s_1'$ | |
| $= 6$ cm $- 20.63415$ cm | |
| $= -14.63415$ cm | |

The second focal point F' lies 10.37883 cm to the right of the second vertex (lens surface two). In this specific case the vertex is the center of curvature. Note, however, that the thick lens calculation is accurate only within the small angle series expansion approximation stated above (angles of approximately fifteen degrees (15°) or less).

Figure 29:
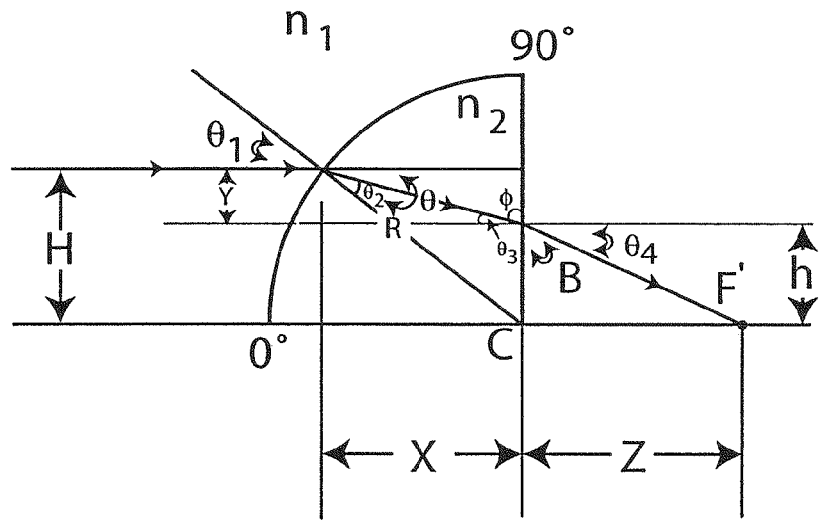
Figure 30:
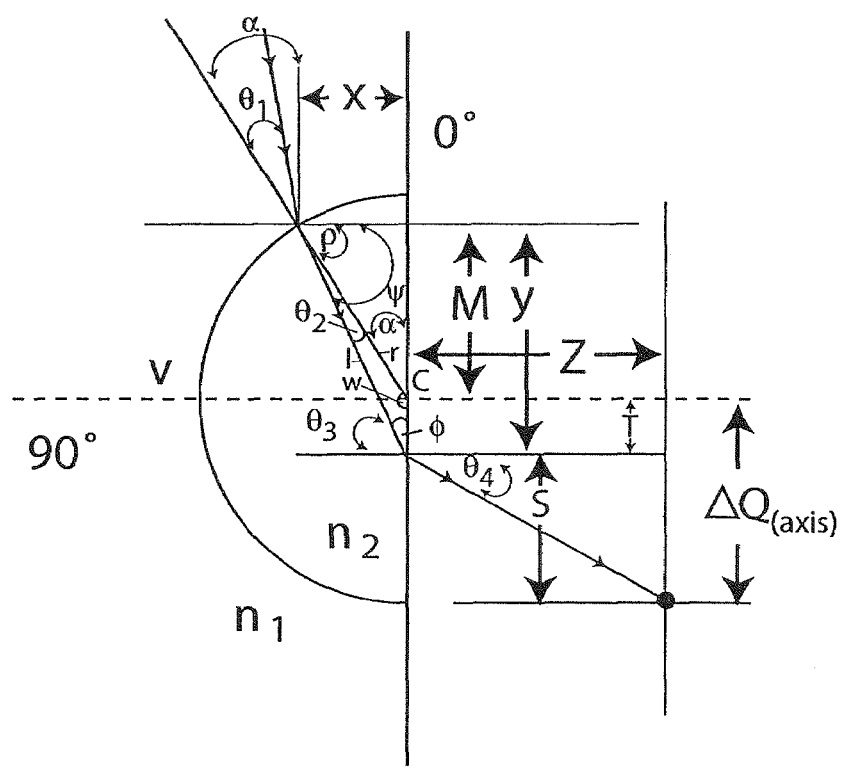

FIGS. 28A, 28B, 28C, and 28D form a table showing the results of angle calculations for a spherical lens, e.g., lens 120, in accordance with an embodiment of the invention, as illustrated by FIGS. 27, 29, and 30.

FIG. 29 shows a quarter sphere lens for illustrating geometric calculations therefor.

As shown in FIG. 29, at (spherical) surface 01:

$n_1 \sin\theta_1 = n_2 \sin\theta_2$ $\theta_2 = A\sin\left(\frac{n_1}{n_2} \cdot \sin\theta_1\right)$ $\phi = 180° - 90° - \gamma$ where $\gamma = \theta_1 - \theta_2$ $\phi = 180° - 90° - (\theta_1 - \theta_2)$ $\theta_3 = 90° - \phi$ therefore, $\theta_3 = \theta_1 - \theta_2$ and at (flat) surface 02:

$n_1 \sin\theta_3 = n_2 \sin\theta_4$ $\theta_4 = A\sin\left(\frac{n_1}{n_2} \cdot \sin\theta_3\right)$ $H = r\sin\theta_1$ $X = r\cos\theta_1$ $y = X\tan\theta_3$ $h = H - y$ $Z = h\tan(90° - \theta_4)$ FIG. 30 shows a hemisphere lens for illustrating geometric generalized calculation for any angle β.

As shown in FIG. 30,
at (spherical) surface 01:

$\beta = 0° - 90°$ Angle of light from horizon.

$\theta_1 = \alpha - \beta$ $\theta_2 = A\sin\left(\frac{n_1}{n_2} \cdot \sin\theta_1\right)$ $\rho = 180° - 90° - \alpha$ $\psi = \rho + \theta_2$ $\quad = (90° - \alpha) + \theta_2$ $\phi = 180° - 90° - \psi$ $\quad = 180° - 90° - (90° - \alpha + \theta_2)$ $\quad = \alpha - \theta_2$ therefore, $\theta_3 = 90° - \phi$ $\quad = 90° - \alpha + \theta_2$ and at (flat) surface 02:

$\theta_4 = A\sin\left(\frac{n_2}{n_1} \cdot \sin\theta_3\right)$ $w = 180° - \phi - \theta_2$ $\quad = 180° - (\alpha - \theta_2) - \theta_2$ $\quad = 180° - \alpha$ $M = r\cos\alpha$ $x = r\sin\alpha$ $l = \frac{r\sin w}{\sin\phi}$ $y = l\cos\phi$ $T = y - M$ $S = Z\tan\theta_4$ $\Delta Q = S + T$ It is noted that for the calculations shown in FIG. 30, incident rays are taken with respect to the horizon. It may be assumed that focal length Z is constant with changing sum position. This is valid because the source light is taken to be infinity. FIGS. 28A, 28B, 28C, and 28D show the usable range of light discriminated among the values not marked by "#NUM!".

Thus, a hemispherical collector, such as lens (120), of dimension radius of approximately 6 centimeters (cm) to 61 centimeters (cm) may be preferable. The optimal index of refraction for a 6 cm lens based on the data collected from FIGS. 27 to 30 is 1.41. The optimal focal region resides within the following limits of this lens: 8 cm to 10 cm. This proves effective, as an acceptable range of adjustment is needed to optimize each series of collectors. A sensor of 1 cm should properly detect incident ray angles of 68° to 120° from the horizon. This reveals the actual angle of usable exposure to be a cone of 44°. This correlates to approximately 2.93 hrs of active exposure. This does not, however, take into account repositioning of the collector. With subsequent repositioning of the sensor, it is estimated that approximately 8 hours of exposure could be obtained.

In accordance with an embodiment of the invention, multiple lenses may be used, instead of a single lens (120), for improved precision in focusing incoming light similar to lens system 2605 shown in FIG. 26. A significant drawback of the multi-lens system 2605 is that it may be bulky and may require high precision optics, which can be expensive and/or intolerant to variations in temperature and vibration. In such cases, the focus within the lens system may be adversely affected. In addition, multi-lens system may require a mechanical tracking method for monitoring and tracking a light source for optimum light collection, which may further contribute to the complexity, weight, size, etc., of the system. Finally, a multi-lens system must be sealed because dirt, and/or debris and/or moisture between the lenses could seriously degrade performance of the system.

Figure 31:
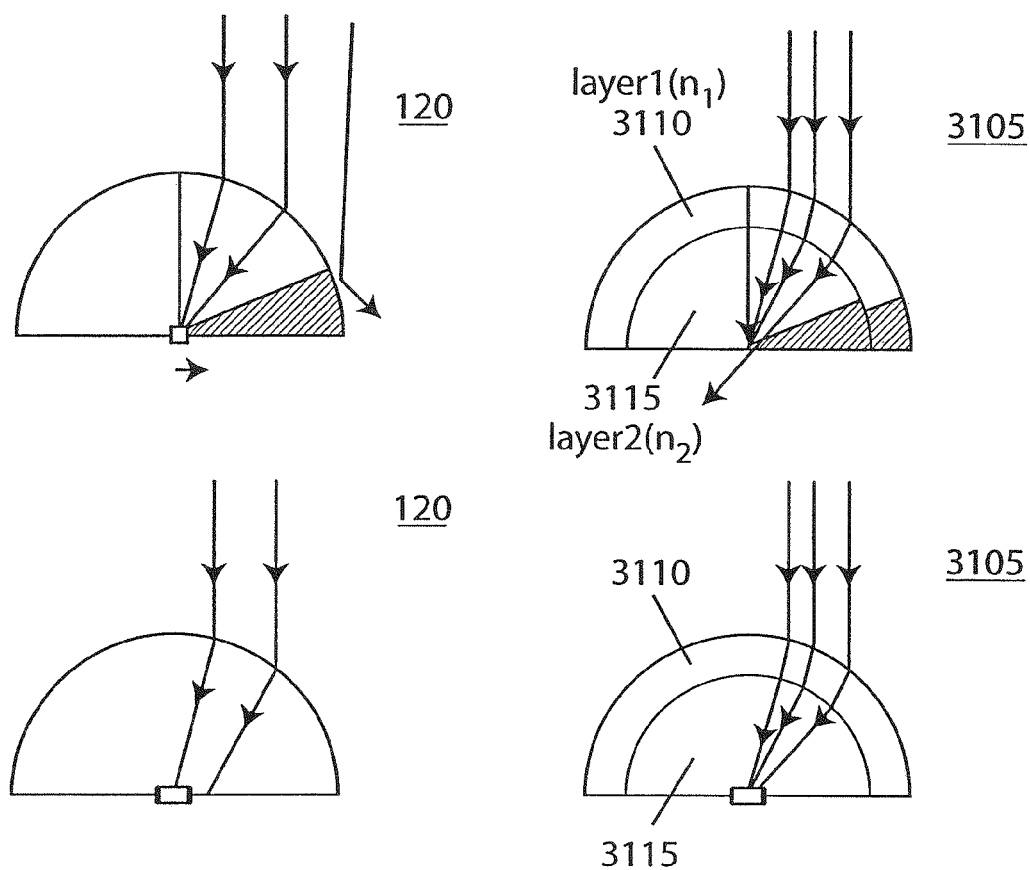
FIG. 31 illustrates the advantages of using a multi-stage collection unit in accordance with an embodiment of the invention.

It is typically preferable that a multi-layered spherical lens system, as shown in FIG. 31. Multi-layered lens 3105 may include a first layer 3110 including a material having a refractive index of $n_1$ and a second layer 3115 including a material having a refractive index of $n_2$. Lens 3105 is preferably a single refractive unit with its layers injection molded so that it may be resistant to thermal variation. Furthermore, since lens 3105 is a single unit, it does not require any sealing. Thus, lens 3105 may be used in place of lens 120 and/or collector 2620, as described herein.

Lens 3105 having multiple stages (or layers) (3110 and 3115) with varying optical properties allow for improved operating angle and tighter focusing, i.e., higher efficiency. Each stage (layer) of lens system may be accounted for using the mathematical description provided above.

Since the radius of curvature is substantially identical for all layers 3110 and 3115, varying the n (index of refraction) would affect the 'focus' of layers 3110 and 3115. The index of refraction (n) would dictate the radius of a unit (radius) which may be equal to the focus length of a lens. Unit has a single focal point from any point of origin above the critical angle, thus it is self-focusing. A fiber optic cable (e.g., 110) secured at the focal point (origin of sphere) may be positioned to gather all solar energy (visible light and infrared wavelengths). Refraction bends both visible and infrared waves. The principle of total internal reflection prevents the unit from functioning when the light source falls below a critical angle, which varies by the n. In order to minimize this effect, the outermost layer (e.g., 3110) of the unit may have the lowest n (with the lowest critical angle) and each successive layer (e.g., 3115) may have a higher n for increased focusing ability (while minimizing the radius of the unit 3105). For example, $n_2$ may be greater than $n_1$, $n_1 < n_2$, which may both be greater than $n_0$, index of refraction of air (=1.0008). This design allows the unit (3105) to be very compact and also have minimal operating constraint (critical angle) and superior resolving capability due to its consecutive internal layers (smaller 'lenses' have a more precise focus). The unit (3105) may be constructed from multiple materials, as exhibited in the multistage collector. In order to increase operating angles and prevent energy losses from the critical angle, a multiple of materials can be used in one lens. A multistage collector allows for tighter focus of incoming light, increased operational angle, and improved energy concentration while minimizing the size of the unit. Since multiple materials are bonded to be a single unit the device is compact, maintenance free and extremely durable, as well as being immune to thermal variations, which can affect the resolving performance of existing systems due to expansion and contraction.

Figure 32A:
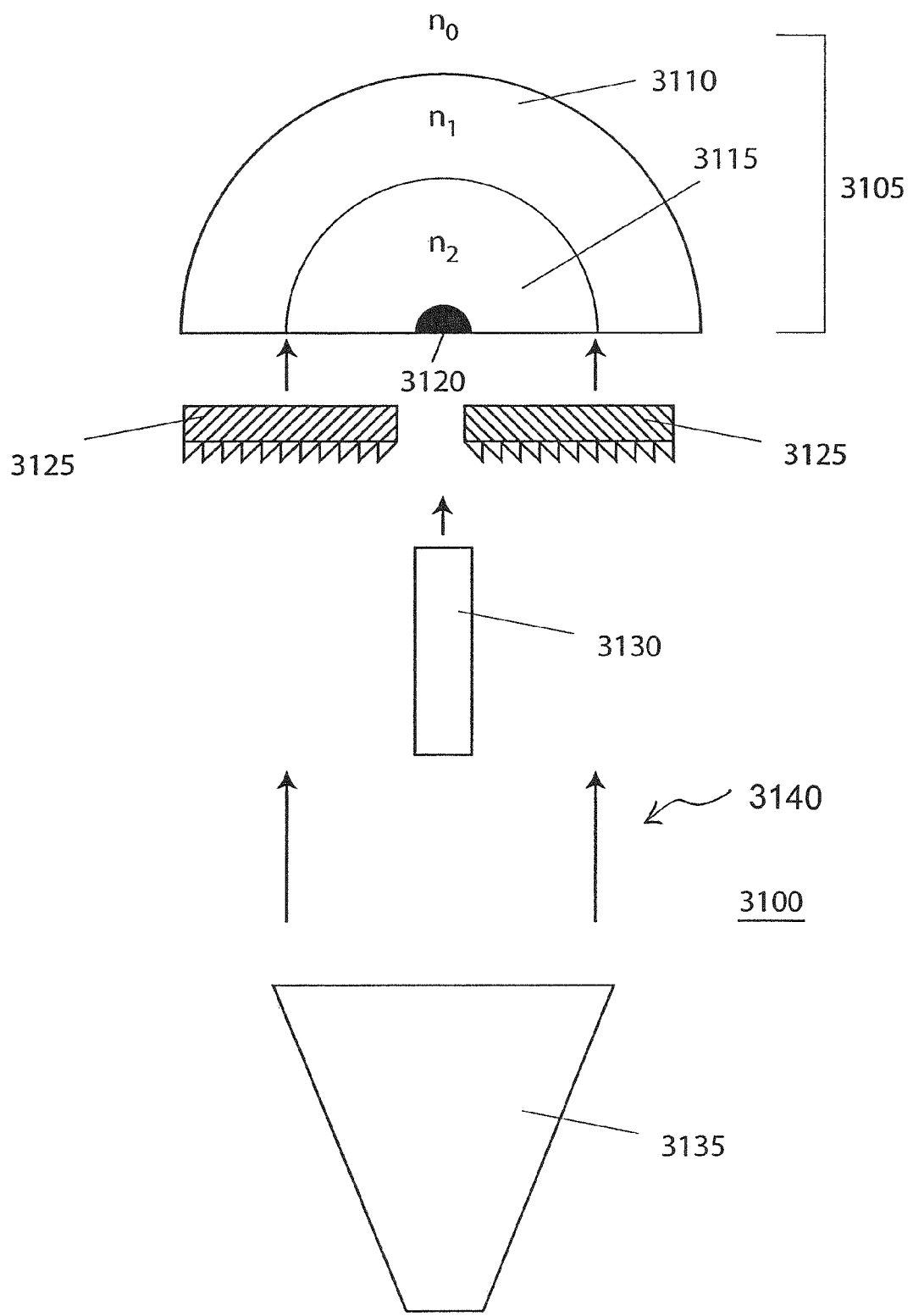
FIGS. 32A to 32D are diagrams showing a collection unit according to respective embodiments of the invention.
Figure 32B:
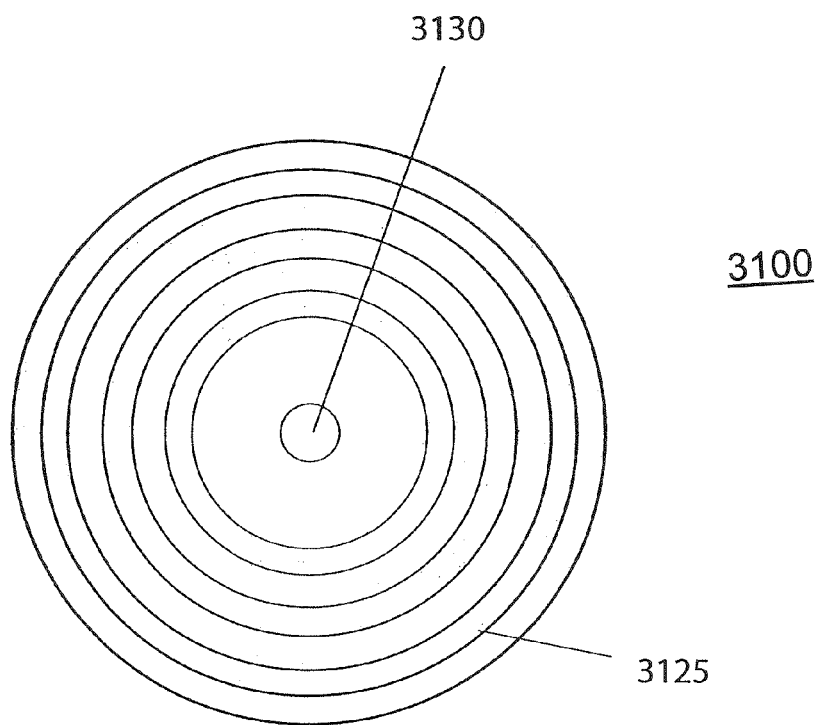

FIGS. 32A, 32B, 32C, and 32D illustrate a collector assembly 3100 for using multi-layered lens 3105 in accordance with an embodiment of the present invention. Collector 3100 may be used for the functionality of lens (120) and/or collector (2620). As shown in FIG. 32A, lens 3105 may further include a final stage 3120 at the focal point of lens 3105. Final stage 3120 according to an embodiment of the invention will be described in further detail with reference to FIGS. 33A, 33B, and 33C. As shown in FIG. 32A, a Fresnel lens 3125 may be placed below lens 3105 for focusing ambient light that has not been focused to final stage 3120. FIG. 32B is a bottom view illustrating a view of Fresnel lens 3125. Fresnel lens 3125 may be integrated to lens 3105 as a single unit (which may be injection or vacuum molded.)

A tube 3130 for carrying fiber (110) may include a reflective surface for trapping light into the fiber (110). Collector lens unit 3100 may further include a rear collector 3135, which may be cone shaped (i.e., forming a frustum of a cone), with a reflective (e.g., silver) inner surface for reflecting ambient light that is not focused to final stage 3120 into tube 3130 and the fiber (110) carried therein. Advantageously, cone-shaped rear collector 3135 may continuously reflect ambient light towards tube 3130 down to the bottom thereof (e.g., similar to a funnel) where fiber 110 is output. A transparent section 3140 may further be included to act as a focusing lens to concentrate all light collected by rear collector 3135 to fiber 110.

Thus, the reflective area of rear collector 3135 may be defined by $$\text{Area} = \pi \times (r_1 + r_2) \times \sqrt{(r_1 - r_2)^2 + h^2}, \tag{7}$$

where r1 is the radius of the larger circle (top circle at interface with lens 3105 and Fresnel lens 3125); r2 is the radius of the smaller circle (the bottom circle where fiber 110 is output); and h is the height of the cone section (rear collector 3135).

Figure 32C:
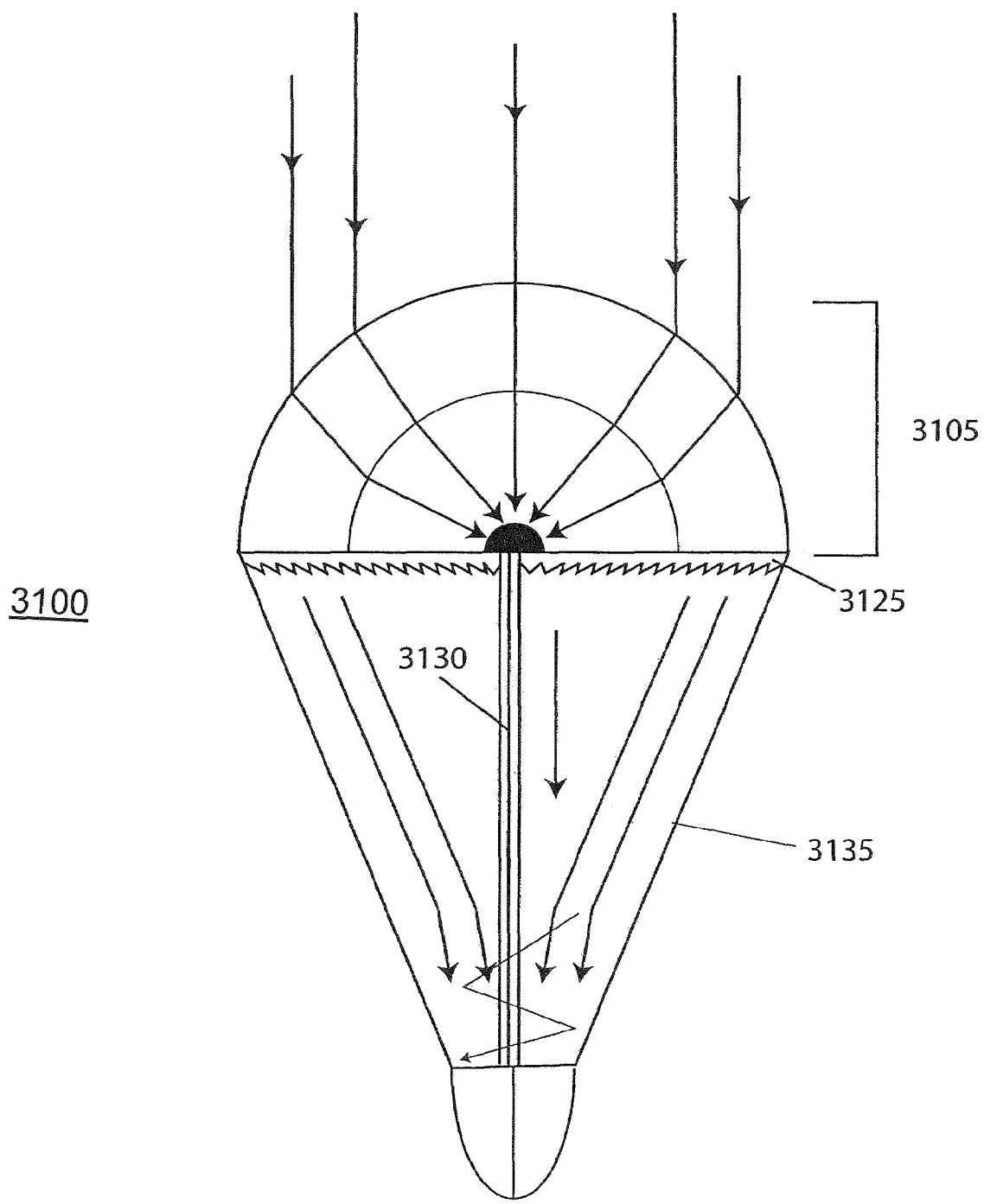

As shown in FIG. 32C, ambient light may be focused with Fresnel lens 3125 at the bottom of lens 3105. Fresnel lens 3125 may further focus light minimizing a number of reflections ("bounces") on rear collector 3135 before the ambient light reaches tube 3130 and the fiber (110) carried therein, thus maximizing the power transferred to the fiber (110).

Figure 32D:
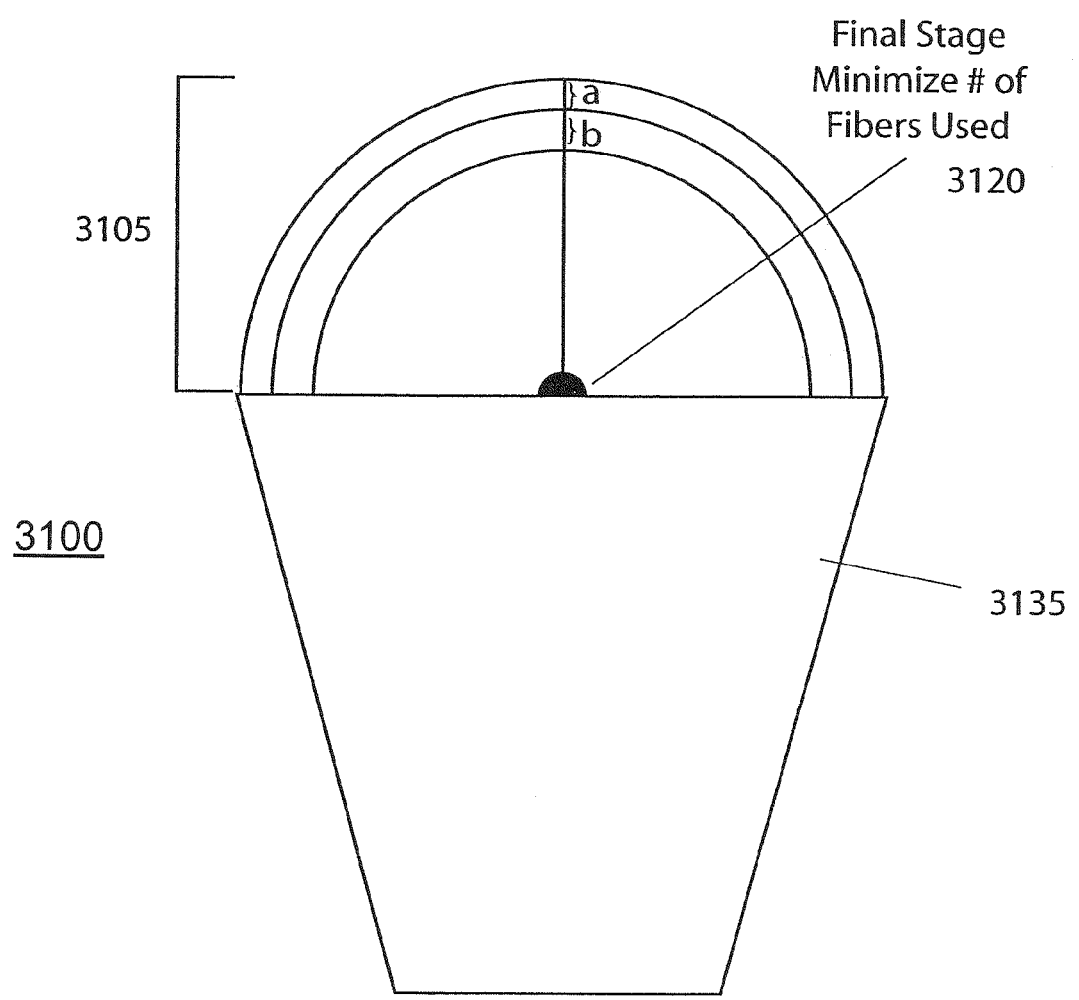

FIG. 32D illustrates collector assembly 3100 with a varying number stages (or layers) (and thickness of each of such stages) for its collector lens 3105. As shown in FIG. 32D, collectors lens 3105 may include a number of stages (or layers) a and b, etc. down to final stage 3120. It is noted that $n_{avg}$ (the average of the n's (indexes of refraction) of the stages) may be considered as the n of lens 3105 as if lens 3105 were a single stage lens (e.g., 120), except that lens 3105 may have a substantially reduced critical angle and better focus. It is noted that a higher $n_{avg}$ would allow for a smaller lens 3105 that is more efficient. In any event, the number of stages (or layers), the radius, the n's of respective stages, and the distance between the stages, etc., of the lens unit (3105) may all be varied depending on the usage requirements, environment, etc. The n of the materials used in the collector (e.g., 120 or 3105), whether single or multistage, can be controlled through the combination of multiple materials with different n (i.e., mixing a low index glass and higher index quartz, varying the volume of either material to raise or lower the index) to form a new 'blend' of material that has the precise index of refraction desired. Suspensions of solutions can also be used to control n in a similar manner. It is also noted that anti-reflective material may be used between the stages to minimize reflection therebetween.

Figure 33A:
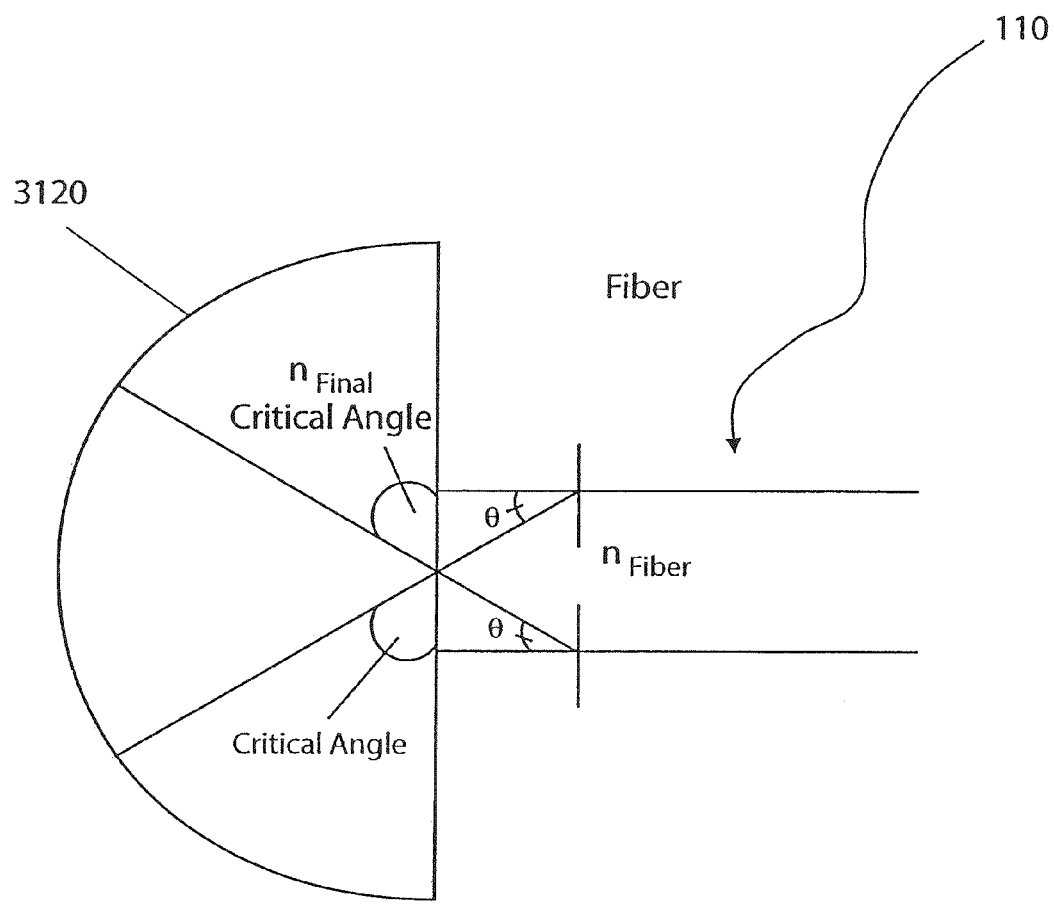
FIGS. 33A to 33C illustrate the interface between a collection unit and a transmission medium according to an embodiment of the invention.
Figure 33B:
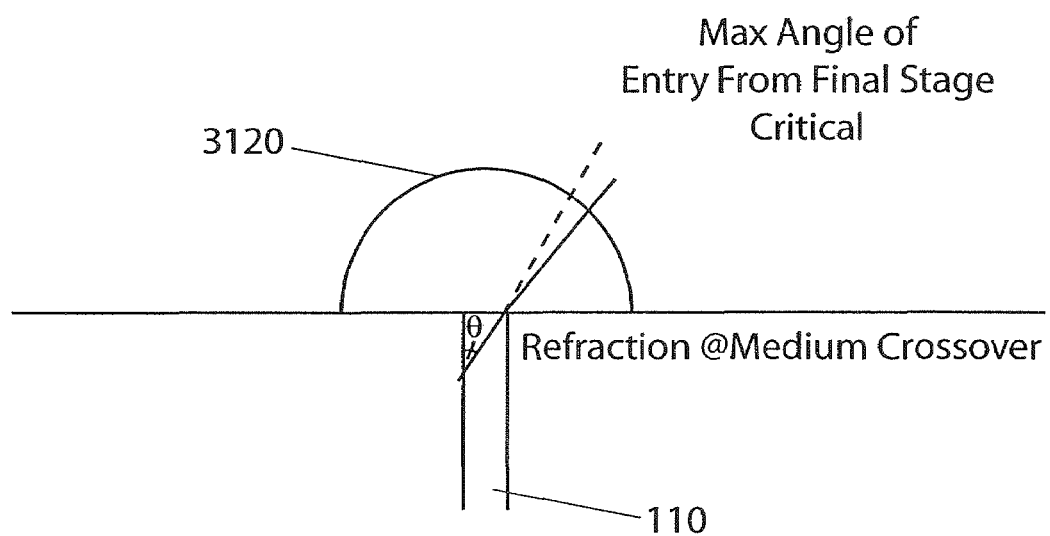
Figure 33C:
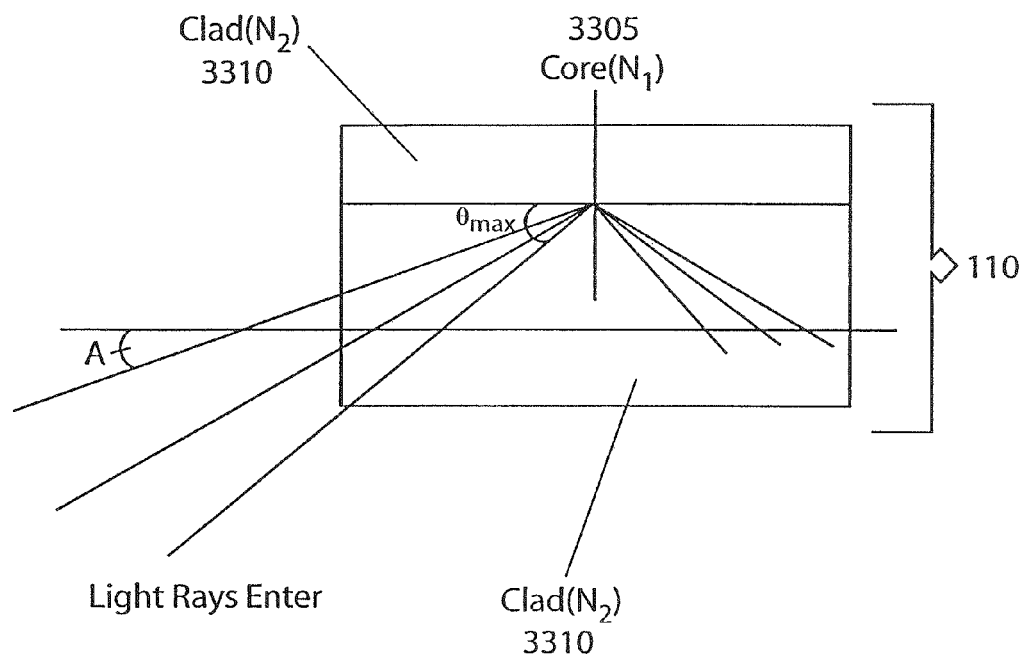

Referring now to FIGS. 33A, 33B, and 33C, final stage (layer) 3120 may be made of a high index material to be used to tighten the light (solar) beam at the base of the collector lens (120 or 3105) just above the focal point at the origin to further focus incoming solar energy minimizing the target area for placing the transmission fiber (110). This reduces the number of fibers needed per collector unit by increasing energy density per fiber.

Final stage 3120 also serves another purpose of bending all the incoming light rays within the numerical aperture ("NA") of the fiber (110). As shown in FIG. 33A, the critical angle of final stage 3120 may be set by setting $n_{final}$ (index of refraction of final stage 3120) so that θ is equal to or less than the maximum angle of reflection of fiber 110. Thus, accounting for refraction at the medium crossover and the indexes of refraction of final stage 3120, $n_{final}$, and fiber 110, $n_{fiber}$, respectively, the critical angle may be lowered even further if $n_{final} < n_{fiber}$, as shown in FIG. 33B.

FIG. 33 C illustrates the entry of light rays into fiber 110 where θ max, the maximum angle of reflection at the border between the core 3305 and the clad 3310 of fiber 110, is dictated by the NA of fiber 110, which is defined by:

$$NA = \sqrt{(N_1)^2 - (N_2)^2}, \tag{8}$$

where $N_1$ and $N_2$ are the indexes of refraction of core 3305 and clad 3310, respectively.

This provides optimum efficiency as the rays travel inside the fiber (110). Otherwise, if any rays were to exceed the NA, they would pass through the wall of the fiber (110) and be lost instead of reflecting down its length.

Figure 34A:
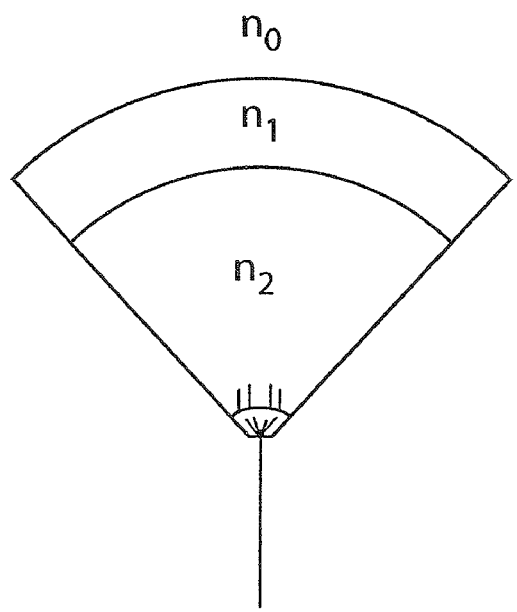
FIGS. 34A to 34C are diagrams illustrating a collection unit according to an embodiment of the invention.
Figure 34B:
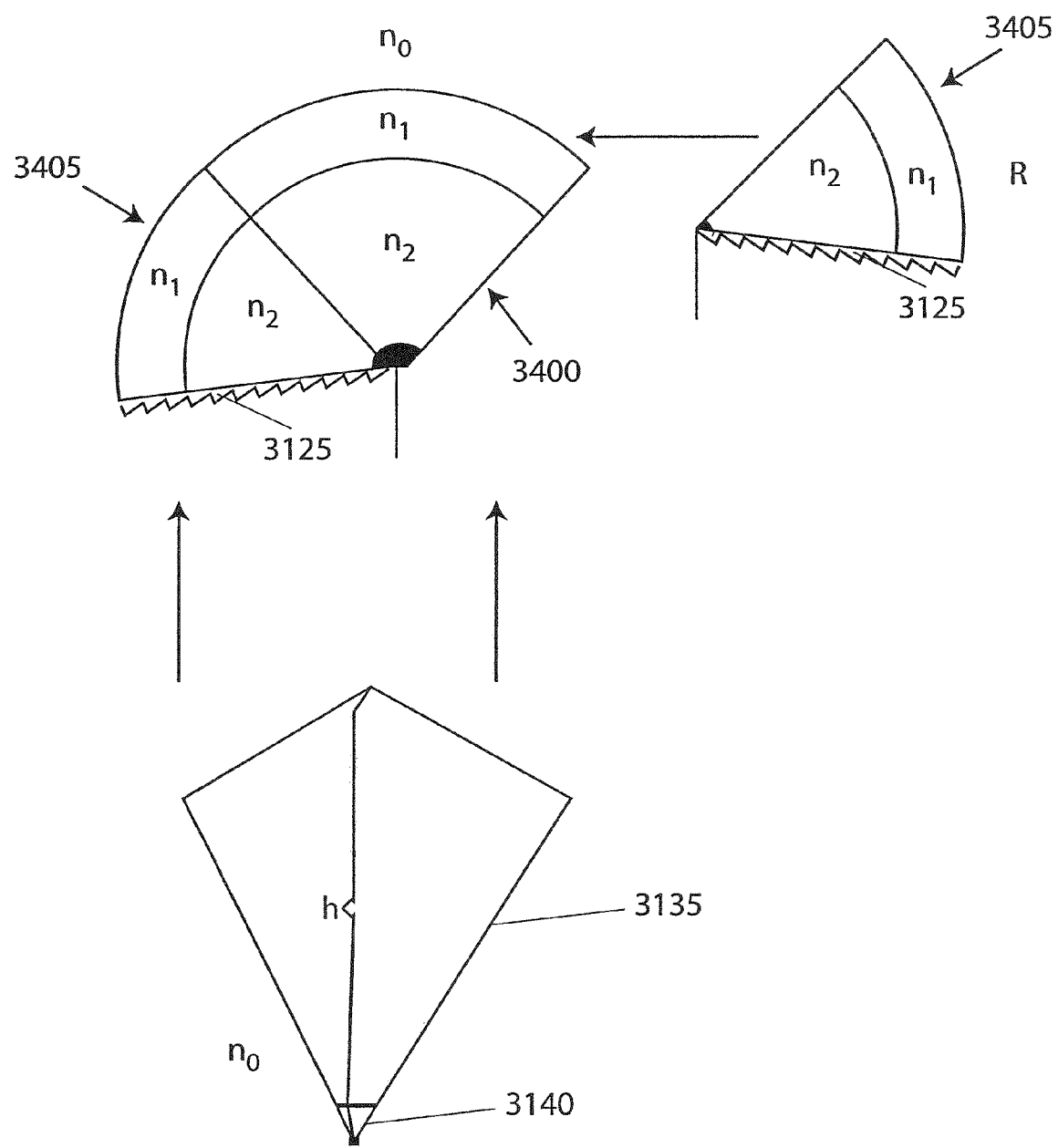
Figure 34C:
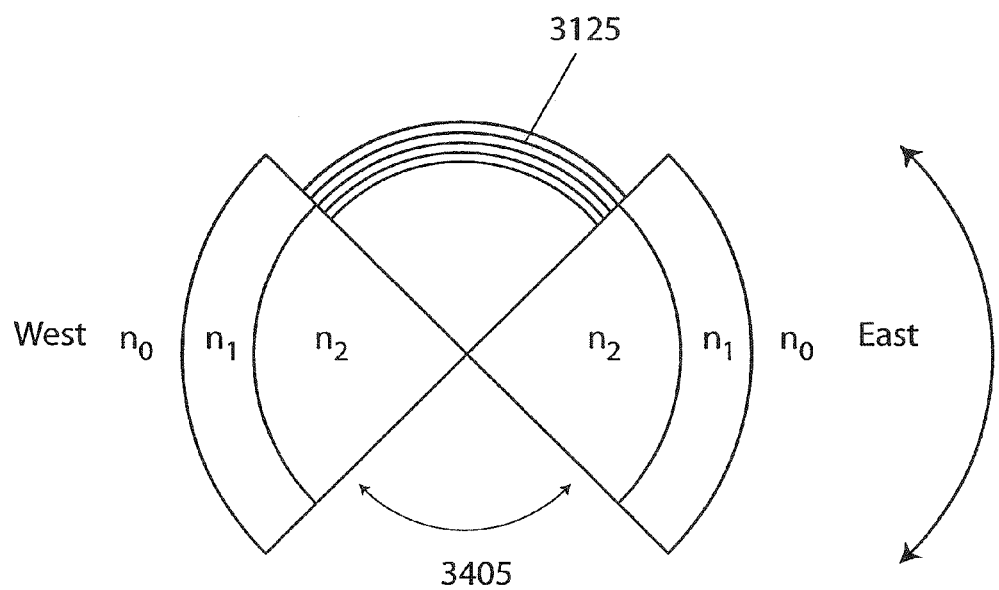

FIGS. 34A, 34B, and 34C illustrate an additional shape that may be used for collector lens (120 or 3100) in accordance with an embodiment of the invention. FIGS. 34A and 34B are side views of collector lens unit 3400 similar to lenses 120 and 3105, as described herein, but having a cutoff shape where lens material is cut off below the critical angle of the collector lens 3400 (e.g., 102 or 3105). Additional sections 3405 having a Fresnel surface similar to Fresnel lens 3125 may be added below the critical angle for increasing the range of light collection of unit 3400. FIG. 34C shows a top view of sections 3405. As shown in FIG. 34C, sections 3405 may also be in a cutoff shape with respect to a path of the sun such that collection material is used only to face the sun on its path from East to West during the course of a day. Thus, collector unit 3400 and sections 3405 may be mounted to correspond to a daily cycle such that it faces the sun as it moves along during the course of a day (i.e., sections 3405 would face the direction where the sun rises and sets on the horizon). This alignment may be affected by the altitude, the location (latitude) etc., at which collector 3400 and sections 3405 are to be mounted. It may further be continuously adjusted (e.g., by an automatic device) on a seasonal cycle for tracking the shifts of the sun's path for the different seasons. Advantageously, collector lens 3400 with the shape shown in FIGS. 34A, 34B, and 34C may be extremely lightweight, efficient, and adaptable to different environments and conditions.

A further embodiment of the present invention increases collection of light energy, or solar energy, by disposing a plurality of fibers, such as optical fibers, relative to a lens such that as the angle of energy rays that are collected changes relative to the time of day, a particular fiber will have an optimal exposure to the energy rays. The fibers are used to collect and transmit solar energy or light energy, which is typically gathered by a collection apparatus, as described herein. Typically the fibers are fabricated from a conductive material. The increased collection capability can be accomplished by arranging the fibers such that each fiber has maximum exposure in a sequence that is a function of the incoming light energy. This embodiment is advantageous since a collector can be mounted virtually anywhere and does not require any moving parts since the position of the plurality of fibers enables increased, collection. Also, the lens may be fabricated from a plurality of materials to optimize collection of light energy.

The disposition of fibers enables the surface area of fibers to be increased thereby increasing a quantity of received light energy that can then be transmitted. Each fiber may have a coefficient of energy collection. The coefficient of energy collection is a capability to collect light energy, or solar energy. This coefficient is a function of one or more of: a fiber's position relative to the surface of the lens; fiber diameter; and fiber constituent materials.

In addition to the disposition of fibers and the collection coefficient of each fiber, a lens can be used to facilitate enhanced collection of light energy. The lens is fabricated from a plurality of materials. Typically, the lens includes a vinyl-based material, such as an acrylic material, which is disposed as a center portion, or region, and is surrounded by one or more rings of one or more polymeric materials. The polymeric material may be, for example, a thermoplastic material, such as polycarbonate, or polysilicon material, which is disposed at a peripheral region, or peripheral area, relative to the center portion.

It is an embodiment of the present invention that the lens, as described herein, may be fabricated by mounting a first polymeric material in an annular or surrounding or concentric relationship to the center portion. One or more other polymeric material portions, which may comprise the same polymeric material or a different polymeric material, may be mounted in additional annular, or concentric rings relative to the first polymeric material. The polymeric portions may be adhered to the acrylic material and/or another polymeric portion using a suitable adhesive compound such as epoxy or other resin that can bond desired portions of the lens. The adhesion material may also have refractive properties, which are factored into the lens functionality. Indeed, it is an embodiment of the present invention that the adhesion material is selected and applied at particular regions to produce desired refractive characteristics of the lens. Heat fusion, thermo-welding and/or co-extrusion may also be used to form the lens. For example, a die with a slot may be used to extrude the lens material, which may include acrylic and polymeric portions to form a center portion and peripheral portions as described herein.

Alternatively, the lens, as described herein, may be formed by stretching portions of the polymeric materials, thereby modifying the surface area and refractive properties. The stretching procedure may be performed prior to, during, or after the adhesion or bonding process described above.

Figure 35:
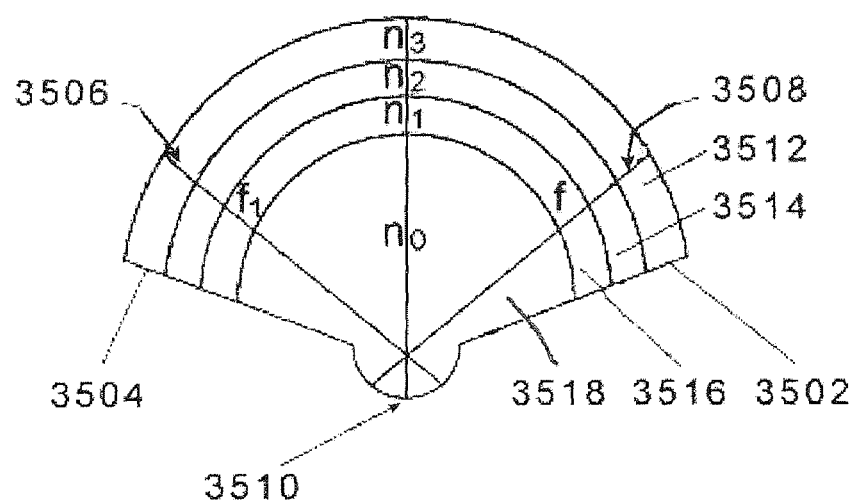
FIG. 35 shows a side view of a lens that can be used with a collection apparatus according to the present invention.

FIG. 35 shows a side view of a lens 3500 that can be used with a collection apparatus according to the present invention. Axis 3502 and axis 3504 define the collection boundaries for the lens 3500. These boundaries 3502 and 3504 form a region in which light energy may be collected Light energy rays 3506 and 3508 are examples of two light energy rays received by the lens 3500. As shown in FIG. 35, these rays 3506 and 3508 originate from disparate points and are focused into collector region 3510. For example, ray 3506 may be from sunlight in the morning and ray 3508 may be from sunlight in the evening. Region 3510 is typically a collection point of the lens 3500. This collection point 3510 may have a plurality of fibers used to collect the light energy from rays 3506 and 3508. Bands 3512, 3514, 3516 and 3518 are areas, or regions, of the lens 3500, which are typically at the periphery, or edge portions of the lens 3500. Each band, or region interfaces with the incoming rays, or incident light energy such that the light energy is focused to collector region 3510.

For example, region 3518 may be fabricated from a transparent thermoplastic material, or glass material, or an acrylic material, or heat-resistant glass, for example, PYREX®, or other suitable transparent, semi-transparent or translucent material. Region 3518 has a first refractive index ($n_0$) and focuses the incoming light energy as a function of the refractive index. Region 3518 may be a center region or area of the lens.

Region 3516 may be fabricated from a polymeric material, such as polycarbonate, polysilicon, or modified glass material or a second acrylic material, different than region 3518. Region 3516 has an associated refractive index ($n_1$) and focuses the incoming light energy as a function of the refractive index. Typically $n_1$ is greater than $n_0$, such that the incoming light energy, which is received at a different angle, will be focused to maximize the collection of energy. The region 3516 may be disposed at the periphery of the region 3518

Region 3514 may also be fabricated from a polymeric material, such as polycarbonate, polysilicon or modified glass material or acrylic material, different that region 3518 and may also be different from that of region 3516. Region 3514 has an associated refractive index ($n_2$) and focuses the incoming light energy as a function of the refractive index. Typically $n_2$ is greater than $n_1$, such that the incoming light energy, which is received at a different angle, will be focused to maximize the collection of energy. Region 3514 may be disposed at the periphery of region 3516.

Region 3512 may be fabricated from a polymeric material, or modified glass material or acrylic material, as described above, different or the same as other regions of the lens. Region 3512 has an associated refractive index ($n_3$) and focuses the incoming light energy as a function of the refractive index. Typically $n_3$ is greater than $n_2$, such that the incoming light energy, which is received at a different angle, will be focused to maximize the collection of energy. Region 3512 may be disposed at the periphery of region 3514. Thus, as shown by FIG. 35, the center portion has the lowest index of refraction and the portions surrounding the center portion have increasingly higher indices of refraction. The amount of increase in the refractive indices can be a fixed or variable quantity.

Alternatively, the lens can be fabricated such that the indices of refraction do not increase. For example, $n_0$ could be less than $n_1$; but $n_2$ could be less than $n_1$. Additional permutations of the relative values of the indices of refraction are other alternate embodiments of the invention.

Figure 36:
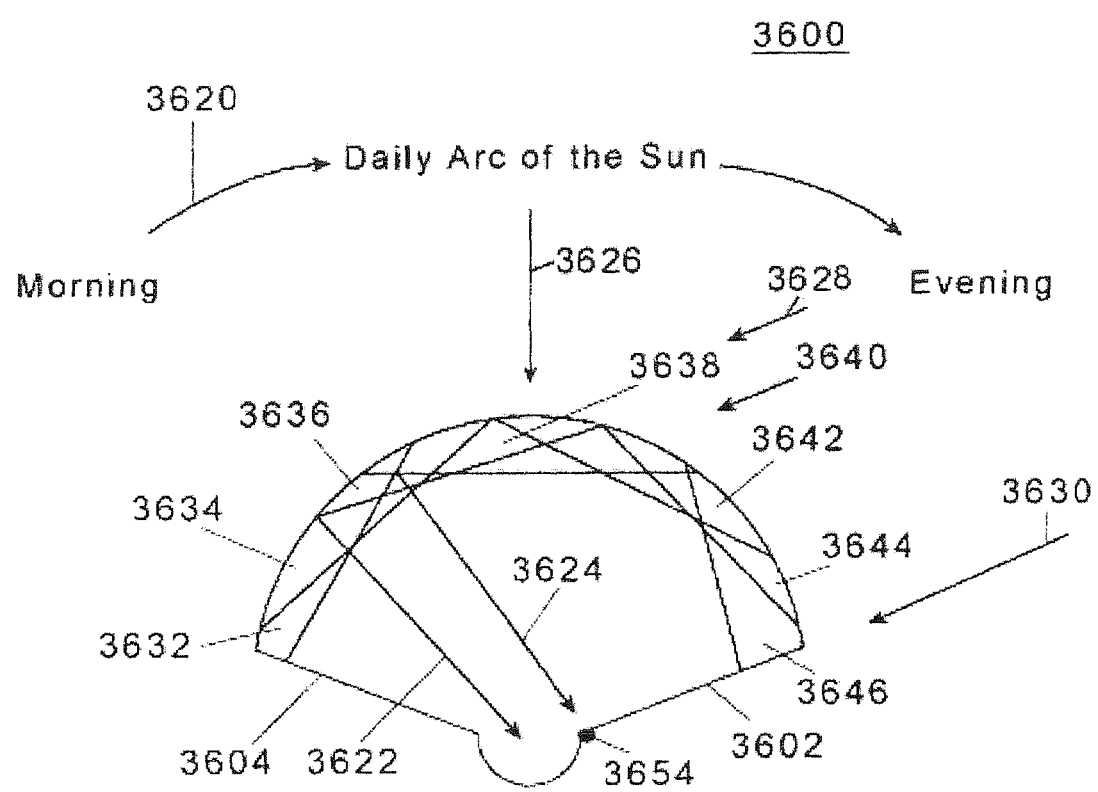
FIG. 36 shows the interaction of light from the sun with the lens of the present invention.

FIG. 36 shows the interaction of light from a light source, such as the sun, with the lens 3640 of the present invention. Specifically, FIG. 36 shows an are 3620 of the light energy, as the earth changes position relative to the sun during a day. The direction of arrow 3620 shows that the light energy is received by the lens 3640 at a plurality of angles. Line 3622 shows energy is focused at focal point 3654, which may then be collected by one or more fibers, as discussed herein. Similarly, ray 3624 is also focused at focal point 3654. Rays 3622 and 3624 are directed as a function of lens regions 3632 and 3634, which typically have unique corresponding indices of refraction. As the earth rotates around the sun during the day, light energy, for example 3626, which is a result of the sun being closer to the center of the lens, is focused by region 3638. However, when the incoming light rays do not originate such that the rays interact with the center region 3638 of the lens 3640, collection efficiency decreases because, for example, the angle of ray 3628 does not optimally align with focal point 3654. Ray 3630 has even less optimal collection since the angle of reception results in less light energy reaching focal point 3654. Thus, regions 3642, 3644 and 3646, each being fabricated from a material, such as a polymer, and having a corresponding index of refraction enhances the collection of light energy by focusing the light toward focal point 3654. This is accomplished by bending or refracting the light energy to direct it toward focal point 3654.

Figure 37:
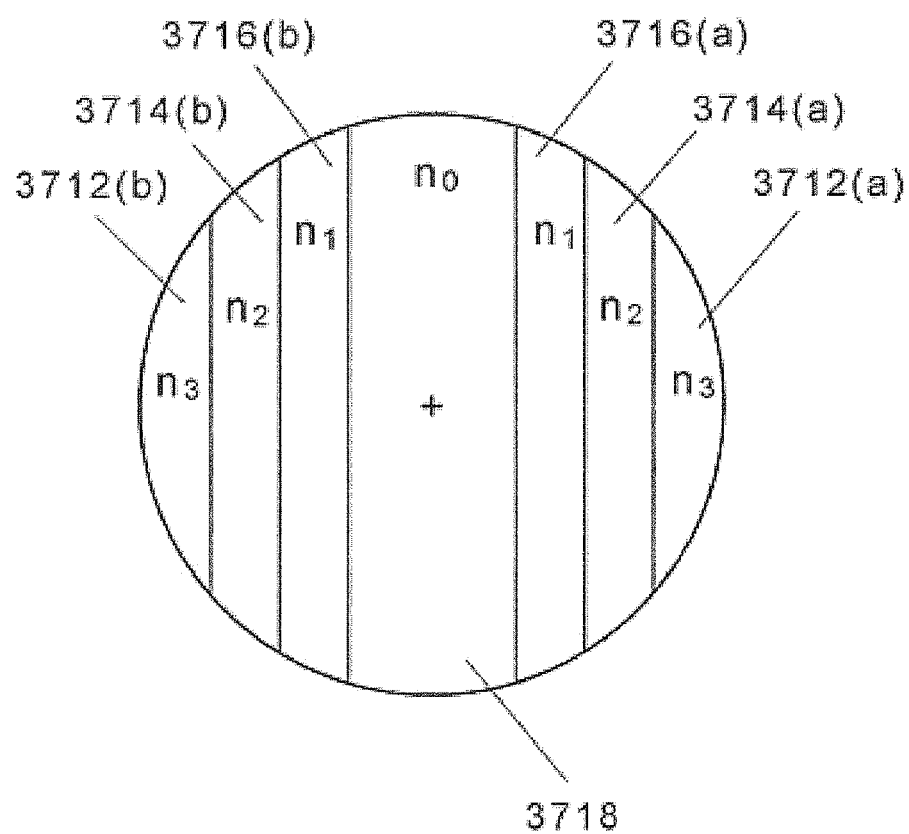
FIG. 37 shows a top view of a lens according to the present invention.

FIG. 37 shows a top view 3700 of a lens. The surface of the lens has a plurality regions, each having an associated indices of refraction. Specifically 3712(a) and (b) relate to index of refraction $n_3$; 3714(a) and (b) relate to index of refraction $n_2$; 3716(a) and (b) relate to index of refraction $n_1$; 3718 relate to index of refraction $n_0$. Typically, $n_3$ is greater than $n_2$, which is greater than $n_1$, which is greater than $n_0$. The composite make-up of the lens enables light energy to be diffracted at various angles.

Figure 38:
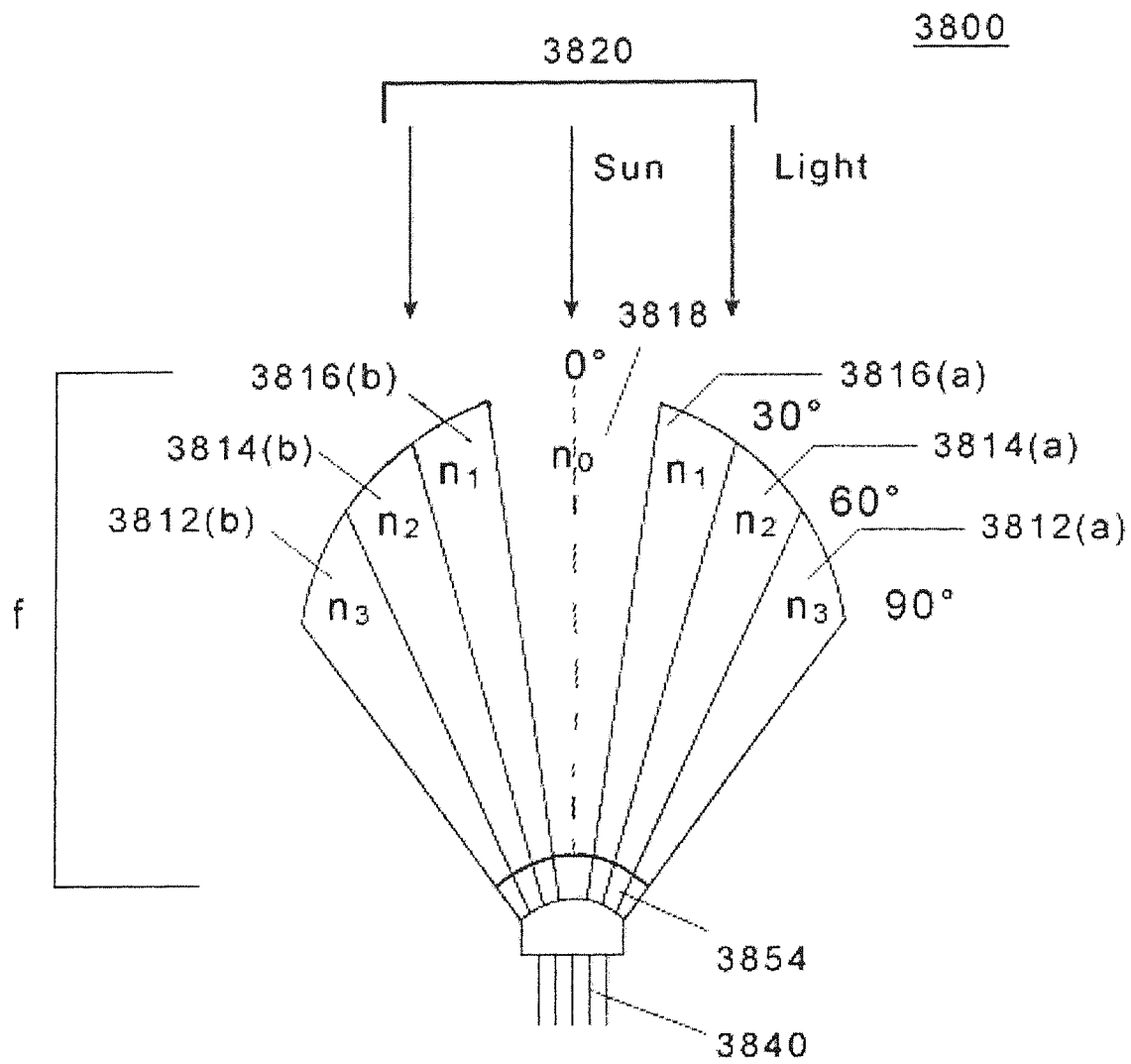
FIG. 38 shows a view of solar energy collection according to the present invention.

FIG. 38 shows a front to back view of a lens 3800, which is coupled to a fiber assembly 3840, which is mounted in proximity to the focal point 3854. The fiber assembly 3840 has a plurality of fibers, each fiber positioned to have maximum collection at a particular refractive index to collect light energy 3820. As shown in FIG. 38, 3812(a) and (b) are a region having an index of refraction $n_3$; 3814(a) and (b) are a region having an index of refraction $n_2$; 3816(a) and (b) are a region having an index of refraction $n_1$; and 3818 is a region having an index of refraction $n_0$. Typically, region 3818 is the center portion and is fabricated from glass, or acrylic or PYREX®. Regions 3812, 3814 and 3816 are peripheral regions.

Figure 39:
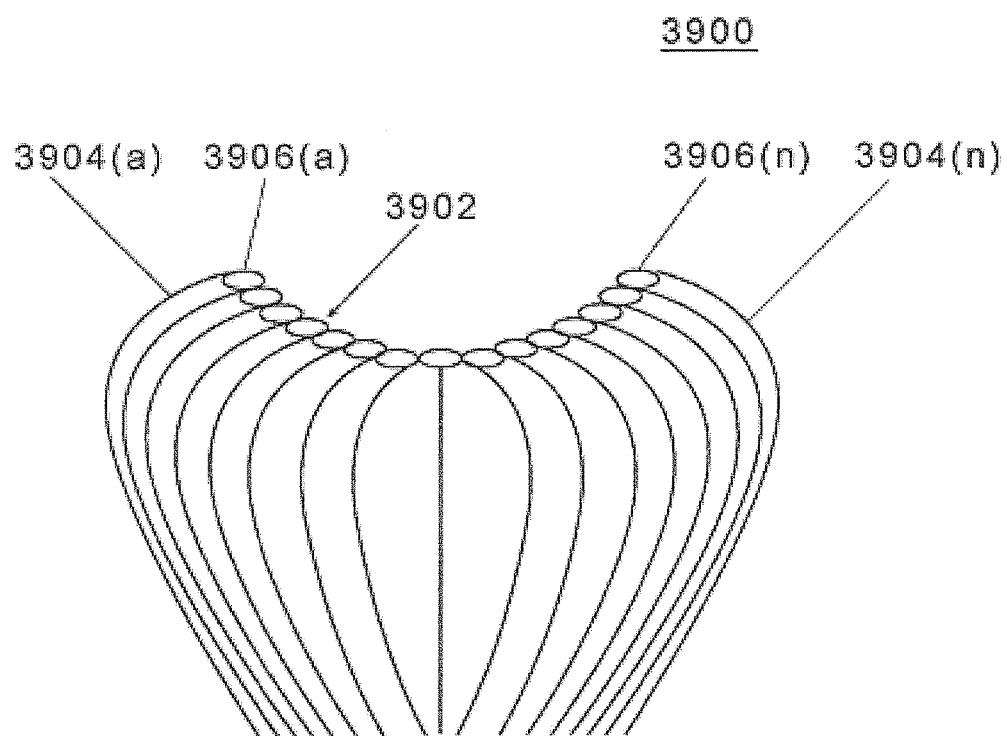
FIG. 39 shows a side view of a plurality of fibers and a lens.

FIG. 39 shows collector 3900 with lens surface 3902 and fibers 3904(a) . . . (n) (where n is any suitable number). Each fiber, generally 3904 is disposed relative to a corresponding section of the lens 3902. For example, 3906(a) relates to fiber 3940(a). Each fiber 3904 is positioned such that as light energy is received by lens surface 3902, a fiber will have the highest collection ratio or coefficient. For example, when light energy is received at an angle, fiber 3904(a) may be the most efficient collector. However, as the angle of the incoming light energy changes, a fiber near the center of the lens surface 3902 may be the most efficient collector. Thus, as the sunlight changes reception angle, the apparatus 3900 will have a fiber available for collection of energy. The fibers 3904 may be of different size diameter and may be spaced apart from each other a predetermined distance to maximize collection capability.

Figure 40:
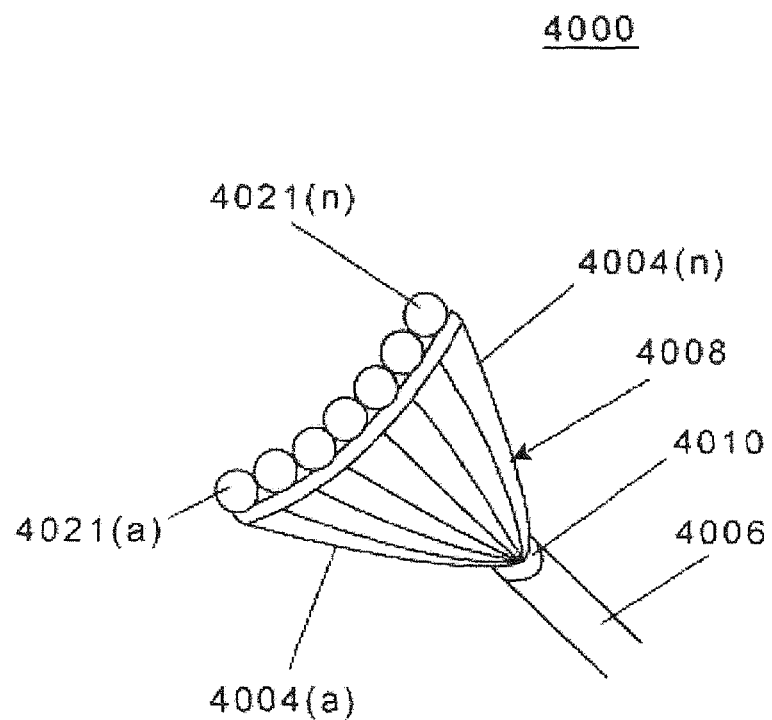
FIG. 40 shows a side view of a plurality of fibers coupled together.

FIG. 40 shows a side view 4000 of a plurality of fibers coupled together. Fibers 4004(a) . . . (n) (where n is any suitable number) are coupled in a bundle 4008, such that a single fiber 4006 may be used to transmit the collected energy. Distal portions 4021(a) . . . (n) of fibers 4004(a) . . . (n) are typically coupled to, or joined to, a lens surface, as described herein. The plurality of fibers, generally 4004, are joined at junction 4010, which may be a flexible joint, or pivot point such that lens 4002 may be adjusted, moved or re-directed to maximize collection of light energy.

Figure 41:
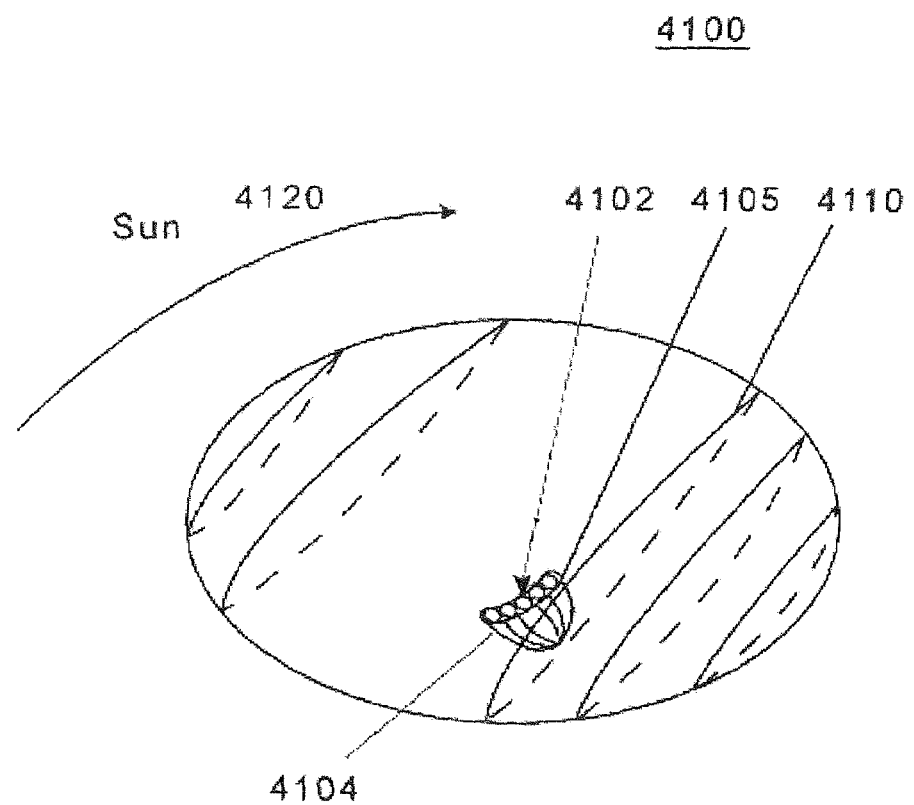
FIG. 41 shows a collection panel collecting solar energy.

FIG. 41 shows a perspective view 4100 of a collection panel 4110 for collecting solar energy. The collection panel 4110 typically includes a plurality of collection devices 4105, which include the lens 4102 and fibers 4104. The panel 4110 collects solar energy from sunlight 4120.

Figure 42:
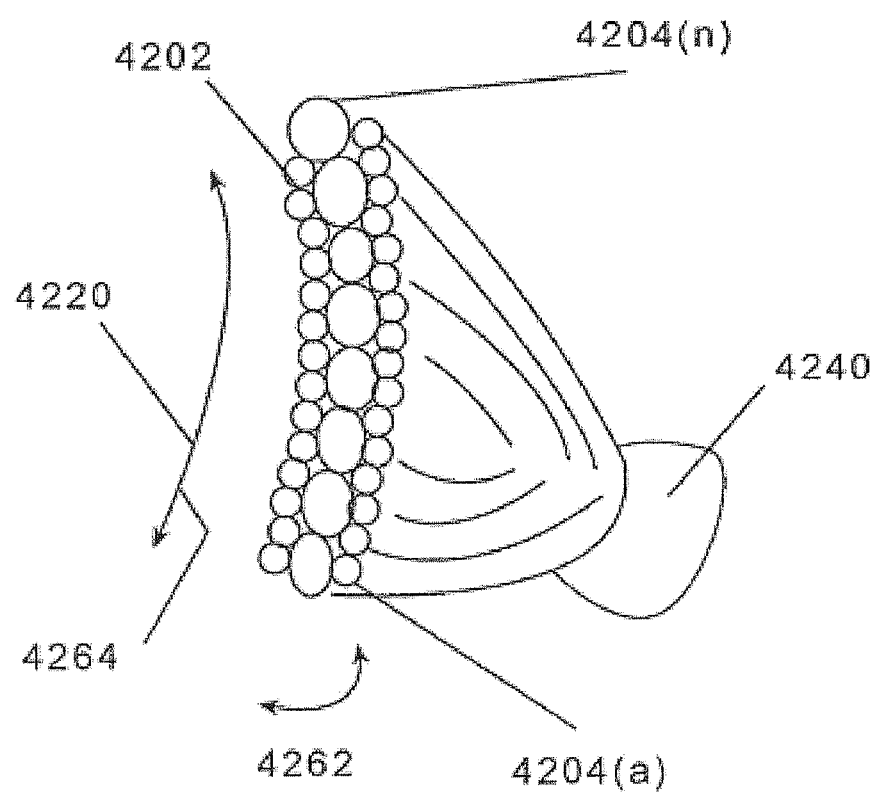
FIG. 42 shows a perspective view of a collection apparatus according to the present invention.

FIG. 42 shows a perspective view 4200 of a collection apparatus according to the present invention. The lens 4202 has a substantially U-shape and a plurality of fibers 4204 that are coupled into a single fiber 4240 to collect thermal energy 4220, which is typically sunlight. The coupling 4240 permits the fibers and lens to move as shown by elements 4264 and 4262. Thus, the fibers and lens are less susceptible to damage or breaking because they exhibit flexibility.

It will thus be seen that the objects set forth above, among those made apparent from the preceding description, are efficiently attained and, because certain changes may be made in carrying out the above method(s) and in the construction(s) set forth without departing from the spirit and scope of the invention, it is intended that all matter contained in the above description and shown in the accompanying drawings shall be interpreted as illustrative and not in a limiting sense.

What is claimed is:

1. An apparatus for collecting energy comprising:
a substantially spherical lens adapted to focus light received from a source of light to a focus area without requiring repositioning of the lens; and
a plurality of fibers for receiving light having passed through the lens, each fiber disposed in a first predetermined relationship to other fibers and each fiber disposed in a second predetermined relationship to the lens;
wherein the first predetermined relationship and the second predetermined relationship enable each fiber to have a specific energy collecting coefficient as a function of a shape of the lens and a position of the source of light such that at least one fiber is able to maximally collect energy.

2. The apparatus as claimed in claim 1, wherein the source of light moves in a predetermined path.

3. The apparatus as claimed in claim 1, wherein the lens is mounted to a collector that has a substantially U-shape.

4. The apparatus as claimed in claim 1, wherein the lens has a convex surface exposed to a first portion of the plurality of fibers.

5. The apparatus as claimed in claim 1, wherein the second predetermined relationship is a function of a focal point of the lens.

6. The apparatus as claimed in claim 1, wherein the plurality of fibers is coupled to a single fiber.

7. An apparatus for collecting solar energy comprising:
a substantially spherical lens for receiving and focusing solar energy to a focus area, the lens having a curved surface portion and not requiring repositioning; and
a plurality of fibers for receiving light having passed through the lens arranged such that each fiber is disposed at a predetermined position relative to the curved surface portion of the lens,
wherein the predetermined position is a function of the focal point of the lens and each fiber has a maximum collection capability as a function of time.

8. The apparatus as claimed in claim 7, wherein the lens receives solar energy from the sun and the maximum collection capability is a function of the position of the sun.

9. The apparatus as claimed in claim 7, wherein the maximum collection capability is performed in a sequence.

10. The apparatus as claimed in claim 9, wherein the sequence is a function of a position of each fiber.

11. A light collection apparatus comprising:
a substantially spherical lens for focusing a light source to a focus area;
the lens having a first portion fabricated from a first material, the first material having an associated index of refraction;
the lens having a second portion fabricated from a second material, the second material having an associated index of refraction;
wherein the second index of refraction is higher than the first index of refraction; and a plurality of fibers for receiving light having passed through the lens, each fiber disposed in a first predetermined relationship to other fibers and each fiber disposed in a second predetermined relationship to the lens;

wherein the first predetermined relationship and the second predetermined relationship enable each fiber to have a specific energy collecting coefficient as a function of a shape of the lens and a position of the source of light such that at least one fiber is able to maximally collect energy.

* * * * *